(12) United States Patent
Omura

(10) Patent No.: US 6,473,243 B1
(45) Date of Patent: Oct. 29, 2002

(54) CATADIOPTRIC IMAGING SYSTEM AND A PROJECTION EXPOSURE APPARATUS PROVIDED WITH SAID IMAGING SYSTEM

(75) Inventor: Yasuhiro Omura, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/644,645

(22) Filed: Aug. 24, 2000

Related U.S. Application Data

(63) Continuation of application No. PCT/JP99/07225, filed on Dec. 22, 1999.

(30) Foreign Application Priority Data

Dec. 25, 1998 (JP) ............................................. 10-370143
Mar. 12, 1999 (JP) ............................................. 11-066769

(51) Int. Cl.[7] .............................................. G02B 17/00
(52) U.S. Cl. ....................................... 359/730; 359/364
(58) Field of Search ................................ 359/649–651, 359/355–357, 364, 708, 726–728, 730, 732–733; 355/43, 50–51, 53

(56) References Cited

U.S. PATENT DOCUMENTS

| 3,897,133 A | * | 7/1975 | Warner et al. | ............... 359/365 |
| 4,714,307 A | * | 12/1987 | Palmer | ........................ 359/351 |
| 4,779,966 A | | 10/1988 | Friedman | ..................... 359/335 |

(List continued on next page.)

FOREIGN PATENT DOCUMENTS

| JP | 60-184223 | 9/1985 |
| JP | 5-234846 | 9/1993 |
| JP | 5-234847 | 9/1993 |
| JP | 6-66543 | 3/1994 |
| JP | 6-120110 | 4/1994 |
| JP | 6-215999 | 8/1994 |
| JP | 6-244082 | 9/1994 |
| JP | 7-117648 | 12/1995 |
| JP | 8-219718 | 8/1996 |
| JP | 9-304016 | 11/1997 |
| JP | 10-82611 | 3/1998 |

OTHER PUBLICATIONS

Lindig et al., "Thermal expansion and length stability of Zerodur in dependence on temperature and time"; *Applied Optics*, vol. 24, No. 20, pp. 3330–3334 (Oct. 15, 1985).
Shaffer et al., "Effect of thermal cycling on dimensional stability of Zerodur and ULE", *Applied Optics*, vol. 23, No. 17, p. 2852 (Sep. 1, 1984).
Jacobs et al., "Expansion hysteresis upon thermal cycling of Zerodur", *Applied Optics*, vol. 23, No. 17, pp. 3014–3016 (Sep. 1, 1984).

*Primary Examiner*—Jordan M. Schwartz
(74) *Attorney, Agent, or Firm*—Miles & Stockbridge P.C.

(57) ABSTRACT

The object of the present invention is to provide a catadioptric imaging system, or the like, which is capable of obtaining a desired image-side NA and an image circle without increasing the size of a reflecting mirror with a smaller number of lenses. This catadioptric imaging system comprises a first imaging optical system and a second imaging optical system, wherein the first imaging optical system is provided with a positive first lens group, an aperture stop, and a positive second lens group in the order from the object side, and the second imaging optical system is provided with a primary mirror comprising a concave first reflecting surface having a first radiation transmitting portion at the center thereof, and a secondary mirror comprising a second reflecting surface having a second radiation transmitting portion at the center thereof. In this case, all of the refracting members for constituting the optical system is formed of the same optical material, or at least one of the refracting surfaces and the reflecting surfaces is formed to be aspherical, or a refracting member is disposed to be separated from the first reflecting surface or the second reflecting surface.

55 Claims, 23 Drawing Sheets

U.S. PATENT DOCUMENTS

| | | | |
|---|---|---|---|
| 4,953,960 A | 9/1990 | Williamson | 359/663 |
| 5,004,331 A | 4/1991 | Haseltine et al. | 359/728 |
| 5,031,976 A | 7/1991 | Shafer | 359/355 |
| 5,488,229 A | 1/1996 | Elliott et al. | 250/492.2 |
| 5,559,338 A | 9/1996 | Elliott et al. | 250/492.1 |
| 5,650,877 A | 7/1997 | Phillips, Jr. et al. | 359/732 |
| 5,717,518 A | 2/1998 | Shafer et al. | 359/357 |
| 5,734,496 A | 3/1998 | Beach | 359/366 |
| 5,956,174 A | 9/1999 | Shafer et al. | 359/357 |
| 5,999,310 A | 12/1999 | Shafer et al. | 359/351 |
| 6,020,950 A | 2/2000 | Shiraishi | 355/30 |

\* cited by examiner

FIG.11
MERIDIONAL COMA    SAGITTAL COMA
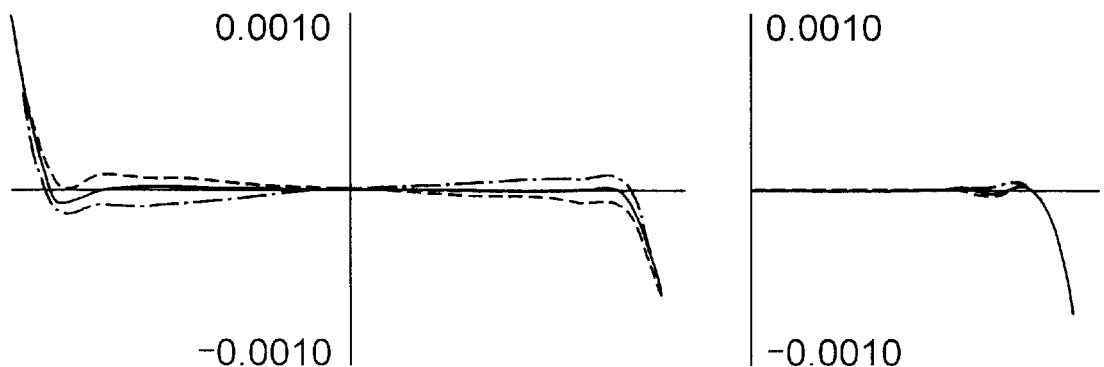
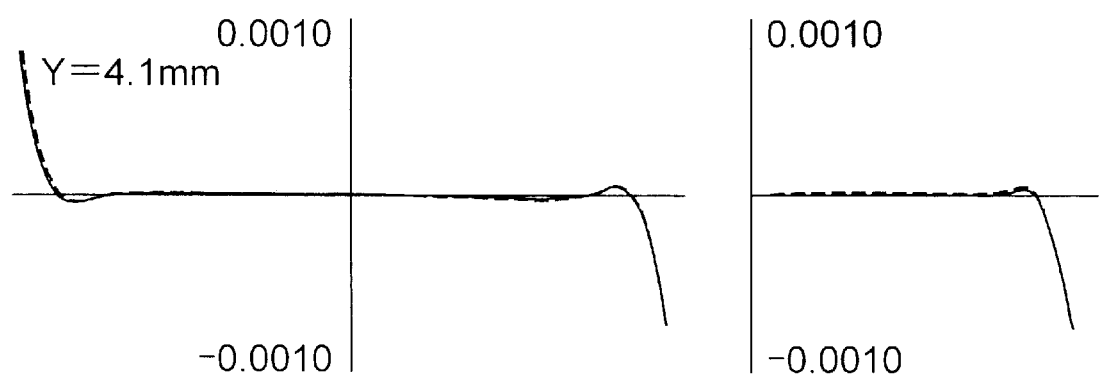
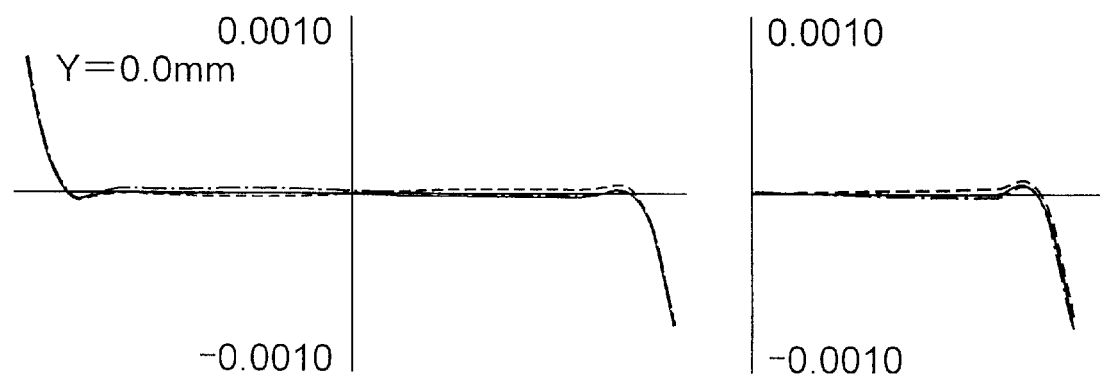
------------ 157.61nm
——————— 157.60nm
—·—·—·—·— 157.59nm

FIG.13
MERIDIONAL COMA    SAGITTAL COMA
Y=8.2mm
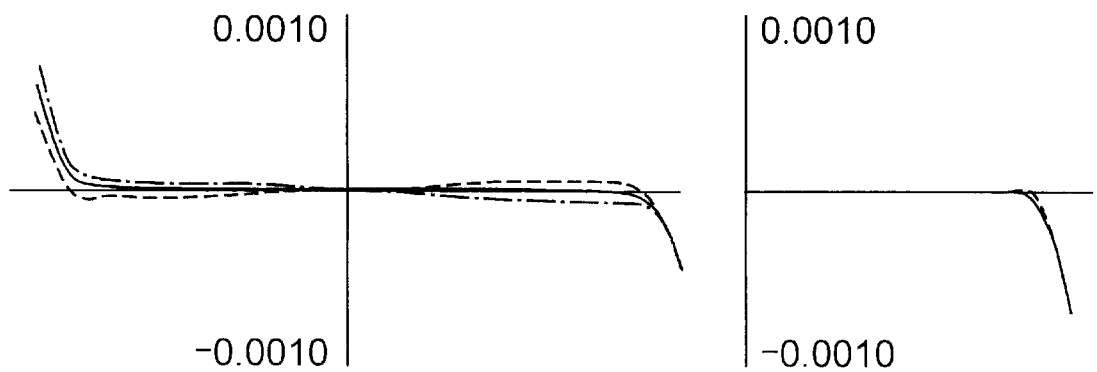
Y=4.1mm
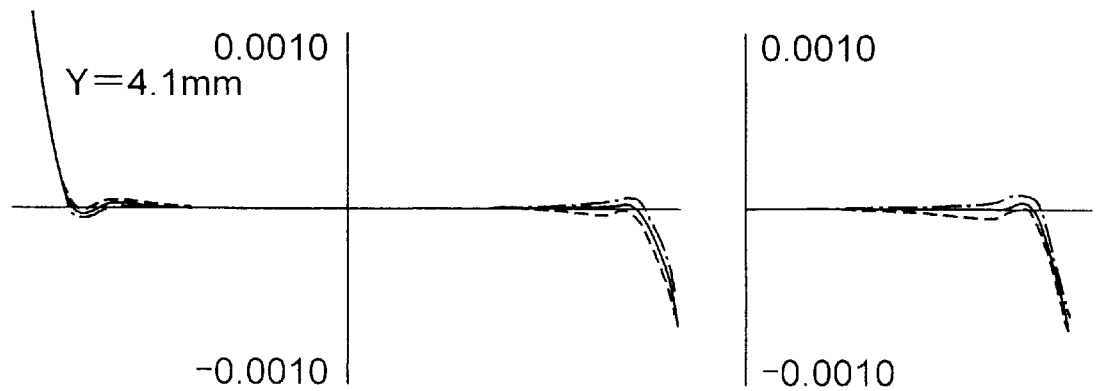
Y=0mm
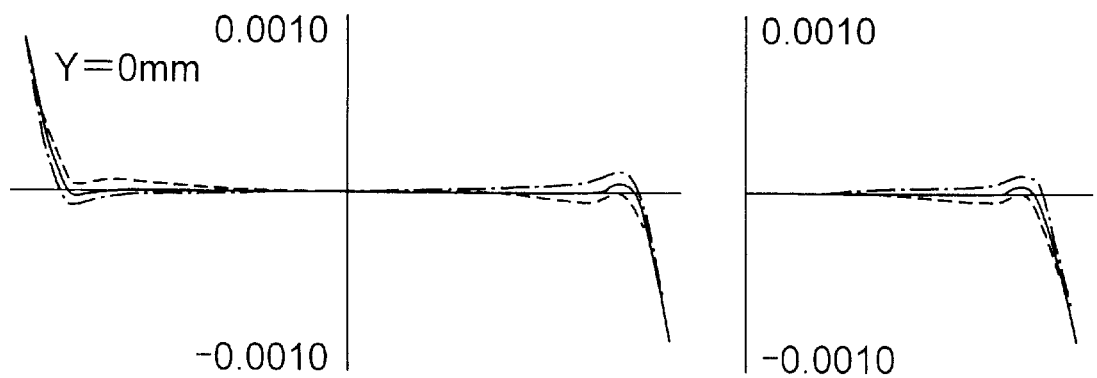
```
------------ 157.61nm
───────────  157.60nm
─·─·─·─·─·─  157.59nm
```

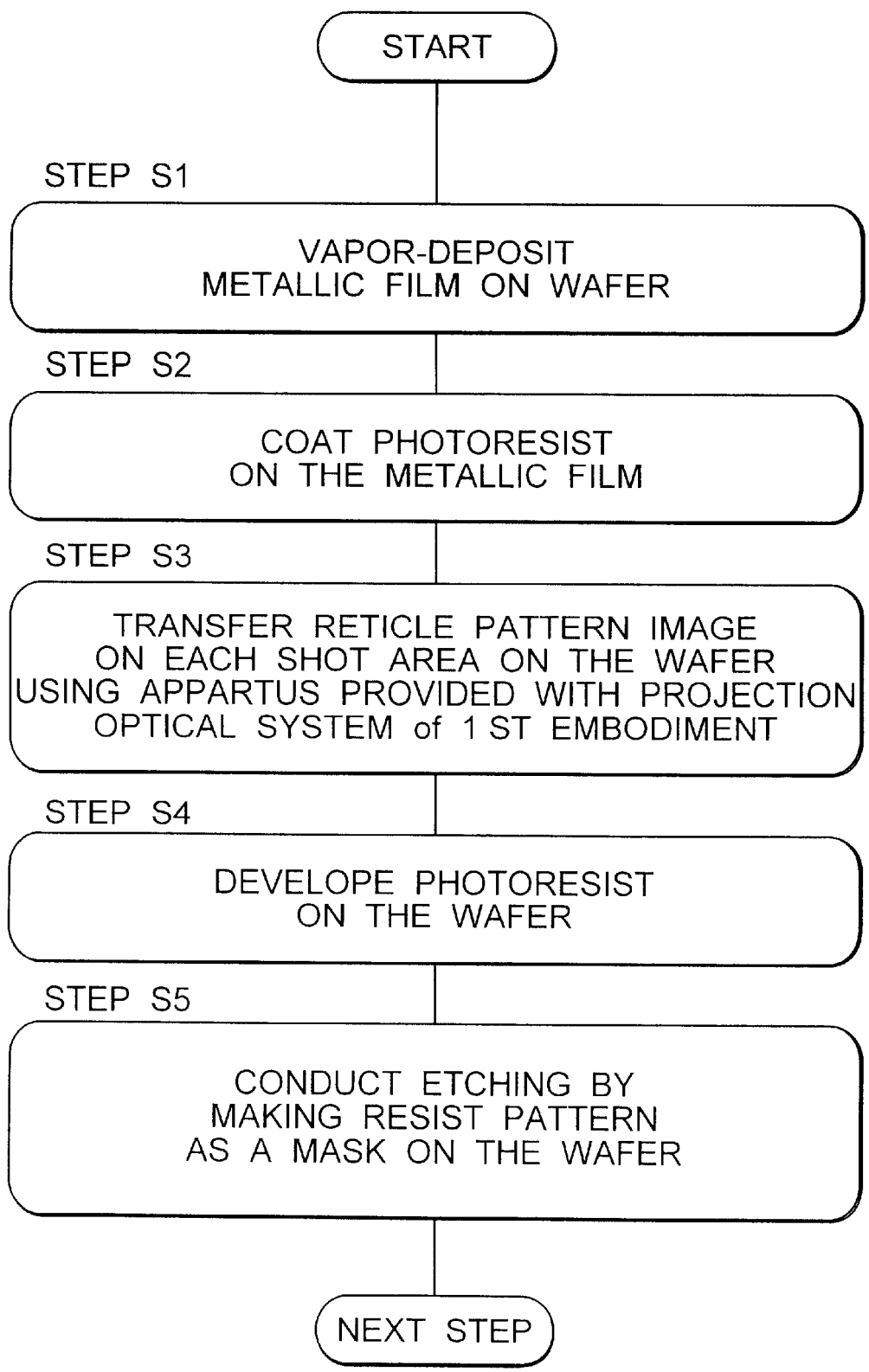

CATADIOPTRIC IMAGING SYSTEM AND A PROJECTION EXPOSURE APPARATUS PROVIDED WITH SAID IMAGING SYSTEM

CROSS-REFERENCE TO COPENDING APPLICATION

This application is a continuation of prior Application No. PCT/JP99/07225 filed Dec. 22, 1999.

This application claims the benefit of International application PCT/JP99/07225 and Japanese Patent application Nos. 10-370143 and 11-066769 which are hereby incorporated by reference.

FIELD OF THE INVENTION

The present invention relates to a catadioptric imaging system which is preferably used in projection exposure for producing, for example, a semiconductor device, a liquid crystal display device, or the like, by photolithography, as well as a projection exposure apparatus and an exposure method using such catadioptric imaging system, and more particularly, to a catadioptric imaging system, or the like, which attains a resolution of 0.1 μm or lower in the ultraviolet region by using a reflection system as a factor of an imaging optical system inside a catadioptric imaging system.

BRIEF DESCRIPTION OF THE PRIOR ART

In a process of photolithography for producing a semiconductor device, or the like, there is employed a projection exposure apparatus which performs projection exposure of a pattern image formed on a photo mask or a reticle (hereinafter collectively called the "reticle") on a wafer or a glass plate with photo resist coated thereon through a projection optical system. Then, with enhancement of the degree of integration of the semiconductor device, or the like, a resolving power required for the projection optical system used in the projection exposure apparatus is gradually increasing. To satisfy this requirement, it is needed to reduce the wavelength of illumination radiation (exposure light) and to enlarge the numerical aperture (NA) of the projection optical system. For example, in case that the wavelength of the illumination radiation is not more than 180 nm, a high resolution of 0.1 μm or less can be achieved.

However, if the wavelength of the illumination radiation is reduced, light absorption increases and the kinds of practicable glass materials are limited. Particularly, if the wavelength becomes 180 nm or less, only fluorite is practicable as the glass material. For this reason, in a projection optical system which is constituted only by a refractive lens system, or only by lens components containing no reflecting mirror with a refracting power (a concave reflecting mirror or a convex reflecting mirror), it becomes impossible to correct a chromatic aberration.

Also, since an optical performance required for a projection optical system is extremely high, it is required to correct the aberrations to be substantially zero. However, in order to achieve a desired optical performance in a dioptric projection system, a large number of lens components is required, so that it is inevitable to reduce the transmittance or to increase the production cost.

In contrast, a catadioptric system using a power (the refracting power) of a concave reflecting mirror, or the like, that is, an optical system which contains a reflecting mirror having a refracting power without containing a lens component generates no chromatic aberration and shows a contribution having a sign reverse to that of a lens component with respect to the Petzval sum. Accordingly, in an optical system which is a combination of a catoptric system and a dioptric system, or a so-called optical system of catadioptric type (hereinafter called the "catadioptric imaging system"), various aberrations including a chromatic aberration can be satisfactorily corrected to be substantially zero without increasing the number of lenses. In this case, the catadioptric imaging system is an optical system which contains at least one lens component and at least one reflecting mirror having a refracting power. In this respect, there is no need to say that a plane parallel plate or a plane reflecting mirror for deflecting an optical path may be provided if needed.

However, if a concave reflecting mirror is used in an optical path of a projection optical system of a projection exposure apparatus, light incident on this concave reflecting mirror from the reticle side is reflected to move back to the reticle side again. For this reason, there are conventionally proposed various technologies for separating an optical path for the light incident on the concave reflecting mirror from an optical path for the light reflected by the concave reflecting mirror so as to lead the reflected light from the concave mirror toward the wafer, that is, the technologies for constituting a projection optical system by a catadioptric imaging system.

As a representative method for separating optical paths from each other, a method for separating optical paths from each other by using a transmission reflecting surface such as a half mirror or a polarizing beam splitter is proposed in Japanese Patent Publication No. HEI 7-117648. Also, in U.S. Pat. No. 4,779,966, there is proposed a method for separating optical paths from each other by forming an intermediate image by using an off-axis optical path and providing a plane mirror for bending optical paths in the vicinity of the forming position of the intermediate image. Further, in U.S. Pat. No. 5,031,976, there is proposed a method for separating optical paths from each other by using two reflecting mirrors each having an opening at the center thereof, and providing the two reflecting mirrors so that a beam is reflected when the section of the beam is large in the vicinity of the pupil of the optical system and the beam passes through the central openings when the section of the beam is small in the vicinity of the image plane.

However, since the optical path separation methods disclosed in Japanese Patent Publication No. HEI 7-114648 and U.S. Pat. No. 4,779,966 employ a plane mirror which is provided in an inclined manner with respect to the optical axis for the optical path separation, an optical system is required to have a plurality of optical axes. In a projection optical system which requires adjustment of the optical components with high precision, a highly sophisticated technology is required for positioning the plurality of optical axes with precision and to dispose the optical components at desired positions with respect to the respective optical axes in the order of microns. As a result, it is inevitable to increase the cost for producing the optical system.

On the other hand, according to the optical path separation method disclosed in U.S. Pat. No. 5,031,976, all of the optical elements for constituting the optical system can be disposed along the single optical axis. As a result, it is possible to produce the optical system with precision in accordance with the adjusting method of the optical components which is conventionally used in a projection optical system. Optical systems employing such optical path separation method are disclosed in U.S. Pat. Nos. 5,488,229, 5,650,877, 5,717,518, and the like, in addition to U.S. Pat. No. 5,031,976.

However, in the optical system disclosed in U.S. Pat. No. 5,031,976, or the like, it is required to shield a part of the beams centering the optical axis, out of imaging beams, in order to prevent stray light from being generated, which passes, without being reflected by two reflecting mirrors at all, through the central openings thereof to reach the image plane. As a result, due to this central shielding of the imaging beams, the image forming characteristic of the optical system is degraded. Accordingly, in order to apply the optical path separation method disclosed in U.S. Pat. No. 5,031,976 to a projection optical system, it is essential to suppress the rate of central shielding of the imaging beams (hereinafter simply called the "central shielding rate") to the minimum, so as to obtain a sufficient optical characteristic.

In the optical system disclosed in U.S. Pat. No. 5,650,877, a half mirror is arranged to be close to an object plane (a plane corresponding to a mask plane) while a reflecting mirror having an opening at the center thereof is arranged to be close to an image plane (a plane corresponding to a wafer plane), without forming an intermediate image. In this manner, the central shielding rate is suppressed to some extent. That is, in this optical system, it is inevitable to employ a half mirror. However, when this optical system is applied to a projection optical system which uses exposure light having the wavelength of 180 nm or less, materials usable for forming a half-transmitting thin film are limited, so that it is difficult to produce a half mirror having a satisfactory performance. Also, only not more than a fourth of the light quantity reaches the wafer plane, so that the throughput is inevitably lowered.

In either of the optical systems disclosed in U.S. Pat. Nos. 5,031,976, 5,488,229, and 5,717,518, an intermediate image is formed through a first imaging optical system, a first reflecting mirror having a central opening is provided in the vicinity of the forming position of the intermediate image, and further a second reflecting mirror having a central opening is provided in the vicinity of the image plane. Thus, the central shielding rate is suppressed to some extent.

However, these disclosed optical systems have the drawbacks as described below.

That is, in order to obtain a high resolution of not more than 0.1 $\mu$m, a projection optical system generally requires an NA of not less than 0.7 on the image side even when using a $F_2$ laser (with the wavelength of 157 nm) as exposure light. Also, taking the size of a semiconductor chip and the throughput into account, an image circle on the image side with the diameter of less than 10 mm can not be considered currently. Further, it is also impossible to largely reduce a WD on the image side (a working distance which is an axial air space between the lens surface which is closest to a wafer and the wafer in the projection optical system) on the image side, taking into account an influence of a gas out from a resist (which is coated on the wafer) at the time of exposure and an influence of a drive of a wafer stage.

In the optical system disclosed in U.S. Pat. No. 5,650,877, a thick lens is provided in the vicinity of the forming position of the intermediate image and another thick lens is employed in a refracting portion of a rear surface reflecting mirror serving as a second reflecting mirror, so that a chromatic aberration generated in the first imaging optical system is corrected by using the chromatic aberration correction by a thick lens which is conventionally known. However, in this optical system, in order to satisfy the above requirements required for a projection optical system (for the image-side NA, the image circle diameter, the image-side WD, etc.), it is inevitable to increase the thickness of the refracting portion of the rear side reflecting mirror and to increase the diameter of the rear surface reflecting mirror conspicuously in proportion to the thickness of this refracting portion. As a result, not only the production of such optical system becomes difficult, the manufacturing cost increases drastically.

Moreover, in this optical system the object side (the image side) is assumed to be approximately infinity, so that the refracting power of the first imaging optical system is small, and chromatic aberration in the first image optical system is not generated in a large amount, thereby attaining a chromatic aberration correction by the thick lens which is satisfactory to some extent. However, when such optical system is applied to a projection optical system in which a reduction rate of 0.15 to 0.4 or around is required for the entire system, the refracting power of the first imaging optical system inevitably increases, and the chromatic aberration in the first imaging optical system generated in the first imaging optical system also inevitably increases. As a result, in this optical system, it is difficult to correct the chromatic aberration satisfactorily while maintaining particularly the diameters and the thickness of the two reflecting mirrors to be practicable.

The optical system disclosed in U.S. Pat. No. 5,488,229 is a variation of the optical system disclosed in U.S. Pat. No. 5,031,976. This optical system is obtained by assuming an optical system for a laser repair apparatus (an apparatus for repairing a semiconductor circuit by laser processing) using an ArF excimer laser (having an oscillating wavelength of 193 nm) and optimizing it. In this optical system, a chromatic aberration is corrected without using a thick lens, but using two rear surface reflecting mirrors. However, a concave mirror which is provided in the vicinity of the forming position of the intermediate image is a rear surface reflecting mirror for the purpose of correcting the chromatic aberration. Thus, the diameter of the concave mirror is conspicuously large for attaining the image-side NA of not less than 0.7 and for attaining an image circle in the required size on the image side, so that this system can not be a practicable optical system as a projection optical system for a semiconductor exposure apparatus, or the like.

In the optical system disclosed in U.S. Pat. No. 5,717,518, the image-side NA of 0.8 is achieved. However, in this optical system, like in the optical system disclosed in U.S. Pat. No. 5,488,299, a concave mirror which is provided in the vicinity of the forming position of an intermediate image is a rear surface reflecting mirror for the purpose of correcting the chromatic aberration, so that the diameter of the concave mirror becomes conspicuously large and not practicable to achieve an image circle having a predetermined size on the image side. Also, according to this conventional technology, an optical system is constituted by a plurality of glass materials such as quartz glass or fluorite, in order to correct a chromatic aberration satisfactorily. For this reason, in this optical system, exposure light having the wavelength of 180 nm or less can not be used, and the ArF excimer laser light is light of a practicable shortest wavelength.

In an optical system employing exposure light having the wavelength of 180 nm or less, fluorite is desirably used for a refracting member in order to obtain a sufficient refractive index. However, when a fluorite lens with a rear surface reflecting coat applied thereon is used, the following drawbacks may be generated. That is, film material for the coat for reflecting light in such wavelength range are limited and light absorption thereof is comparatively large. Thus, a large light energy absorbed by the coat is transmitted to the fluorite lens as heat. As a result, such tendency is liable to occur that the lens surface shape of fluorite having a large coefficient of thermal expansion varies during exposure so as to deteriorate the image forming performance.

SUMMARY OF THE INVENTION

The present invention is contrived taking the above drawbacks into consideration, and the object of the invention is to provide a catadioptric imaging optical system which can obtain an image-side NA and an image circle having predetermined sizes with a small number of lenses and without enlarging a reflecting mirror to attain a high resolution of, for example, 0.1 μm or less, even when an illumination radiation in the ultraviolet range having the wavelength of, for example, 180 nm or less is employed, as well as a projection exposure apparatus, or the like, provided with such an optical system.

A catadioptric imaging system according to a first aspect of the invention is provided with a first imaging optical system of a dioptric type for forming a primary image on a first plane and a second imaging optical system of a catadioptric type for forming a secondary image of said first plane on a second plane with reduction magnification on the basis of the light from said primary image. In this catadioptric imaging system, the first imaging optical system comprises a first lens group having a positive refracting power, an aperture stop, and a second lens group having a positive refracting power in this order from the first plane side. The second image optical system comprises a primary mirror having a front surface reflecting surface in a concave form and a first radiation transmitting portion at the center thereof, a secondary mirror having a second radiation transmitting portion at the center thereof, and a lens component provided adjacently to the secondary mirror on the primary mirror side and having a negative refracting power. The light from the primary image passes through the first radiation transmitting portion of the primary mirror and the lens component and is reflected by the secondary mirror, the light reflected by the secondary mirror passes through the lens component and is reflected by the primary mirror, and the light reflected by the primary mirror passes through the lens component and the second radiation transmitting portion of the secondary mirror to form the secondary image on the second plane, and all the refracting optical members for constituting the catadioptric imaging system are formed of optical materials having the same index of refraction.

In the above catadioptric imaging system, the primary image of the first plane (the object plane), that is, an intermediate image, is formed through the first imaging optical system. Then, in the vicinity of the forming position of the intermediate image, there is provided the primary mirror having the front surface reflecting surface in a concave form and having the first radiation transmitting portion (the central opening) at the center thereof, and the diameter of this central opening of this primary mirror is suppressed to reduce the central shielding rate, thereby avoiding deterioration of the image forming performance. Further, such arrangement is employed in which in the vicinity of the second plane (the image plane), there are provided the secondary mirror with a reflecting surface having the second radiation transmitting portion (the central opening) at the center thereof and the lens component adjacently to the secondary mirror on its primary mirror side, so that the central opening of this secondary mirror can be approximated to the second plane. Thus, the central shielding rate is reduced to avoid the deterioration of the image forming performance.

As stated above, when the optical system of the present invention is applied to a projection optical system of a projection exposure apparatus, it is required to use an exposure light having the wavelength of 180 nm or less in order to obtain a high resolution of 0.1 μm or less. Thus, according to the first aspect of the invention, all the refracting optical members for constituting the catadioptric imaging system are formed of optical materials having the same index of refraction, including, for example, a single glass material which is capable of transmitting an $F_2$ laser beam with a sufficient transmittance. Moreover, it is possible to perform a primary chromatic aberration correction by making the refracting power of the lens component provided adjacently to the secondary mirror on its primary mirror side to be negative.

The catadioptric imaging system according to a second aspect of the invention is provided with a first imaging optical system of a dioptric type for forming a primary image of a first plane and a second imaging optical system of a catadioptric type for forming a secondary image of said first plane on a second plane with reduction magnification on the basis of the light from said primary image. The first imaging optical system comprises a first lens group having a positive refracting power, an aperture stop, and a second lens group having a positive refracting power in this order from the first plane side. The second image optical system comprises a primary mirror having a front surface reflecting surface in a concave form and a first radiation transmitting portion at the center thereof, a secondary mirror having a second radiation transmitting portion at the center thereof, and a lens component provided adjacently to the secondary mirror on the primary mirror side. The light from the primary image passes through the first radiation transmitting portion of the primary mirror and the lens component and is reflected by the secondary mirror, the light reflected by the secondary mirror passes through the lens component and is reflected by the primary mirror, and the light reflected by the primary mirror passes through the lens component and the second radiation transmitting portion of the secondary mirror to form the secondary image on the second plane, and at least one out of all the refracting surfaces and the reflecting surfaces for constituting the catadioptric imaging system is formed to be aspherical.

In the above catadioptric imaging system, at least one of all the refracting surfaces and the reflecting surfaces for constituting the catadioptric imaging system is formed to be aspherical. With this arrangement, it is possible to achieve an optical system having a sufficient image forming performance while suppressing the sizes of the primary mirror and the secondary mirror to be practicable.

According to the catadioptric imaging system of the first or second aspect of the invention described above, even when a light having the wavelength of 180 nm or less such as an $F_2$ laser beam is used, the size of the primary mirror is not particularly increased and an image-side NA and an image circle in the predetermined sizes can be securely obtained, so that it is possible to realize a catadioptric imaging system capable of obtaining a high resolution of, for example, 0.1 μm or less by using a small number of lenses.

In this respect, in the optical systems of the present invention (according to the first aspect or the second aspect), it is preferable to dispose the reflecting surface of the secondary mirror on the refracting surface of the lens component which is provided adjacently to the secondary mirror so as to compose the rear surface reflecting mirror of the secondary mirror and the lens component. With this structure, it is possible to approximate the secondary mirror, and consequently the central opening thereof, to the second plane further, without protruding a holding mechanism of the secondary mirror to the second plane side. As a result, it is possible to further reduce the diameter of the central opening of the secondary mirror, and consequently the central shielding rate, so as to avoid deterioration of the image forming performance more excellently.

Also, according to the optical system of the present invention, it is preferable to form the reflecting surface of the secondary mirror to have the concave surface on the primary mirror side. With this structure, it is possible to further suppress the central shielding rate without increasing the diameter of the primary mirror.

Also, according to the optical system of the present invention, it is preferable to form the refracting surface on the primary mirror side of the lens component which is provided adjacently to the secondary mirror to have the concave surface on the primary mirror side. With this structure, it is possible to achieve excellent chromatic aberration correction.

In order to achieve excellent chromatic aberration correction, it is preferable to satisfy the following conditional expression (1):

$$0.03 < D/|R| < 1.0 \tag{1}$$

Here, R represents the radius of curvature of the refracting surface on the primary mirror side of the lens component provided adjacently to the secondary mirror. Also, D represents the clear aperture diameter of the secondary mirror.

Above the upper limit of the conditional expression (1), a coma aberration and high-order aberrations of a spherical aberration are unfavorably generated to prevent a large numerical aperture from being attained. On the other hand, below the lower limit of the conditional expression (1), it becomes unfavorably impossible to correct the chromatic aberration with excellency while maintaining the secondary mirror to be in a realizable size. Note that it becomes possible to correct the chromatic aberration and the other aberrations at the same time with more excellency by setting the upper limit in the conditional expression (1) to be 0.5 and the lower limit to be 0.07.

Incidentally, when the wavelength of the exposure light becomes 180 nm or lower, film materials for the antireflection coat to be applied on the surface of the lens component are limited, and a sufficient performance can not be obtained as the antireflection coat. As a result, it is required to minimize the number of transmitting surfaces such as lens surfaces. Accordingly, in the present invention, it is preferable that the lens component provided adjacently to the secondary mirror is the only refracting optical member to be provided in an optical path between the primary mirror and the secondary mirror. With this arrangement, it is possible to reduce the number of lenses (consequently the number of transmitting surfaces) so as to enhance the transmittance of the optical system. However, this arrangement does not prevent a plane parallel plate or the like from being provided in an optical path between the secondary mirror and the second plane.

Also, according to the optical system of the present invention, at least one of the refracting surface and the reflecting surface of the second imaging optical system is formed to be aspherical, so that it becomes possible to prevent the primary mirror and the secondary mirror from being enlarged and the central shielding rate from increasing. As a result, it is possible to provide an optical system which has a sufficient image forming performance and is practicable.

According to the optical system of the present invention, it is possible to reduce the number of the lenses while attaining a high resolution of 0.1 μm or lower to further enhance the transmittance of the optical system, by forming at least one of the refracting surfaces in the first imaging optical system to be aspherical.

Further, according to the optical system of the second aspect of the invention, it is preferable that at least one of the refracting surface and the reflecting surface in the second imaging optical system is formed to be aspherical and each of the first and second lens groups has at least one aspherical refracting surface. With this arrangement, the number of the lenses for constituting the catadioptric imaging system can be reduced, and a light having the wavelength of 180 nm or less can be used as the exposure light.

Also, according to the optical system of the present invention, it is preferable that at least 80 percents of all the lenses for constituting the catadioptric imaging system are one sided aspherical lenses, in which one of the refracting surfaces is formed to be aspherical and the other to be spherical. With this arrangement, it is possible to realize an ideal optical system which has a high resolution of 0.1 μm or lower, taking the size of the optical system, the image forming performance, transmittance, and an aberration fluctuation depending on illumination heat, etc., into consideration. It is also possible to adjust the eccentricity from the aspherical lens surface in reference to the spherical lens surface easily by employing the so-called one sided aspherical lens.

Further, it becomes possible to use an exposure light having the wavelength of 180 nm or lower, such as an $F_2$ laser beam (157 nm) to thereby realize a high resolution of 0.1 μm or lower, by forming all of the refracting optical members for constituting the catadioptric imaging system of fluorite.

Also, according to the optical system of the present invention, it is preferable to constitute the catadioptric imaging system as an optical system which is telecentric on the first and second plane sides. Since the catadioptric imaging system is thus formed to be telecentric on the both sides, it is possible to suppress an image distortion due to displacement of the mask provided on the first plane or the wafer provided on the second plane in the direction of the optical axis into an insignificantly small amount. In addition, it is possible to realize an ideal both-side telecentric optical system in which the numerical apertures of the respective view fields are equal to each other, by disposing an aperture stop in the vicinity of the rear focal position of the first lens group.

Moreover, according to the present invention, it is preferable to satisfy the following conditional expression (2):

$$0.7 < |\beta 1/\beta 2| < 3.5 \tag{2}$$

Here, β1 represents the magnification of the first imaging optical system, and β2 represents the magnification of the second imaging optical system.

The conditional expression (2) defines an appropriate range for the ratio β1/β2 between the magnification β1 of the first imaging optical system and the magnification β2 of the second imaging optical system. By satisfying the conditional expression (2), it is possible to compensate (cancel) the aberrations which are generated by the lens component of the first imaging optical system with the aberrations which are generated in the reflecting mirror, and the like, of the second imaging optical system in a good balance, whereby a high resolution of 0.1 μm or lower can be realized. However, when the intermediate image is formed in the refracting optical member, this refracting optical member is assumed to belong to the first imaging optical system.

Above the upper limit of the conditional expression (2), the aberrations generated in the second imaging optical system become larger, and excellent correction particularly of a spherical aberration, a coma, and a chromatic aberration becomes unfavorably difficult. On the other hand, below the lower limit of the conditional expression (2), the aberrations generated in the first imaging optical system become larger, so that the entire system is inevitably and unfavorably enlarged. In order to further reduce the size of the optical system and to achieve the sufficient image forming performance, it is preferable to set the upper limit of the conditional expression (2) to be 2.5 and the lower limit to be 0.85. Also, when the optical system is applied to a projection optical system of a projection exposure apparatus, the magnification ($\beta1\times\beta2$) of the entire system is set within a range from 0.12 to 0.33, whereby the size or the precision of the mask can be set within a practicable range.

A catadioptric imaging system according to a third aspect of the invention is provided with a first imaging optical system of a dioptric type for forming an intermediate image of the first plane and a second imaging optical system of a catadioptric type for forming a final image of said first plane on a second plane with reduction magnification on the basis of the radiation from said intermediate image. The first imaging optical system comprises a first lens group of a positive refracting power, an aperture stop, and a second lens group of a positive refracting power in this order from the first plane side. The second image optical system comprises a primary mirror which is constituted by a first reflecting surface of a concave form having a first radiation transmitting portion at the center thereof, a secondary mirror which is constituted by a second reflecting surface having a second radiation transmitting portion at the center thereof, and a refracting member which is separated from the first reflecting surface and the second reflecting surface. The radiation from the first imaging optical system passes through the first radiation transmitting portion of the primary mirror and the refracting member to be reflected by the second reflecting surface, the radiation reflected by the second reflecting surface passes through the refracting member to be reflected by the first reflecting surface, and the radiation reflected by the first reflecting surface passes through the refracting member and the second radiation transmitting portion of the secondary mirror to form the final image on the second plane.

In the catadioptric imaging system described above, the intermediate image (primary image) of the first plane is formed through the first and second lens groups of the first imaging optical system. Then, in the vicinity of the forming position of the intermediate image, there is provided the primary mirror having the first radiation transmitting portion (the central opening) at the center thereof and having the first reflecting surface with a concave form, so that the diameter of this central opening of the primary mirror is reduced to suppress the central shielding rate, thereby avoiding deterioration of the image forming performance. Further, such arrangement is employed in which in the vicinity of the second plane (the wafer plane, that is, the final image plane), there are provided the secondary mirror having the second radiation transmitting portion (the central opening) and the refracting member separated from the secondary mirror on its primary mirror side, so that the central opening of this secondary mirror can be approximated to the second plane, in which the secondary mirror is arranged as thin as possible in the direction of the optical axis. Thus, the central shielding rate is reduced to avoid deterioration of the image forming performance.

According to the catadioptric imaging system of the third aspect of the invention described above, even when a radiation having the wavelength of 180 nm or less such as an $F_2$ laser beam is used, the size of the primary mirror size is not necessarily increased and the image-side NA and the image circle in the predetermined sizes can be securely obtained, so that it is possible to realize such a catadioptric imaging system as capable of obtaining a high resolution of, for example, 0.1 $\mu$m or less by the use of a smaller number of lenses.

Also, according to the optical system of the third aspect of the invention, it is preferable that the refracting member has a negative refracting power, and the following conditional expression (3) is satisfied:

$$-85 < f1/d1 < -10 \qquad (3).$$

Here, f1 represents the focal length of the refracting member, and d1 a distance between the secondary mirror and the refracting member along the optical axis, respectively. The conditional expression (3) defines a condition for correcting a chromatic aberration satisfactorily. Above the upper limit of the conditional expression (3), a deviation in the curvature of field for each wavelength becomes larger, so that it becomes impossible to conduct excellent chromatic aberration correction. A high-order aberration, such as a chromatic coma, is also unfavorably generated. Conversely, below the lower limit of the conditional expression (3), the first-order chromatic aberration is not sufficiently corrected unfavorably. In this respect, if the lower limit of the conditional expression (3) is set at −75 and the upper limit is at −20, the chromatic aberration correction can be conducted in a wider wavelength range with more excellency.

Also, in the optical system of the third aspect of the invention, it is preferable that the refracting member has a refracting surface with the concave surface facing the second plane side. More preferably, the refracting member is in the form of a meniscus. In this case, on the refracting surface of the refracting member on the first plane side and on the refracting surface of the refracting member on the second plane side, the incident angle and the exit angle of a beam which is reflected by the primary mirror and then advances toward the second plane can be comparatively small, and when a beam having a large numerical aperture is guided onto the second plane, generation of a high-order aberration on these refracting surfaces can be suppressed. Also, of the above refracting member, it is preferable that the refracting surface on the second plane side has a larger negative refracting power than the refracting surface on the first plane side. In this case, the incident angle and the exit angle of a beam on and from a lens can be reduced, so as to prevent a high-order aberration from being generated.

Moreover, according to the optical system of the third aspect of the invention, it is preferable to satisfy the following conditional expression (4):

$$0.6 < |\beta1/\beta2| < 3.5 \qquad (4).$$

Here, $\beta1$ represents the magnification of the first imaging optical system, and $\beta2$ represents the magnification of the second imaging optical system, respectively. The conditional expression (4) defines an appropriate ratio between the magnification of the first imaging optical system and the magnification of the second imaging optical system. By satisfying the conditional expression (4), it is possible to compensate (cancel) an aberration which is generated by the lens component of the first imaging optical system and an aberration which is generated in the reflecting mirror, or the like, of the second imaging optical system in a good balance, whereby a high resolution of 0.1 μm or less can be realized. However, when the intermediate image is formed in the refracting optical member, this refracting optical member is assumed to belong to the first imaging optical system.

Above the upper limit of the conditional expression (4), aberrations generated in the second imaging optical system become larger, and excellent correction of a spherical aberration, a coma, and a chromatic aberration, particularly, becomes unfavorably difficult. On the other hand, below the lower limit of the conditional expression (4), aberrations generated in the first imaging optical system become larger, so that the entire system is inevitably and unfavorably enlarged. In order to further reduce the size of the optical system and to achieve the sufficient image forming performance, it is preferable to set the upper limit of the conditional expression (4) at 2.5 and the lower limit at 0.85. Also, when the optical system is applied to a projection optical system of a projection exposure apparatus, the magnification ($\beta 1 \times \beta 2$) of the entire system is set within a range from 0.12 to 0.33, whereby the size or the precision of the mask can be set within a practicable range.

A catadioptric imaging system according to a fourth aspect of the invention is provided with a first imaging optical system for forming an intermediate image on a first plane and a second imaging optical system for forming a final image of the first plane on a second plane with reduction magnification on the basis of the radiation from said intermediate image. One of the first and second imaging optical systems comprises a primary mirror which is provided with a first reflecting surface with a concave form having a first radiation transmitting portion at the center thereof, and a secondary mirror which is provided with a second reflecting surface having a second radiation transmitting portion at the center thereof. The primary mirror and the secondary mirror are positioned such that a radiation directed to the first radiation transmitting portion is reflected by the second reflecting surface through the first radiation transmitting portion, a radiation reflected by the second reflecting portion is reflected by the first reflecting surface, and a radiation reflected by the first reflecting surface passes through the second radiation transmitting portion of the secondary mirror. The catadioptric imaging system comprises a central shielding member for shielding a radiation which is not reflected by the first and second reflecting surfaces and is directed to the second plane, and a variable aperture stop arranged to have a variable aperture size, in which the central shielding member and the variable aperture stop are disposed at positions different from each other in the direction of the optical axis of the catadioptric imaging system.

According to the optical system of the fourth aspect of the invention, it is possible to shield an unnecessary light with respect to the beams of all the image heights (the object heights) effectively by disposing the central shielding member in the vicinity of a paraxial pupil position (the position at which the paraxial chief ray crosses the optical axis). Then, it is possible to easily avoid a mechanical interference between the mechanical structure of the variable aperture stop and a mechanism for holding the central shielding member by disposing the variable aperture stop at a position different from that of the central shielding member in the direction of the optical axis so as to suppress practically sufficiently an influence of vignetting in all the image heights (the object heights) when the aperture size of the variable aperture stop changes, that is, a difference in the numerical apertures among the beams in all the image heights (the object heights).

Here, when the variable aperture stop and the central shielding member are disposed at the same position, not only that a mechanical interference is brought about between the variable aperture stop and the central shielding member, but also a difference in the numerical apertures is unfavorably generated due to a difference in the image height (the object height) when the aperture size of the variable aperture stop is changed. In this case, in order to prevent a difference in the numerical apertures due to a difference in the image height (the object height), it can be considered to completely correct the field curvature of the pupil. However, in this case, the catadioptric imaging system becomes unfavorably complicated with, for example, the enlarged total length or the increased number of the lenses.

According to the optical system of the fourth aspect of the invention, the first imaging optical system comprises a first lens group of a positive refracting power, the variable aperture stop, and a second lens group of a positive refracting power in that order from the first plane side, the second imaging optical system comprises the primary mirror and the secondary mirror, and the central shielding member is disposed in the first imaging optical system.

Also according to the above optical system, an unnecessary light with respect to the beams of all the image heights supplied to the second imaging optical system including the primary mirror and the secondary mirror can be effectively intercepted in the first imaging optical system, whereby it is possible to easily avoid a mechanical interference between the mechanical structure of the variable aperture stop and the mechanism for holding the central shielding member and it is also possible to suppress an influence of vignetting in all the image heights (the object heights) practically sufficiently when the aperture size of the variable aperture stop is changed. Note that, in this arrangement, the variable aperture stop is preferably disposed between the central shielding member and the first lens group. In this manner, a difference in the numerical apertures when the aperture size of the variable aperture stop is changed can be substantially equal in all the image heights (the object heights).

A catadioptric imaging system according to a fifth aspect of the invention is provided with a first imaging optical system of a dioptric type for forming an intermediate image of a first plane and a second imaging optical system of a catadioptric type for forming a final image of said first plane on a second plane with reduction magnification on the basis of the radiation from said intermediate image. The first imaging optical system comprises a first lens group of a positive refracting power, an aperture stop, and a second lens group of a positive refracting power in this order from the first plane side. The second image optical system comprises a primary mirror which is provided with a first reflecting surface with a concave form having a first radiation transmitting portion at the center thereof, and a secondary mirror which is provided with a second reflecting surface having a second radiation transmitting portion at the center thereof. The radiation incident on the second imaging optical system passes through the first radiation transmitting portion of the primary mirror and is reflected by the second reflecting surface, the radiation reflected by the second reflecting surface is reflected by the first reflecting surface, and the radiation reflected by the first reflecting surface passes through the second radiation transmitting portion of the secondary mirror to form the final image on the second plane. A refracting member provided in the catadioptric imaging system is disposed only in a part of an optical path between the first plane and the second plane, excluding the portion between the first radiation transmitting portion and the second radiation transmitting portion.

In the optical system of the fifth aspect of the invention, the intermediate image is formed by the first imaging optical system, and in the vicinity of the forming position of the intermediate image, there is provided the primary mirror having the first radiation transmitting portion (the central opening) at the center thereof and having the first reflecting surface of the negative refracting power, so that the diameter of this central opening of the primary mirror is reduced, thereby avoiding deterioration of the image forming performance which may be caused by increase of the central shielding rate. Further, such arrangement is employed in which in the vicinity of the second plane (the image plane), there is provided the secondary mirror with the second reflecting surface having the second radiation transmitting portion (the central opening) at the center thereof, so as to be thin in the direction of the optical axis. Thus, it is possible to prevent deterioration of the image performance which may be caused by the increase of the central shielding rate, as described above. In this case, the refracting member is disposed only in a part, excluding the portion between the central opening on the primary mirror side and the central opening on the secondary mirror side. That is, the primary mirror and the secondary mirror no longer utilize the rear surface reflection of the refracting member, so that it is possible to easily and effectively prevent deterioration of the image forming performance which is caused by a change of the surface form of the refracting member due to absorption of a comparatively large amount of the illumination heat caused by the rear surface reflection. Also, it is no longer required to dispose the refracting member between the primary mirror and the secondary mirror, so that it is possible to easily prevent the refracting member from being enlarged with the primary mirror and the secondary mirror the diameters of which are inevitably enlarged for reducing the shielding rate. Further, it is also possible to easily avoid deterioration of the image forming performance including the reduction of contrast, generation of ghost, and the like, caused by a reflected light which can not transmit through the refracting surface of the refracting member disposed between the primary mirror and the secondary mirror and becomes a stray light.

According to the catadioptric imaging systems of the fifth aspect of the invention described above, even when a radiation having the wavelength of 180 nm or less such as an $F_2$ laser beam is used, the primary mirror size is not necessarily increased and an image-side NA and an image circle in the predetermined sizes can be securely obtained, so that it is possible to realize a catadioptric imaging system which is capable of obtaining a high resolution of, for example, 0.1 μm or less by using a smaller number of lenses.

The optical system of the fifth aspect of the invention is further provided a chromatic aberration correction lens which is disposed in a portion in an optical path between the intermediate image and the first reflecting surface except a part between the first radiation transmitting portion and the second radiation transmitting portion. In this optical system, a chromatic aberration can be corrected by the chromatic aberration correction lens having a small diameter without deterioration of the image forming performance.

Also, in the optical system of the fifth aspect of the invention, it is preferable to satisfy the following conditional expression (5):

$$-1.10 < f2/|d2| < -0.15 \tag{5}.$$

Here, f2 represents the focal length of the chromatic aberration correction negative lens disposed between the intermediate image and the first reflecting surface, and d2 a distance between the first reflecting surface and the second reflecting surface, respectively. Below the lower limit of the conditional expression (5), the power of the chromatic aberration correction negative lens becomes smaller so that it is difficult to realize excellent chromatic aberration correction. Conversely, above the upper limit of the conditional expression (5), another aberration may be generated so that it is difficult to produce the chromatic aberration correction negative lens itself. In this respect, if the upper limit of the conditional expression (5) is set at −25 and the lower limit at −70, the chromatic aberration can be corrected in the entire image field with excellency without increasing the size of the optical system.

Also, according to the optical system of the fifth aspect of the invention, it is possible to dispose a central shielding member in the vicinity of the rear focal position of the first lens group for intercepting a radiation incident on the center of the second imaging optical system.

In the above optical system, it is possible to effectively intercept the unnecessary radiation with respect to the beams of all the image heights supplied to the second imaging optical system including the primary mirror and the secondary mirror, by means of the central shielding member disposed in the first imaging optical system.

Also, in the optical system of the fifth aspect of the invention, the first lens group may have the field curvature of the pupil, and the central shielding member and the aperture stop may be disposed at positions which are separated from each other in the direction of the optical axis of the first imaging optical system.

In the above optical system, it is possible to arrange such that a mechanical interference between the mechanical structure of the variable aperture stop and the mechanism for holding the central shielding member can be easily avoided. Further, it is possible to obtain a uniform image forming performance in the entire image field by disposing the central shielding member at the rear focal position of the first lens group and the aperture stop at a position separated from this rear focal position by the field curvature of the pupil. That is, it is possible to obtain the same area and position of the shielded portion with respect to any angle of view. Even when the aperture size of the variable aperture stop is changed, the influence of vignetting caused by the central shielding member in all the image heights can be sufficiently reduced.

Also, according to the optical system of the fifth aspect of the invention, it is possible to make both the first plane side and the second plane side telecentric optical systems.

In the above optical system, it is possible to reduce an influence of an image distortion which is caused by a slight deviation in the direction of the optical axis of the first plane and the second plane such as a movement or a bent to the extent which can be ignored.

Also, the optical system of the fifth aspect of the invention has ten or more refracting surfaces, at least five of which may have aspherical forms.

In the above optical system, it is possible to obtain a sufficient brightness with a small amount of loss with the reduced number of the refracting lenses, and to have little fluctuation in the aberrations due to heat generation. That is, when an exposure wavelength becomes 180 nm or less, the film materials used for an antireflection coat which is applied on the surfaces of the refracting lenses are limited, so as not to obtain a sufficient performance as the antireflection coat. For this reason, it is required to minimize a transmitting surface. Thus, it is possible to extremely reduce the number of the refracting lenses while realizing a resolution of 0.1 μm or less, by forming at least five of the ten or more refracting surfaces to be aspherical, as described above.

In the optical system of the fifth aspect of the invention, it is also preferable to satisfy the following conditional expressions (6) and (7).

$$0.15<|\beta/\beta3|<0.95 \quad (6).$$

$$0.10<|\beta/\beta4|<0.50 \quad (7).$$

Here, β represents the magnification of the entire catadioptric imaging system mentioned above, β3 represents the magnification of the first reflecting surface, and β4 represents the magnification of the second reflecting surface.

Below the lower limits of the conditional expressions (6) and (7), a ratio of bearing the magnification in the first imaging optical system increases, so that the diameter of the lens for constituting the first imaging optical system increases. On the other hand, above the upper limits the conditional expressions (6) and (7), the intermediate image becomes larger, so that the central shielding may become larger or an operational distance on the second plane side may not be sufficiently secured. As a result, an excellent image forming performance can not be obtained. Note that if the upper limit of the conditional expression (6) is set at 0.8 and the lower limit at 0.3, and the upper limit of the conditional expression (7) is set at 0.28 and the lower limit at 0.28, it is possible to realize an optical system having a more excellent image forming performance and a sufficiently long operational distance.

Also, in the optical system of the fifth aspect of the invention, the refracting member for constituting the catadioptric imaging system can be disposed only in an optical path between the first plane and the first radiation transmitting portion.

In the above optical system, since there is no refracting member in an optical path from the first reflecting surface to the second plane, it is no longer required to dispose a refracting member between the primary mirror and the secondary mirror, and further, between the secondary mirror and the second plane. As a result, it is possible to prevent more securely the image forming performance from being deteriorated due to the radiation which is reflected by the refracting surface of the refracting member and becomes a stray light.

The optical system of the fifth aspect of the invention preferably satisfies the following conditional expression (8):

$$0.04<|d3/d2|<0.08 \quad (8).$$

Here, d2 represents a distance between the first reflecting surface and the second reflecting surface, and d3 a distance between the second reflecting surface and the second plane.

Below the lower limit of the conditional expression (8), it becomes impossible to obtain a sufficiently large operational distance on the second plane side without enlarging the secondary mirror. On the other hand, above the upper limit of the conditional expression (8), the central shielding becomes large so that an optical system having a sufficiently excellent image forming performance can not be achieved. In this respect, it is preferable to change the upper limit of the conditional expression (8) from 0.065 to −0.3, and to set the lower limit of the conditional expression (8) at 0.043.

According to the optical system of the fifth aspect of the invention, it is arranged such that the second imaging optical system forms the intermediate image which is formed by the first imaging optical system as the final image mentioned above on the second plane.

According to the optical system of the fifth aspect of the invention, the first radiation transmitting portion of the primary mirror and the second radiation transmitting portion of the secondary mirror may be disposed at positions containing the optical axis of the catadioptric imaging system.

A catadioptric imaging system according to a sixth aspect of the invention is provided with a first imaging optical system of a dioptric type for forming an intermediate image of a first plane and a second imaging optical system for forming a reduced image of the first plane on a second plane on the basis of the radiation from said intermediate image. The first imaging optical system comprises an aperture stop, a first lens group disposed between the aperture stop and the first plane, and a second lens group disposed between the aperture stop and the intermediate image. The second image optical system comprises a primary mirror which is provided with a first reflecting surface having a first radiation transmitting portion at the center thereof, and a secondary mirror which is provided with a second reflecting surface having a second radiation transmitting portion at the center thereof. The first reflecting surface is a front surface reflecting surface with a concave form, and the second reflecting surface has a negative power. The second imaging optical system is arranged such that a radiation incident on the second optical system passes through the first radiation transmitting portion of the primary mirror and is reflected by the second reflecting surface of the secondary mirror, the radiation reflected by the second reflecting surface is reflected by the first reflecting surface, and the radiation reflected by the first reflecting surface passes through the second radiation transmitting portion of the secondary mirror to reach the second plane.

In the optical system of the sixth aspect of the invention, the primary mirror is disposed in the vicinity of the forming position of the intermediate image, so that the size of the first radiation transmitting portion disposed in the central part of this primary mirror is reduced and the central shielding rate is increased, thereby avoiding deterioration of the image forming performance. Further, such arrangement is employed in which the secondary mirror is disposed in the vicinity of the second plane, to be thin in the direction of the optical axis. Thus, it is possible to prevent deterioration of the image performance which may be caused by the increase of the central shielding rate, in the same manner as described above. In this case, the first reflecting surface on the primary mirror side is the front surface reflecting surface of the negative power, which does not utilize the rear surface reflection of a refracting member, so that it is possible to easily and effectively prevent deterioration of the image forming performance which may be caused by absorption of the illumination heat generated by the rear surface reflection in the refracting member. Also, it is no longer required to prepare a large-sized refracting member because of the primary mirror which inevitably has a comparatively large diameter in order to reduce the shielding rate. Further, it is also possible to easily avoid the deterioration of the image forming performance including a reduction of contrast, generation of ghost, or the like, caused by a radiation which can not transmit through the refracting surface of the refracting member, but is reflected thereby, and becomes a stray light, like in case in which the primary mirror is used as a rear surface reflecting mirror.

According to the catadioptric imaging systems of the sixth aspect of the invention described above, even when a radiation having the wavelength of 180 nm or less such as an $F_2$ laser beam is used, the primary mirror size is not necessarily increased and an image-side NA and an image circle in the predetermined sizes can be securely obtained, so that it is possible to realize a catadioptric imaging system which is capable of attaining a high resolution of, for example, 0.1 μm or less by using a smaller number of lenses.

According to the optical system of the sixth aspect of the invention, the second imaging optical system may have a refracting member which is disposed in an optical path between the first reflecting surface and the second reflecting surface.

In the above optical system, various kinds of aberrations can be suppressed by, for example, correcting the chromatic aberration of the first imaging optical system by using the refracting member, so as to further enhance the image forming performance.

Also, in the optical system of the sixth aspect of the invention, one of the optical surfaces of the refracting member in the second imaging optical system is provided with a lens surface having a negative refracting power, while the other with the second reflecting surface.

In the above optical system, it is possible to easily ensure a sufficient operational distance (working distance) on the image side while approximating the second plane on which a reduced image is formed to the second radiation transmitting portion of the secondary mirror.

Also, according to the optical system of the sixth aspect of the invention, the optical surface on the secondary mirror side of the refracting member in the second imaging optical system may be arranged to be separated from the second reflecting surface of the secondary mirror.

In this case, it is no longer required to utilize the rear surface reflection in the second imaging optical system, so that it is possible to correct the chromatic aberration, or the like, by means of the refracting member while decreasing absorption of the thermal energy, thereby enhancing the image forming performance.

In the optical system of the sixth aspect of the invention, the refracting member for constituting the catadioptric imaging system is disposed only in a portion of an optical path between the first plane and the second plane, excluding a part between the first radiation transmitting portion and the second radiation transmitting portion.

In this case, the primary mirror and the secondary mirror no longer utilize the rear surface reflection of the refracting member, so that it is possible to easily and effectively prevent deterioration of the image forming performance which is caused by a change of the surface form of the refracting member due to absorption of a comparatively large amount of illumination heat by the rear surface reflection. Also, it is no longer required to dispose a refracting member between the primary mirror and the secondary mirror, so that it is possible to easily prevent the refracting member from being enlarged with the increase of the sizes of the primary mirror and the secondary mirror the diameters of which inevitably become comparatively large in order to reduce the shielding rate. It is further possible to easily prevent the deterioration of the image forming performance including reduction of contrast, generation of ghost, or the like, caused by a reflected radiation which can not pass through the refracting surface of the refracting member disposed between the primary mirror and the secondary mirror, but is reflected thereby to become a stray light.

An optical system according to the seventh aspect of the invention is an optical system which is provided with an imaging optical system for optically conjugate a first plane and a second plane to each other, and a substrate position detecting system for photoelectrically detecting the position of a substrate with respect to the second plane. The imaging optical system comprises a primary mirror consisting of a first reflecting surface with a concave form having a first radiation transmitting portion at the center thereof, and a secondary mirror consisting of a second reflecting surface disposed between the primary mirror and the second plane and having a second radiation transmitting portion at the center thereof, and a base member provided with the second reflecting surface formed on the surface thereof. The substrate position detecting system is provided with a light guiding system for guiding a detection light, after passing it through the base member of the secondary mirror, to a detection area which is formed by projecting the second radiation transmitting portion onto the second plane, and a light receiving system for guiding the reflected light in the detection area, after passing it through the base member of the secondary mirror, to a photoelectric conversion unit.

In the optical apparatus of the seventh aspect of the invention, it is required to position the secondary mirror in the vicinity of the second plane in order to reduce the central shielding rate. However, since being a surface reflecting mirror, the secondary mirror has the thickness in the direction of the optical axis, and a substantial operational distance on the image side, that is, a space between the second plane and the base member of the secondary mirror is required to be small, compared with that in a conventional projection optical system. For this reason, in case of detecting the position of the second plane, it is difficult to conduct the focal detection by the conventional oblique incidence method. Examples of such optical apparatus for conducting the focal detection by the oblique incidence method as described above are disclosed in Japanese Patent Application Laid-Open No. HEI 6-66543, Japanese Patent Application Laid-Open No. HEI 8-219718, Japanese Patent Application Laid-Open No. HEI 9-304016, and Japanese Patent Application Laid-Open No. HEI 10-82611. In the structure of the present invention, it is preferable that the light guiding system of the substrate position detecting system is arranged to guide a detection light from a side surface of the base member of the secondary mirror, and to guide the detection light emitted from the side surface of the base member to a detection area. The light receiving system of the substrate position detecting system is preferably arranged to guide a light which is reflected in the detection area into the base of the base member of the secondary mirror member through the side surface thereof, and to guide the light emitted from the side surface of the base member to the photoelectric conversion unit. With this structure, it is preferable that a light advancing through the base member of the secondary mirror is guided to be reflected on the surface on the first plane side and the surface on the second plane side of the secondary mirror. Also with this structure, the side surface of the base member through which the detection light and the reflected light in the detection area pass is formed to be planar. With this structure of the optical apparatus, it becomes possible to conduct a focusing operation with high precision.

A projection exposure apparatus in which the optical apparatus of the seventh aspect of the invention is incorporated is provided with an illumination optical system for illuminating a mask with a predetermined pattern formed thereon, and the above-mentioned optical apparatus for projecting an image of the predetermined pattern of the mask disposed on the first plane onto a photosensitive substrate which is disposed on the second plane. According to this projection exposure apparatus, it becomes possible to conduct exposure with high precision by conducting a focusing operation with high precision.

Also, an exposure method using the optical apparatus of the seventh aspect of the invention comprises the step of illuminating a mask on which a predetermined pattern is formed by the illumination radiation, and the step of projecting an image of the predetermined pattern of the mask disposed on the first plane onto a photosensitive substrate which is disposed on the second plane.

According to this exposure method, it becomes possible to conduct exposure with high precision by conducting a focusing operation with high precision.

In the catadioptric imaging system according to one of the first to fifth aspects of the invention described above, all of the refracting optical members for constituting the catadioptric imaging system may be formed of fluorite, whereby it becomes possible to use an exposure light having the wavelength of 180 nm or less such as an $F_2$ laser beam (157 nm), so as to realize a high resolution of 0.1 μm or less.

Also, according to the catadioptric imaging system of one of the first to fifth aspects of the invention, in an optical path between the first lens group and the second lens group in the first imaging optical system, a light shielding member may be disposed for intercepting some of beams centering around the optical axis, out of incident beams. In the optical system of one of the first and fifth aspects of the invention, there are provided two reflecting surfaces (the reflecting surface of the primary mirror and the reflecting surface of the secondary mirror) each having an opening at the center thereof, so that a beam advancing along the optical axis from the first plane is not reflected by any of these reflecting surfaces and becomes a stray light directly reaching the second plane through the central openings. Then, the above-mentioned stray light can be removed by disposing the shielding member for intercepting some of the beams centering around the optical axis, out of the incident beams, in the optical path between the first lens group and the second lens group of the first imaging optical system (for example, in the vicinity of the aperture stop). With this structure, it is also possible to make the central shielding portions of the beams to be the same in the respective fields of view so as to effectively avoid the image forming performance from changing in the fields of view.

Also, according to the catadioptric imaging system of one of the first to fifth aspects of the invention, it is possible to further provide a filed aperture disposed in the vicinity of the forming position of the primary image. Thereby, it is also possible to prevent an unnecessary light directed to an area other than an exposure area from reaching the second plane, and to prevent a stray light such as flare generated in the first imaging optical system from reaching the second plane.

Also, in the catadioptric imaging systems according to one of the first to fifth aspects of the invention, the catadioptric imaging system described above may have an image circle having the diameter of 10 mm or larger on the second plane, whereby when it is applied to the projection optical system of the projection exposure apparatus, a batch exposure can be conducted for a large exposure area, which results in enhancement of the throughput. Note that, in the present invention, the image circle of the catadioptric imaging system indicates an area in which aberrations have been corrected on the image plane of this catadioptric imaging system.

In the catadioptric imaging system according to one of the first to fifth aspects of the invention, the primary mirror in the second imaging optical system may be formed of a material having a coefficient of linear expansion of 3 ppm/°C. or less. In the optical system according to one of the first to fifth aspects of the invention, the clear aperture diameter of the primary mirror becomes large and the refracting power thereof also becomes large, so that a plane change of the reflecting surface of the primary mirror (specifically, the front surface reflecting surface of the optical system according to the first or second aspect of the invention, or the first reflecting surface according to the third or fourth aspect of the invention) due to the illumination heat of the exposure light affects the image forming performance greatly. Then, it is possible to prevent the deterioration of the image forming performance during the exposure caused by the plane change of the reflecting surface of the primary mirror by forming a base for supporting the reflecting surface of the primary mirror of a material having a coefficient of linear expansion of 3 ppm/°C. or less. For example, a material called ULE (trade name) put on the market by Corning, Inc., may be used as such material. This ULE (Ultra Low Expansion Titanium Silicate Glass) has a coefficient of linear expansion of a $\alpha = 5 \times 10^{-8}/°C. = 0.05$ ppm/°C. (see Applied Optics, Vol. 24, p3330 (1985); Vol. 23, p2852, p3014 (1984)).

Also, in the catadioptric imaging system according to one of the first to fifth aspects of the invention, in the vicinity of the rear focal position of the first lens group in the first imaging optical system, an optical element may be disposed for relatively giving at least one of an intensity difference, a phase difference, and a difference in polarized state to a beam which passes through a first area within a section of the beam and a beam which passes through a second area different from the first area in the section of the beam. In this manner, it is possible to obtain a greater depth of focus for the catadioptric imaging system. In this case, an optical element for giving an intensity difference to a beam (a light shielding filter) intercepts or attenuates the central beam while transmitting surrounding beams. Also, an optical element for giving a phase difference to a beam (a phase filter) makes a phase difference between the central beam and the surrounding beams. Further, an optical element for giving a difference in polarized state to a beam (a polarizing filter) makes the direction of polarization of the central beam and that of the surrounding beams to be crossing each other. In this respect, examples in which the light shielding filter is disposed at the pupil position of a projection optical system of a projection exposure apparatus are disclosed in Japanese Patent Application Laid-Open No. HEI 5-234846 and No. HEI 5-234847. Also, examples in which the phase filter is disposed at the pupil position of a projection optical system of a projection exposure apparatus are disclosed in Japanese Patent Application Laid-Open No. HEI 6-215999 and No. HEI 6-244082. Further, examples in which the polarizing filter is disposed at the pupil position of a projection optical system of a projection exposure apparatus are disclosed in Japanese Patent Application Laid-Open No. HEI 6-120110.

Also, in the catadioptric imaging system according to either of the first to fifth aspects of the invention, all of the refracting optical members, the primary mirror and the secondary mirror for constituting the above catadioptric imaging system may be disposed along the single optical axis. In this manner, it becomes possible to design and produce a lens barrel by a technology derived from the conventional art of producing a circular cylinder barrel of dioptric type. As a result, it is possible to achieve the production of higher precision without difficulties.

Also, in the catadioptric imaging system according to either of the first to fifth aspects of the invention, the number of the lenses for constituting this catadioptric imaging system may be ten or less. Thereby, when an extremely fine pattern is projected on a photosensitive substrate by using an exposure radiation having the wavelength of 180 nm or less, it is possible to suppress reduction of transmittance, to thereby reduce a radiation amount loss.

Also, in the catadioptric imaging system according to one of the first to fifth aspects of the invention, the first imaging optical system comprises a central shielding member which is disposed at a position different from the aperture stop in the direction of the optical axis for intercepting light in the vicinity of the optical axis. Thereby, the above-mentioned stray light advancing straight along the optical axis can be removed.

A projection exposure apparatus incorporating the catadioptric imaging system according to one of the first to fifth aspects of the invention therein is provided with an illumination optical system for illuminating a mask on which a predetermined pattern is formed by an illumination radiation in the ultraviolet region, and the above-mentioned catadioptric imaging system for projecting the image of the predetermined pattern of the mask disposed on the first plane onto a photosensitive substrate. According to this projection exposure apparatus, it becomes possible to project an extremely fine pattern onto the photosensitive substrate by using an exposure radiation having the wavelength of, for example, 180 nm or less, so as to achieve the exposure with high precision. Also, since an $F_2$ laser which has been subjected to a comparatively simple band narrowing process can be used as an exposure light source, a large exposure power can be obtained. Further, since the maintenance cost of the laser beam source becomes lower, it is possible to realize a projection exposure apparatus with reduced cost of the laser beam source and high productivity.

The projection exposure apparatus further comprises a first stage for supporting the mask to be movable along a predetermined scanning direction, and a second stage for supporting the photosensitive substrate to be movable along the predetermined scanning direction, so as to conduct the exposure by moving the first and second stages with respect to the catadioptric imaging system. With this projection exposure apparatus, a scanning type exposure becomes possible which moves the mask and the photosensitive substrate in synchronism with respect to the catadioptric imaging system.

The projection exposure apparatus may be arranged such that the first and the second stages are moved in the same direction when the exposure is conducted.

An exposure method incorporating the catadioptric imaging system according to one of the first to fifth aspects of the invention therein comprises the step of generating an illumination radiation in the ultraviolet range, the step of illuminating a mask on which a predetermined pattern is formed by the illumination radiation, and the step of projecting the image of the predetermined pattern of the mask disposed on the first plane onto a photosensitive substrate disposed on the second plane by using the above-mentioned catadioptric imaging system. According to this exposure method, it becomes possible to project an extremely fine pattern onto a photosensitive substrate by using an exposure light having the wavelength of, for example, 180 nm or less, so as to achieve the exposure with high precision. Also, since the $F_2$ laser which has been subjected to the comparatively simple process of band narrowing can be used as the exposure light source, a large exposure power can be obtained.

By the above exposure method, it is possible to conduct an exposure while moving the mask and the photosensitive substrate with respect to the catadioptric imaging system. By this exposure method, it becomes possible to conduct an exposure of scanning type in which the mask and photosensitive substrate are moved in synchronism with respect to the catadioptric imaging system.

The above projection exposure apparatus may be arranged such that the exposure is conducted by moving the mask and the photosensitive substrate in the same direction with respect to the catadioptric imaging system.

A method of manufacturing a device by using the above projection exposure apparatus comprises the step of preparing the photosensitive substrate by applying a photosensitive material on the substrate, the step of forming the final image of the mask on the photosensitive substrate through the catadioptric imaging system, the step of developing the photosensitive material on the substrate, and the step of forming a pattern corresponding to the developed photosensitive material on the substrate. According to this device manufacturing method, it is possible to provide an electric device of high density and high precision comprising an extremely fine pattern.

BRIEF DESCRIPTION OF THE DRAWINGS

FIG. 11 is a view for showing tranverse aberrations in the fifth example.

FIG. 13 is a view for showing tranverse aberrations in the sixth example.

according to an eighth embodiment which is modified from the seventh embodiment of the present invention.

Figure 17:
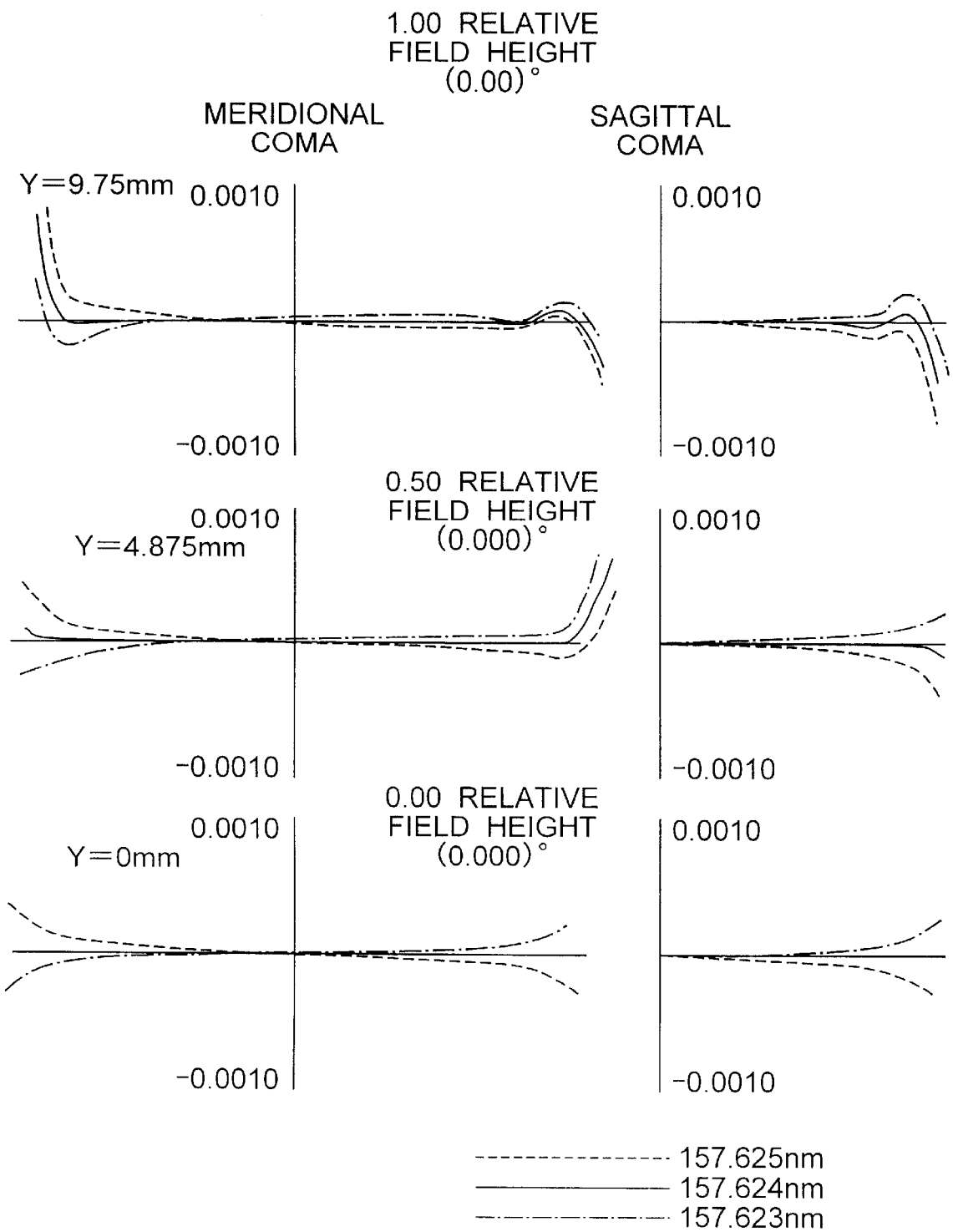

FIG. 17 is a view for showing tranverse aberrations in the eighth example.

Figure 18:
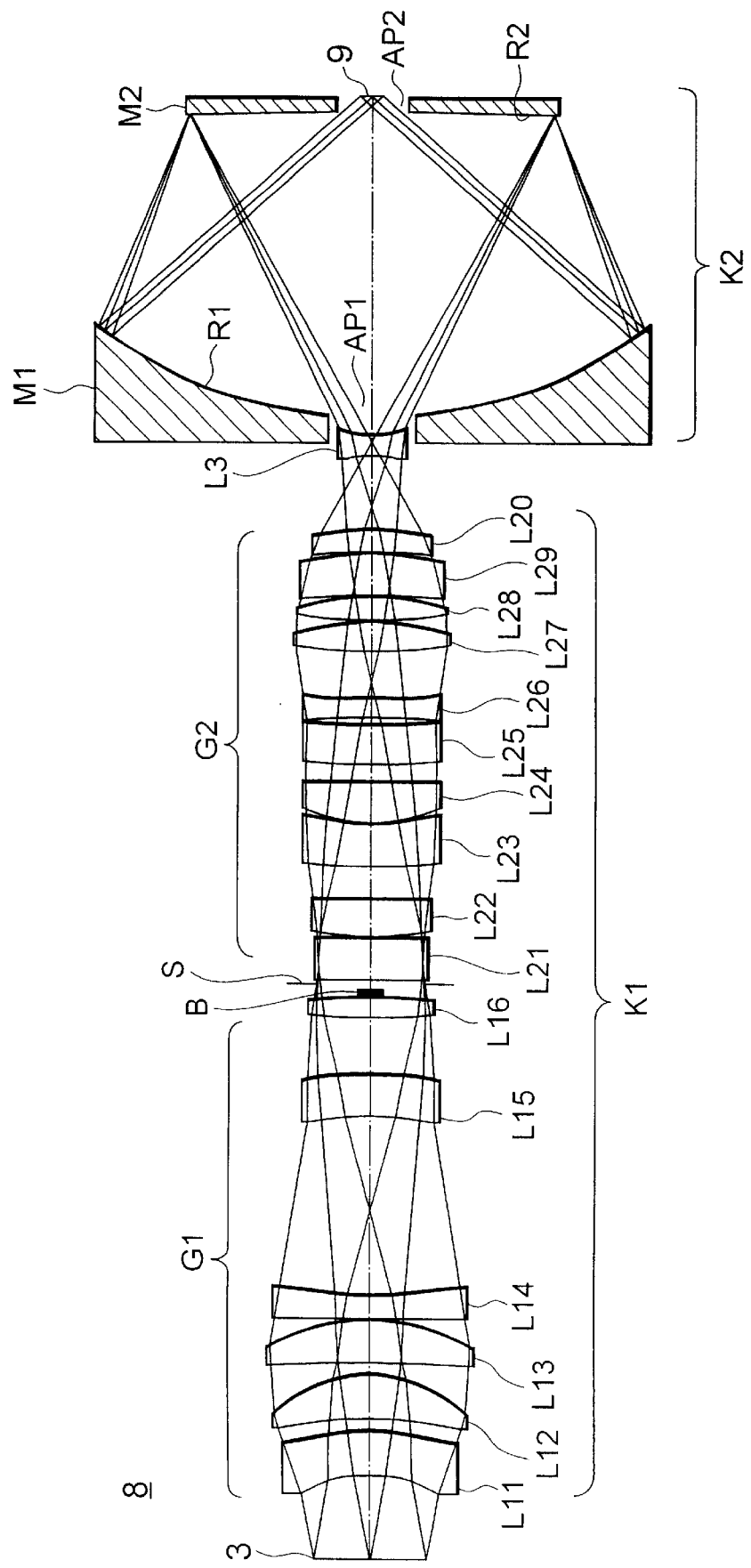

FIG. 18 is a view for showing a lens structure of a catadioptric imaging system (projection optical system) according to a ninth embodiment of the present invention.

Figure 19:
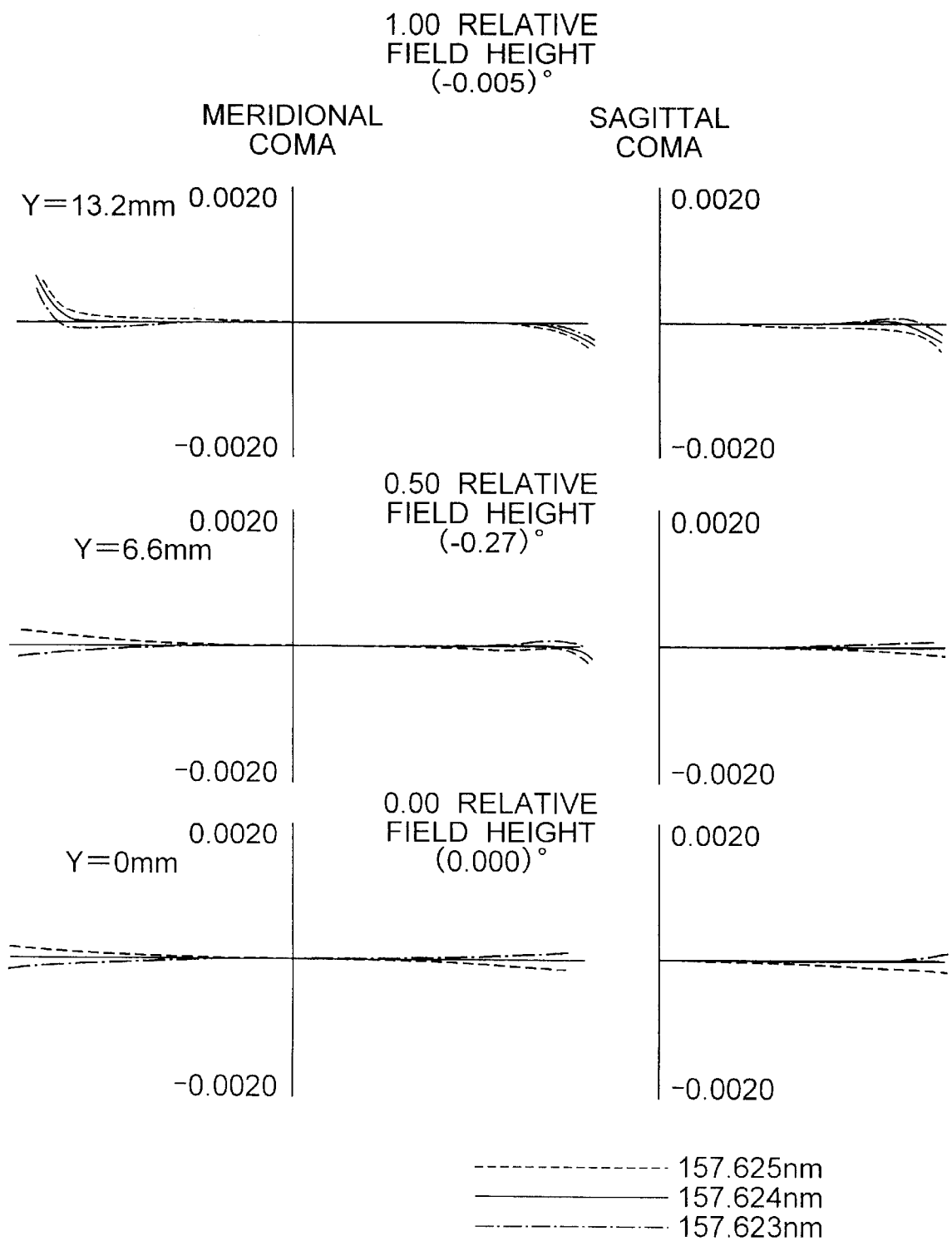

FIG. 19 is a view for showing tranverse aberrations in the ninth example.

Figure 20:
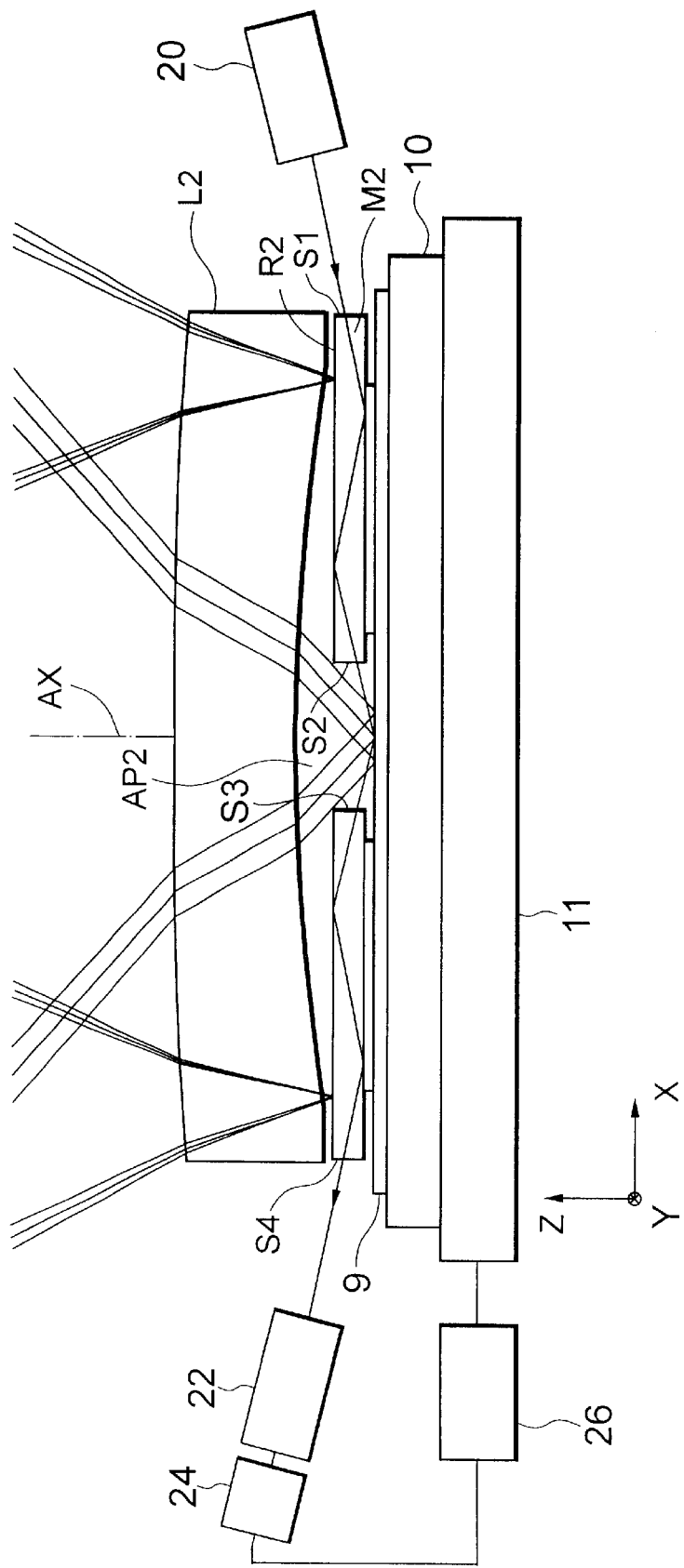

FIG. 20 is a view for showing the structure of the vicinity of a wafer in the optical apparatus according to the fourth embodiment.

Figure 21:
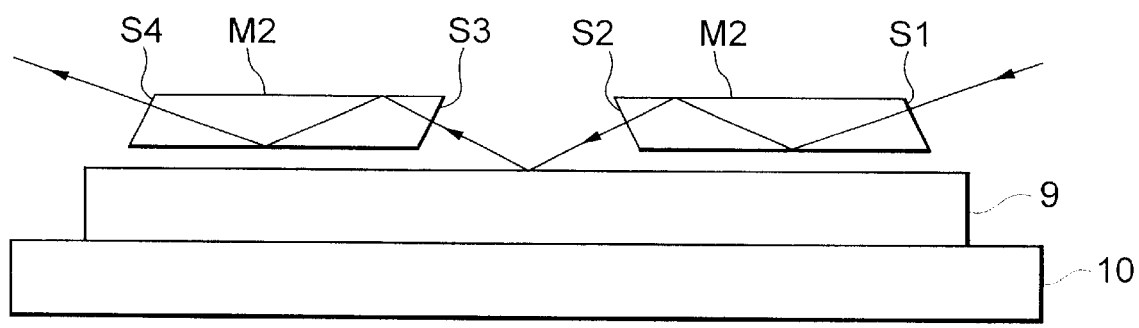

FIG. 21 is a view for showing a variation of the optical apparatus shown in FIG. 18.

Figure 22:
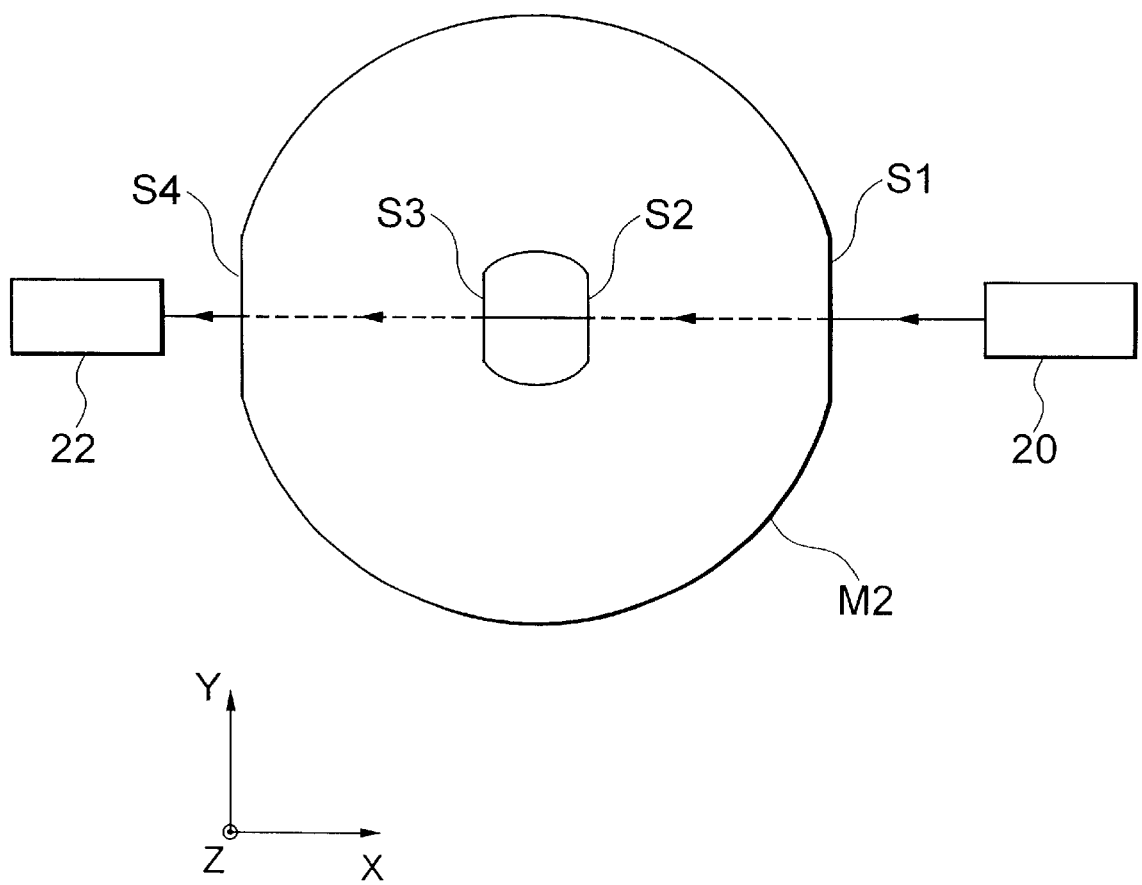

FIG. 22 is a view for showing another variation of the optical apparatus shown in FIG. 18.

FIG. 23 is a flowchart for showing an operational sequence for forming a predetermined circuit pattern by using a projection exposure apparatus according to any of the embodiments of the present invention.

DETAILED DESCRIPTION OF THE PREFERRED EMBODIMENTS

Embodiments of the present invention will be described below with reference to the accompanying drawings.

First Embodiment

Figure 1:
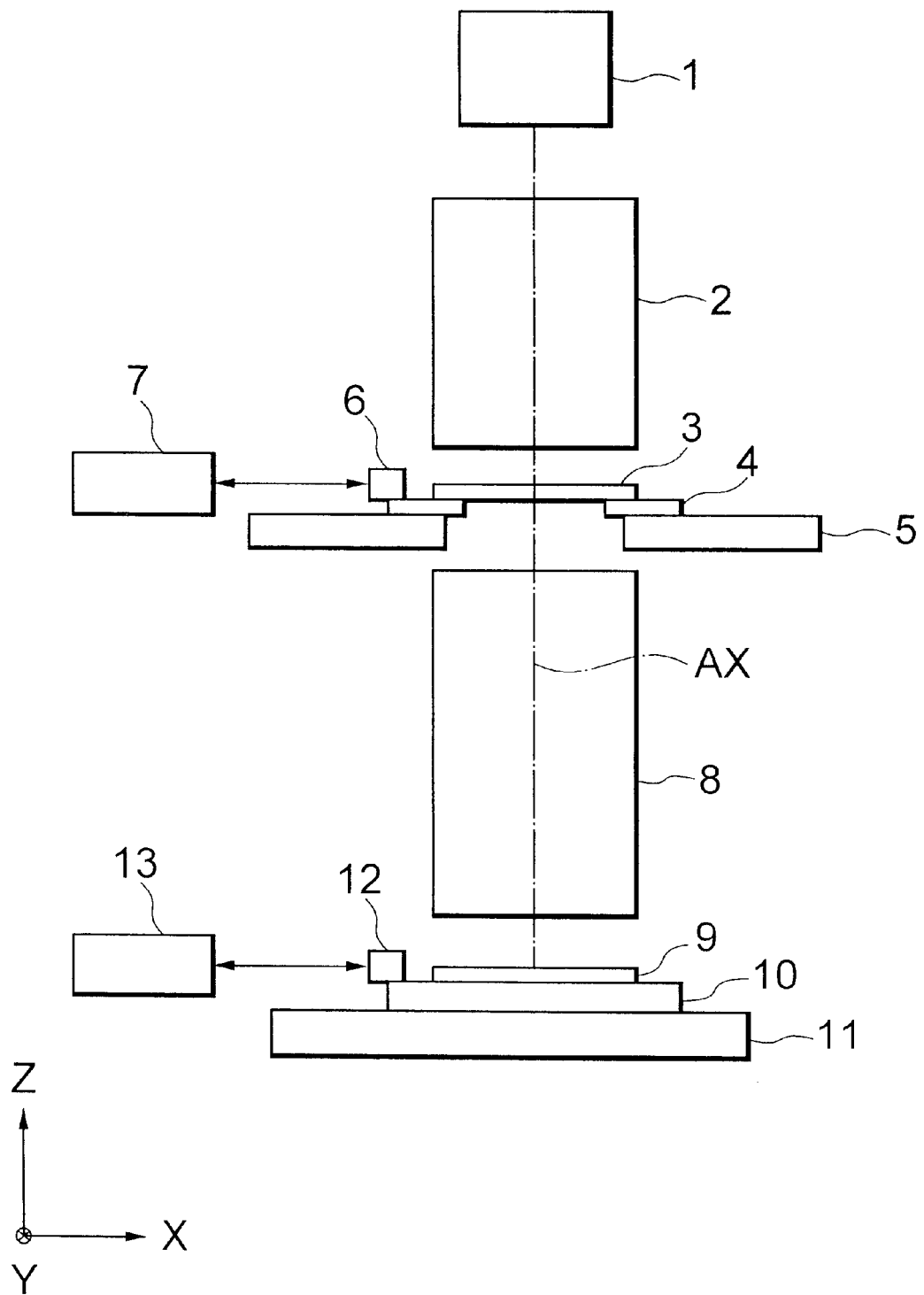
FIG. 1 schematically shows the entire structure of a projection exposure apparatus which is provided with a catadioptric imaging system according to one embodiment of the present invention.

FIG. 1 is a view for schematically showing the entire structure of a projection exposure apparatus which is provided with a catadioptric imaging system according to the first embodiment of the present invention. In FIG. 1, the axis Z is set to be parallel to the optical axis AX of a catadioptric imaging system 8 which constitutes the projection exposure apparatus, the axis X is set to be parallel to the sheet surface of FIG. 1 within a plane perpendicular to the optical axis AX, and the axis Y is set to be perpendicular to the sheet surface.

The illustrated projection exposure apparatus is provided with, for example, an $F_2$ laser (with the central oscillating wavelength of 157.6 nm), to serve as a light source for supplying an illumination radiation in the ultraviolet range. A light emitted from the light source 1 passes through an illumination optical system 2 to uniformly illuminate a mask 3 on which a predetermined pattern is formed.

In an optical path from the light source 1 to the illumination optical system 2, one or a plurality of bending mirrors are disposed for deflecting the optical path, if needed. When the light source 1 and the projection exposure apparatus body are separately constituted, there are provided such optical systems as an automatic tracking unit for directing an $F_2$ laser beam from the light source 1 toward the projection exposure apparatus body all the time, and a shaping optical system for shaping the form of a section of a beam of the $F_2$ laser beam from the light source 1 into a predetermined size or shape, a light quantity adjusting unit, etc. The illumination optical system 2 comprises such optical systems as an optical integrator which is constituted, for example, by a fly's eye lens or an integrator of an inner surface reflection type to form a planar light source in predetermined size and form, a field stop for regulating the size and the form of an illumination area on the mask 3, a field stop imaging optical system for projecting an image of this field stop onto the mask, etc. Further, the optical path between the light source 1 and the illumination optical system 2 is tightly sealed with a casing (not shown), and a space from the light source 1 to the optical member closest to the mask in the illumination optical system 2 is substituted with an inert gas like helium gas or nitrogen, which is a gas with a low absorption rate of an exposure light.

The mask 3 is supported through a mask holder 4 to be parallel to the plane XY on a mask stage 5. On the mask 3, a pattern to be transferred is formed. Out of the entire pattern area, a pattern area in a rectangular form (slit form) having the long sides along the direction Y and the short sides along the direction X is illuminated.

The mask stage 5 is two-dimensionally movable along the mask plane (that is, the plane XY) by the action of a driving system which is omitted in the drawing, and is arranged such that the positional coordinates thereof are measured and position-controlled by an interferometer 7 using a mask moving mirror 6.

Light from the pattern formed on the mask 3 passes through a projection optical system 8 of catadioptric type to form a mask pattern image on a wafer 9 serving as a photosensitive substrate. The wafer 9 is supported through a wafer holder 10 to be parallel to the plane XY on a wafer stage 11. Then, on the wafer 9, the pattern image is formed in an exposure area which has the long sides along the direction Y and the short sides along the direction X, so as to be optically corresponding to a rectangular illumination area on the mask 3.

The wafer stage 11 is two-dimensionally movable along the wafer plane (that is, the plane XY) by the action of a driving system which is omitted in the drawing, and is arranged such that the positional coordinates thereof are measured and position-controlled by an interferometer 13 using a wafer moving mirror 12.

In the illustrated projection exposure apparatus, an inner space of the projection optical system 8 is arranged to be gasproof between an optical member which is disposed nearest to the mask side (a lens L11 in each example) and an optical member which is disposed nearest to the wafer side (a secondary mirror in each example) out of the optical members for constituting the projection optical system 8, and a gas inside the projection optical system 8 is substituted with an inert gas like helium gas or nitrogen.

Further, in a narrow optical path between the illumination optical system 2 and the projection optical system 8, there are provided the mask 3, the mask stage 5, and the like. The casing (not shown) for tightly enclosing the mask 5, the mask stage 5, and the like, is filled with an inert gas such as nitrogen or helium gas.

Also, in a narrow optical path between the illumination optical system 2 and the wafer 9, there are provided the wafer 9, the wafer stage 11, and the like. The casing (not shown) for tightly enclosing the wafer 9, the wafer stage 11, and the like, is filled with an inert gas such as nitrogen or helium gas.

Thus, over the entire optical path from the light source 1 to the wafer 9, an atmosphere in which the exposure light is hardly absorbed is formed.

As described above, the field area (illumination area) on the mask 3 and the projection area (exposure area) on the wafer 9, which are defined by the projection optical system 8, are in rectangular forms having the short sides along the direction X. Accordingly, by moving (scanning) the mask stage 5 and the wafer stage 11, and consequently the mask 3 and the wafer 9 in synchronism, in the short side direction of the rectangular exposure area and illumination area, i.e., in the direction X, while conducting the position control of the mask 3 and the wafer 9 by using the driving systems, the interferometers (7, 13), or the like, scanning exposure of a mask pattern is conducted on the wafer 9 for an area which has the width equal to the long side of the exposure area and the length corresponding to a scanning amount (moving amount) of the wafer 9.

Description will be made on the projection optical system 8 comprising a catadioptric imaging system according to the present embodiment, with reference to FIGS. 2, 4, 6 and 8 which are corresponding to the examples to be specifically described below. The projection optical system 8 is comprised of a first imaging optical system K1 for forming a primary image (intermediate image) I of a pattern of the mask 3, and a second imaging optical system K2 for forming a secondary image of the mask pattern with reduction magnification on the wafer 9 serving as a photosensitive substrate, based on the light from the primary image I.

The first imaging optical system K1 is comprised of a first lens group G1 having the positive refracting power, an aperture stop S, and a second lens group G2 having the positive refracting power, in this order from the mask side.

The second imaging optical system K2 is comprised of a primary mirror M1 having a front surface reflecting surface R1 with its concave surface toward the wafer and an opening at the center thereof, a lens component L2, and a secondary mirror M2 which is provided with a reflecting surface R2 formed on the lens surface on the wafer side and having an opening at the center thereof. From another view point, the secondary mirror M2 and the lens component L2 constitute a rear surface reflecting mirror, while the lens component L2 constitutes a refracting portion (refracting member) of the rear surface reflecting mirror.

All the optical elements (G1, G2, M1 and M2) for constituting the projection optical system 8 are disposed along the single optical axis AX. Also, the primary mirror M1 is disposed in the vicinity of the forming position of the primary image I, and the secondary mirror M2 is in approximation to the wafer 9.

Thus, according to the present embodiment, the light from the pattern of the mask 3 passes through the first imaging optical system K1 to form the primary image (intermediate image) I of the mask pattern. The light from the primary image I passes through the central opening of the maim mirror M1 and the lens component L2 and is reflected by the secondary mirror M2, and the light reflected by the secondary mirror M2 passes through the lens component L2 and is reflected by the primary mirror M1. The light reflected by the primary mirror M1 passes through the lens component L1 and the central opening of the secondary mirror M2 to form the secondary image of a mask pattern on the wafer 9 with reduction magnification.

According to the present embodiment, fluorite ($CaF_2$ crystal) is employed for all of the refracting optical members (lens components) for constituting the projection optical system 8. The central oscillating wavelength of the $F_2$ laser beam serving as the exposure light is set to be 157.6 nm, and the refractive index of $CaF_2$ around the wavelength of 157.6 nm changes at the rate of $-2.4 \times 10^{-6}$ for every change of +1 pm in the wavelength, and at the rate of $+2.4 \times 10^{-6}$ per every change of −1 pm in the wavelength.

Accordingly, the refractive index of the $CaF_2$ for the central wavelength 157.6 nm is 1.5600000. Then, in the first and second examples described below, the refractive index of the $CaF_2$ for 157.6 nm+10 pm=157.61 nm is 1.5599760. Also, in the following third and fourth examples, the refractive index of the $CaF_2$ for 157.6 nm+2 pm=157.602 nm is 1.5599952, and the refractive index of the $CaF_2$ for 157.6 nm−2 pm=157.598 nm is 1.5600048.

In each of the examples to be described later, the following numerical formula (a) is satisfied if the height of an aspherical surface in a direction perpendicular to the optical axis is represented by y, a distance (a sag amount) from a tangent plane at the apex of the aspherical surface to the position on the aspherical plane in the height y along the optical axis is by z, the radius of curvature at the apex by r, the conic coefficient by κ, and the coefficient of the aspherical surface in the n-th order by $C_n$:

$$Z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14} \qquad (a).$$

In each of the examples, a lens surface formed to be aspherical is accompanied by the mark * on the right side of the plane number thereof.

FIRST EXAMPLE

Figure 2:
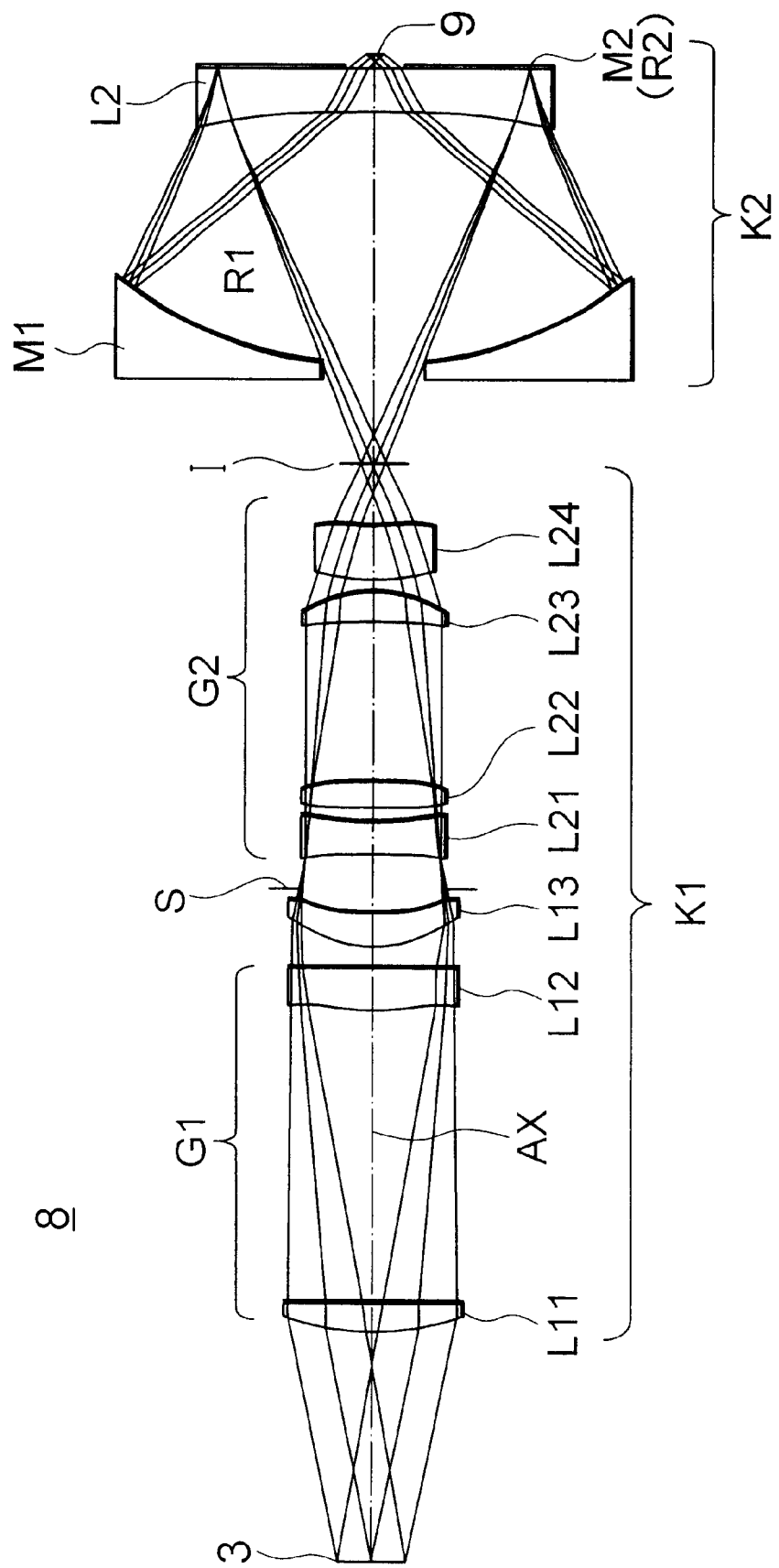
FIG. 2 shows a lens structure of a first example embodying a catadioptric imaging system (projection optical system) according to a first embodiment of the present invention.

FIG. 2 is a view for showing a lens structure of a catadioptric imaging system (projection optical system) according to a first example. In the first example, the present invention is applied to a projection optical system in which aberrations including a chromatic aberration are corrected for the exposure light having the wavelength in the width of 157.6 nm±10 pm.

In the catadioptric imaging system shown in FIG. 2, the first lens group G1 is comprised of a positive meniscus lens L11 having the aspherical convex surface facing the mask side, a positive meniscus lens L12 having the aspherical convex surface facing the mask side, and a positive meniscus lens L13 having the aspherical concave surface facing the wafer side, in this order from the mask side.

Also, the second lens group G2 is comprised of a double concave lens L21 having the surface on the mask side formed to be aspherical, a double convex lens L22 having the surface on the mask side formed to be aspherical, a positive meniscus lens L23 having the aspherical convex surface facing the wafer side, and a positive meniscus lens L24 having the aspherical concave surface facing the wafer side, in this order from the mask side.

Further, the lens component L2 for constituting the refracting portion of the rear surface reflecting mirror (M2, L2) is formed in the shape of a negative meniscus lens having the aspherical concave surface facing the mask side. The reflecting surface R2 of the secondary mirror M2 is formed to have the concave surface facing the mask side.

The following Table 1 shows values for specifications of the catadioptric imaging system of the first example.

In the Table 1, λ represents the central wavelength of the exposure light, β represents a projection magnification, NA represents the numerical aperture on the image side, and φ represents the diameter of an image circle on the wafer, respectively. A plane number indicates the order of a plane from the mask side along a direction of propagation of the beam from the mask plane serving as an object plane to the wafer plane, r represents the radius of curvature of each surface (the radius of curvature at the apex in an aspherical surface: mm), d represents the distance on the axis between each adjacent surfaces or a surface interval (mm), and n represents the refractive index with respect to the central wavelength, respectively.

Note that the sign of the surface distance d is to be changed for each reflection. Therefore, the sign of the surface distance d is negative in an optical path from the rear surface reflecting surface R2 to the front surface reflecting surface R1, and positive in other optical paths. Then, the radius of curvature of the convex surfaces toward the mask side is arranged to be positive, and the radius of curvature of the concave surfaces is to be negative, irrespective of the incident direction of the light ray. Note that in the following second to fourth examples, the same referential numerals and symbols as those in the first example are used.

TABLE 1

(Main specifications)

$\lambda = 157.6$ nm
$\beta = 0.2500$
NA = 0.75
$\phi = 16.4$ mm (Optical member specifications)

| Surface No. | r | d | n |
|---|---|---|---|
|  | (Mask plane) | 201.4588 |  |
| 1* | 199.4801 | 23.6189 | 1.5600000 (Lens L11) |
| 2 | 1933.2675 | 269.2901 |  |
| 3* | 248.9462 | 38.4449 | 1.5600000 (Lens L12) |
| 4 | 1002.9474 | 19.1120 |  |
| 5 | 109.3351 | 28.6306 | 1.5600000 (Lens L13) |
| 6* | 143.4010 | 21.0000 |  |
| 7 | ∞ | 35.4787 | (Aperture stop S) |
| 8* | −1979.6477 | 27.8589 | 1.5600000 (Lens L21) |
| 9 | 215.9777 | 13.6424 |  |
| 10* | 838.3980 | 20.3225 | 1.5600000 (Lens L22) |
| 11 | −252.7298 | 143.5573 |  |
| 12 | −475.0282 | 25.5347 | 1.5600000 (Lens L23) |
| 13* | −98.4914 | 12.5880 |  |
| 14 | 174.9476 | 50.0000 | 1.5600000 (Lens L24) |
| 15* | 249.0942 | 370.2800 |  |
| 16* | −965.4479 | 42.8265 | 1.5600000 (Lens component L2) |
| 17 | −8820.5445 | −42.8265 | 1.5600000 (Rear surface reflecting surface R2) |
| 18* | −965.4479 | −223.7172 |  |
| 19 | 346.8643 | 223.7172 | 1.5600000 (Front surface reflecting surface R1) |
| 20* | −965.4479 | 42.8265 | 1.5600000 (Lens component L2) |
| 21 | −8820.5445 | 10.0000 |  |
|  | (Wafer plane) |  |  |

(aspherical data)

|  | r | κ | $C_4$ |
|---|---|---|---|
| 1st surface | 199.4801 | 0.00000 | $-9.61173 \times 10^{-9}$ |
|  | $C_6$ | $C_8$ | $C_{10}$ |
|  | $-2.14569 \times 10^{-13}$ | $7.59160 \times 10^{-18}$ | $-5.90665 \times 10^{-22}$ |
|  | $C_{12}$ | $C_{14}$ |  |
|  | 0.00000 | 0.00000 |  |
|  | r | κ | $C_4$ |
| 3rd surface | 248.9462 | 0.00000 | $-1.55615 \times 10^{-7}$ |
|  | $C_6$ | $C_8$ | $C_{10}$ |
|  | $-4.68023 \times 10^{-12}$ | $3.66473 \times 10^{-18}$ | $2.76851 \times 10^{-21}$ |
|  | $C_{12}$ | $C_{14}$ |  |
|  | $4.46701 \times 10^{-25}$ | 0.00000 |  |
|  | r | κ | $C_4$ |
| 6th surface | 143.4010 | 0.00000 | $-1.49247 \times 10^{-7}$ |
|  | $C_6$ | $C_8$ | $C_{10}$ |
|  | $2.48237 \times 10^{-12}$ | $1.10343 \times 10^{-15}$ | $-6.65598 \times 10^{-20}$ |
|  | $C_{12}$ | $C_{14}$ |  |
|  | $-2.15738 \times 10^{-24}$ | 0.00000 |  |
|  | r | κ | $C_4$ |
| 8th surface | −1979.6477 | 0.00000 | $-9.40388 \times 10^{-8}$ |
|  | $C_6$ | $C_8$ | $C_{10}$ |
|  | $-4.01544 \times 10^{-12}$ | $-6.89483 \times 10^{-17}$ | $1.70469 \times 10^{-20}$ |
|  | $C_{12}$ | $C_{14}$ |  |
|  | $-6.15241 \times 10^{-24}$ | 0.00000 |  |
|  | r | κ | $C_4$ |
| 10th surface | 838.3980 | 0.00000 | $1.88036 \times 10^{-8}$ |
|  | $C_6$ | $C_8$ | $C_{10}$ |
|  | $-1.59516 \times 10^{-12}$ | $-3.15148 \times 10^{-16}$ | $-2.20945 \times 10^{-20}$ |
|  | $C_{12}$ | $C_{14}$ |  |
|  | 0.00000 | 0.00000 |  |
|  | r | κ | $C_{14}$ |
| 13th surface | −98.4914 | 0.00000 | $1.67077 \times 10^{-7}$ |

TABLE 1-continued

|  | $C_6$ | $C_8$ | $C_{10}$ |
|---|---|---|---|
|  | $-2.42295 \times 10^{-12}$ | $1.58927 \times 10^{-15}$ | $-1.11815 \times 10^{-19}$ |
|  | $C_{12}$ | $C_{14}$ |  |
|  | $1.37831 \times 10^{-23}$ | 0.00000 |  |
|  | r | κ | $C_4$ |
| 15th surface | 249.0942 | 0.00000 | $-1.42562 \times 10^{-7}$ |
|  | $C_6$ | $C_8$ | $C_{10}$ |
|  | $2.11000 \times 10^{-11}$ | $-3.82147 \times 10^{-15}$ | $2.44894 \times 10^{-19}$ |
|  | $C_{12}$ | $C_{14}$ |  |
|  | 0.00000 | 0.00000 |  |
|  | r | κ | $C_4$ |
| 16th surface | −965.4479 | 17.065794 | $7.65400 \times 10^{-9}$ |
| 18th surface | $C_6$ | $C_8$ | $C_{10}$ |
| 20th surface | $-7.96595 \times 10^{-15}$ | $-8.95740 \times 10^{-19}$ | $6.26276 \times 10^{-23}$ |
|  | $C_{12}$ | $C_{14}$ |  |
|  | $-1.26805 \times 10^{-27}$ | $1.50073 \times 10^{-32}$ |  |

(Values corresponding to the conditional expression)

D = 300.000 mm
R = −965.448 mm
$\beta 1 = 0.6249$
$\beta 2 = 0.4000$
(1)D/|R| = 0.3107
(2)|$\beta 1/\beta 2$| = 1.5622

Figure 3:
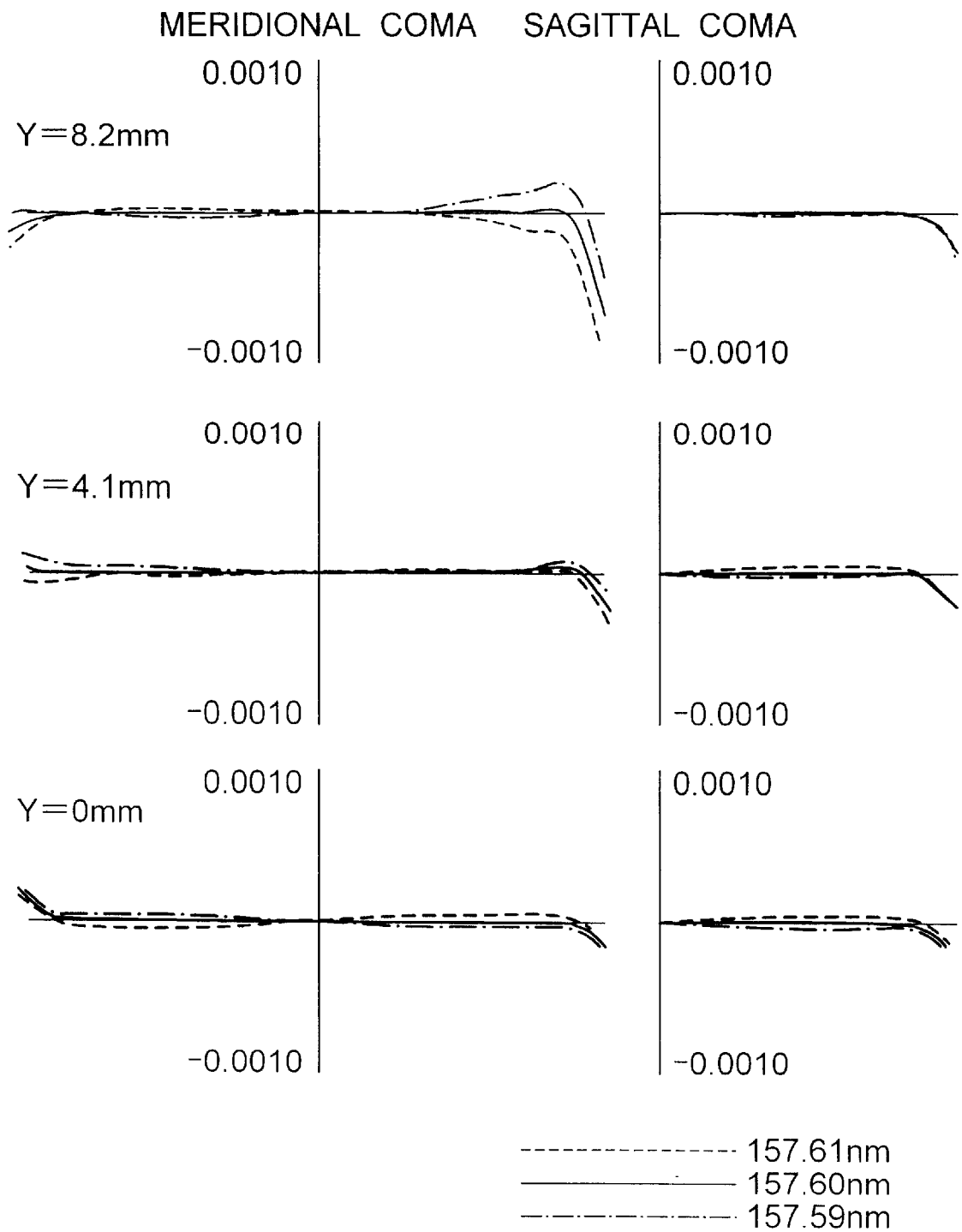
FIG. 3 shows tranverse aberrations in the first example.

FIG. 3 is a view for showing tranverse aberrations in the first example.

In the aberration view, Y represents the image height, the solid line the central wavelength of 157.6 nm, the broken line the wavelength of 157.6 nm+10 pm=157.61 nm, and the dotted line the wavelength of 157.6−nm−10 pm=157.59 nm.

As clearly seen from the aberration view, in the first example, the chromatic aberration is satisfactorily corrected for the exposure light having the wavelength width of 157.6 nm±10 pm. In addition, it is confirmed, though omitted in the drawing, that other aberrations including the spherical aberration, astigmatism, and distortion are satisfactorily corrected.

As described above, in the catadioptric imaging system of the first example, it is possible to securely obtain the numerical aperture of 0.75 on the image side without enlarging the size of the maim mirror M1 with the lenses in a small number with respect to the $F_2$ laser beam having the central wavelength of 157.6 nm, and to securely obtain an image circle of 16.4 mm on the wafer. As a result, when the catadioptric imaging system of the first example is applied to a projection exposure apparatus, it is possible to achieve a high resolution of not more than 0.1 μm. Also, in the first example, it is possible to set the exposure area in a rectangular form of 15 mm×6 mm within the image circle having the diameter of 16.4 mm. In this case, it is possible to transfer a mask pattern onto an area of, for example, 30 mm×40 mm, by conducting stitching exposure using two-time scanning exposure.

SECOND EXAMPLE

Figure 4:
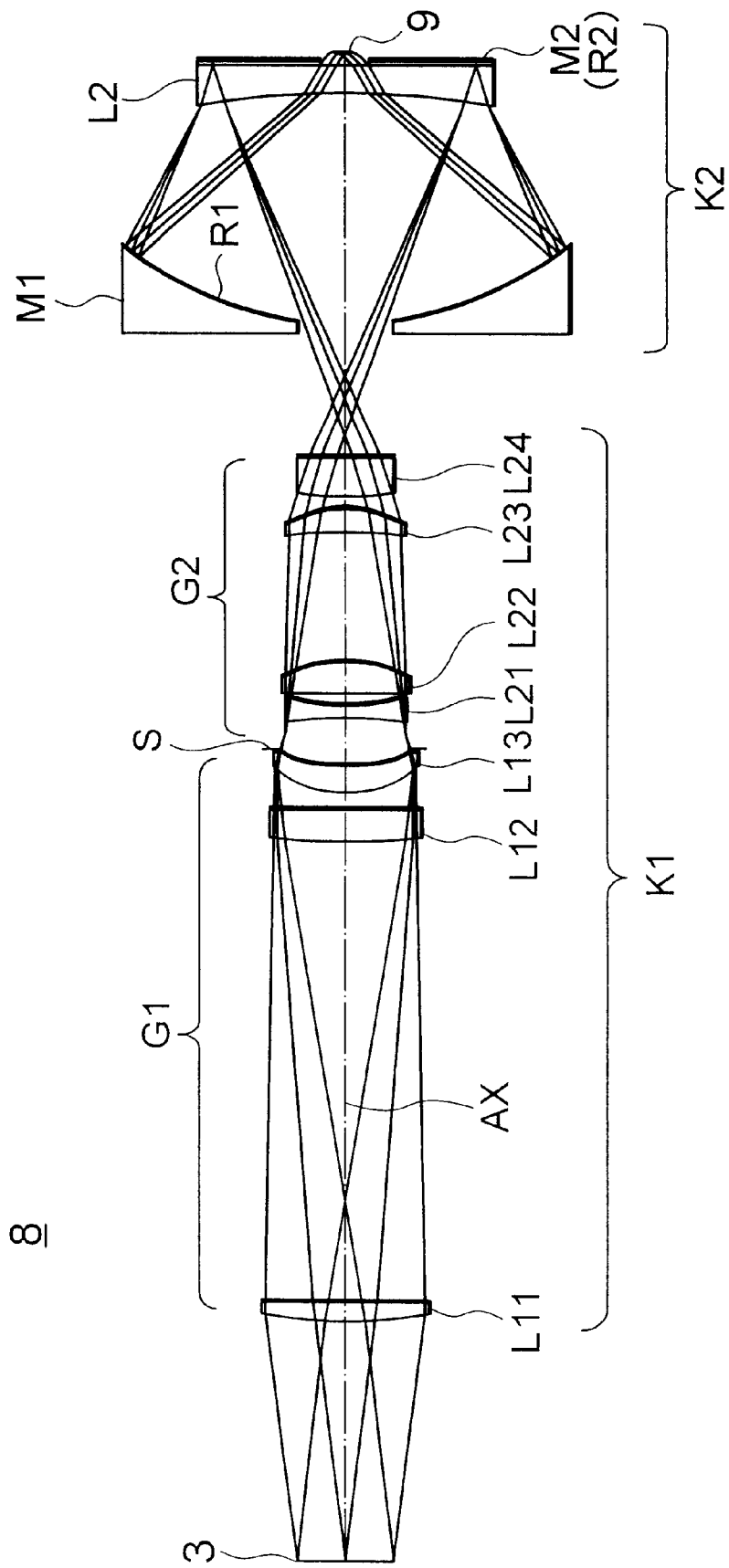
FIG. 4 is a view for showing a lens structure of a catadioptric imaging system (projection optical system) according to a second example.

FIG. 4 is a view for showing a lens structure of a catadioptric imaging system (projection optical system) according to a second example. In the second example, like in the first example, the present invention is applied to a projection optical system in which the aberrations including the chromatic aberration are corrected for the exposure light having the wavelength width of 157.6 nm±10 pm.

In the catadioptric imaging system of FIG. 4, the first lens group G1 is comprised of a double convex lens L11 having the surface on the mask side formed to be aspherical, a positive meniscus lens L12 having the aspherical convex surface facing the mask side, and a positive meniscus lens 13 having the aspherical concave surface facing the wafer side, in this order from the mask side.

Also, the second lens group G2 is comprised of a double concave lens L21 having the surface on the mask side formed to be aspherical, a double convex lens L22 having the surface on the mask side formed to be aspherical, a positive meniscus lens L23 having the aspherical convex surface facing the wafer side, and a positive meniscus lens L24 having the aspherical concave surface facing the wafer side, in this order from the mask side.

Further, the lens component L2 for constituting the refracting portion of the rear surface reflecting mirror (M2, L2) is formed in the shape of a negative meniscus lens having the aspherical concave surface facing the mask side. The reflecting surface R2 of the secondary mirror M2 is formed to have the concave surface facing the mask side.

The following Table 2 shows values for specifications of the catadioptric imaging system of the second example.

In the Table 2, λ represents the central wavelength of the exposure light, β represents a projection magnification, NA represents the numerical aperture on the image side, and φ the diameter of an image circle on the wafer, respectively. A plane number indicates the order of a plane from the mask side along a direction of propagation of the beam from the mask plane serving as an object plane to the wafer plane, r represents the radius of curvature of each surface (the radius of curvature at the apex in an aspherical surface: mm), d represents the distance on the axis between each adjacent surfaces or a surface distance (mm), and n represents the refractive index with respect to the central wavelength, respectively.

Note that the sign of the surface distance d is to be changed for each reflection. Therefore, the sign of the surface distance d is negative in an optical path from the rear surface reflecting surface R2 to the front surface reflecting surface R1, and positive in other optical paths. Then, the radius of curvature of the convex surface toward the mask side is arranged to be positive, and the radius of curvature of the concave surface is to be negative, irrespective of the incident direction of the light ray.

TABLE 2

(Main specifications)

λ = 157.6 nm
β = 0.1667
NA = 0.75
φ = 16.4 mm (Optical member specifications)

| Surface No. | r | d | n |
|---|---|---|---|
|  | (Mask plane) | 242.1618 |  |
| 1* | 348.3645 | 20.3520 | 1.5600000 (Lens L11) |
| 2 | −3554.8348 | 467.3225 |  |
| 3* | 239.8908 | 34.8496 | 1.5600000 (Lens L12) |
| 4 | 1352.4428 | 15.8591 |  |
| 5 | 102.0339 | 25.6961 | 1.5600000 (Lens L13) |
| 6* | 135.8731 | 15.0000 |  |
| 7 | ∞ | 33.0010 | (Aperture stop S) |
| 8* | −1646.0094 | 15.0000 | 1.5600000 (Lens L21) |
| 9 | 162.8326 | 12.6590 |  |
| 10* | 3782.8629 | 28.4575 | 1.5600000 (Lens L22) |
| 11 | −167.4700 | 138.8995 |  |
| 12 | −667.4486 | 23.1320 | 1.5600000 (Lens L23) |
| 13* | −98.3804 | 12.2947 |  |
| 14 | 238.6417 | 40.0000 | 1.5600000 (Lens L24) |
| 15* | 450.8009 | 367.0741 |  |
| 16* | −1060.8317 | 35.7201 | 1.5600000 (Lens component L2) |
| 17 | −12438.4006 | −35.7201 | 1.5600000 (Rear surface reflecting surface R2) |
| 18* | −1060.8317 | −225.9787 |  |
| 19 | 345.5693 | 225.9787 | 1.5600000 (Front surface reflecting surface R1) |
| 20* | −1060.8317 | 35.7201 | 1.5600000 (Lens component L2) |
| 21 | −12438.4006 | 10.3738 |  |
|  | (Wafer plane) |  |  |

(aspherical data)

| | r | κ | $C_4$ |
|---|---|---|---|
| 1st surface | 348.3645 | 0.00000 | $-1.99908 \times 10^{-9}$ |
| | $C_6$ | $C_8$ | $C_{10}$ |
| | $-2.61608 \times 10^{-14}$ | $1.74287 \times 10^{-18}$ | $-8.67060 \times 10^{-23}$ |
| | $C_{12}$ | $C_{14}$ | |
| | 0.00000 | 0.00000 | |
| 3rd surface | r | κ | $C_4$ |
| | 239.8908 | 0.00000 | $-1.46594 \times 10^{-7}$ |
| | $C_6$ | $C_8$ | $C_{10}$ |
| | $-3.72404 \times 10^{-12}$ | $7.48186 \times 10^{-17}$ | $7.76854 \times 10^{-21}$ |
| | $C_{12}$ | $C_{14}$ | |
| | $-9.84338 \times 10^{-26}$ | 0.00000 | |
| 6th surface | r | κ | $C_4$ |
| | 135.8731 | 0.00000 | $-1.31223 \times 10^{-7}$ |
| | $C_6$ | $C_8$ | $C_{10}$ |
| | $4.10629 \times 10^{-12}$ | $1.24814 \times 10^{-15}$ | $-6.18827 \times 10^{-20}$ |
| | $C_{12}$ | $C_{14}$ | |
| | $-2.87148 \times 10^{-24}$ | 0.00000 | |
| 8th surface | r | κ | $C_4$ |
| | −1646.0094 | 0.00000 | $-9.95674 \times 10^{-8}$ |
| | $C_6$ | $C_8$ | $C_{10}$ |
| | $-1.74464 \times 10^{-12}$ | $4.69373 \times 10^{-16}$ | $-1.31864 \times 10^{-20}$ |
| | $C_{12}$ | $C_{14}$ | |
| | $-5.68871 \times 10^{-24}$ | 0.00000 | |
| 10th surface | r | κ | $C_4$ |
| | 3782.8629 | 0.00000 | $1.43307 \times 10^{-8}$ |
| | $C_6$ | $C_8$ | $C_{10}$ |
| | $-1.22504 \times 10^{-13}$ | $-4.09091 \times 10^{-16}$ | $-1.15700 \times 10^{-20}$ |
| | $C_{12}$ | $C_{14}$ | |
| | 0.00000 | 0.00000 | |
| 13th surface | r | κ | $C_4$ |
| | −98.3804 | 0.00000 | $1.88420 \times 10^{-7}$ |
| | $C_6$ | $C_8$ | $C_{10}$ |
| | $-6.07613 \times 10^{-12}$ | $2.32619 \times 10^{-15}$ | $-2.09690 \times 10^{-19}$ |
| | $C_{12}$ | $C_{14}$ | |
| | $2.06538 \times 10^{-23}$ | 0.00000 | |
| 15th surface | r | κ | $C_4$ |
| | 450.8009 | 0.00000 | $-1.45913 \times 10^{-7}$ |
| | $C_6$ | $C_8$ | $C_{10}$ |
| | $2.29629 \times 10^{-11}$ | $-4.70746 \times 10^{-15}$ | $3.43229 \times 10^{-19}$ |
| | $C_{12}$ | $C_{14}$ | |
| | 0.00000 | 0.00000 | |
| 16th surface | r | κ | $C_4$ |
| 18th surface | −1060.8317 | 18.256260 | $7.10920 \times 10^{-9}$ |
| 10th surface | $C_6$ | $C_8$ | $C_{10}$ |
| | $-2.92379 \times 10^{-14}$ | $-4.67533 \times 10^{-19}$ | $4.87403 \times 10^{-23}$ |
| | $C_{12}$ | $C_{14}$ | |
| | $-1.11194 \times 10^{-27}$ | $1.25627 \times 10^{-32}$ | |

(Values corresponding to the conditional expression)

D = 291.067 mm
R = −1060.832 mm
β1 = 0.4229
β2 = 0.3941
(1) D/|R| 0.2744
(2) |β1/β2| = 1.0731

Figure 5:
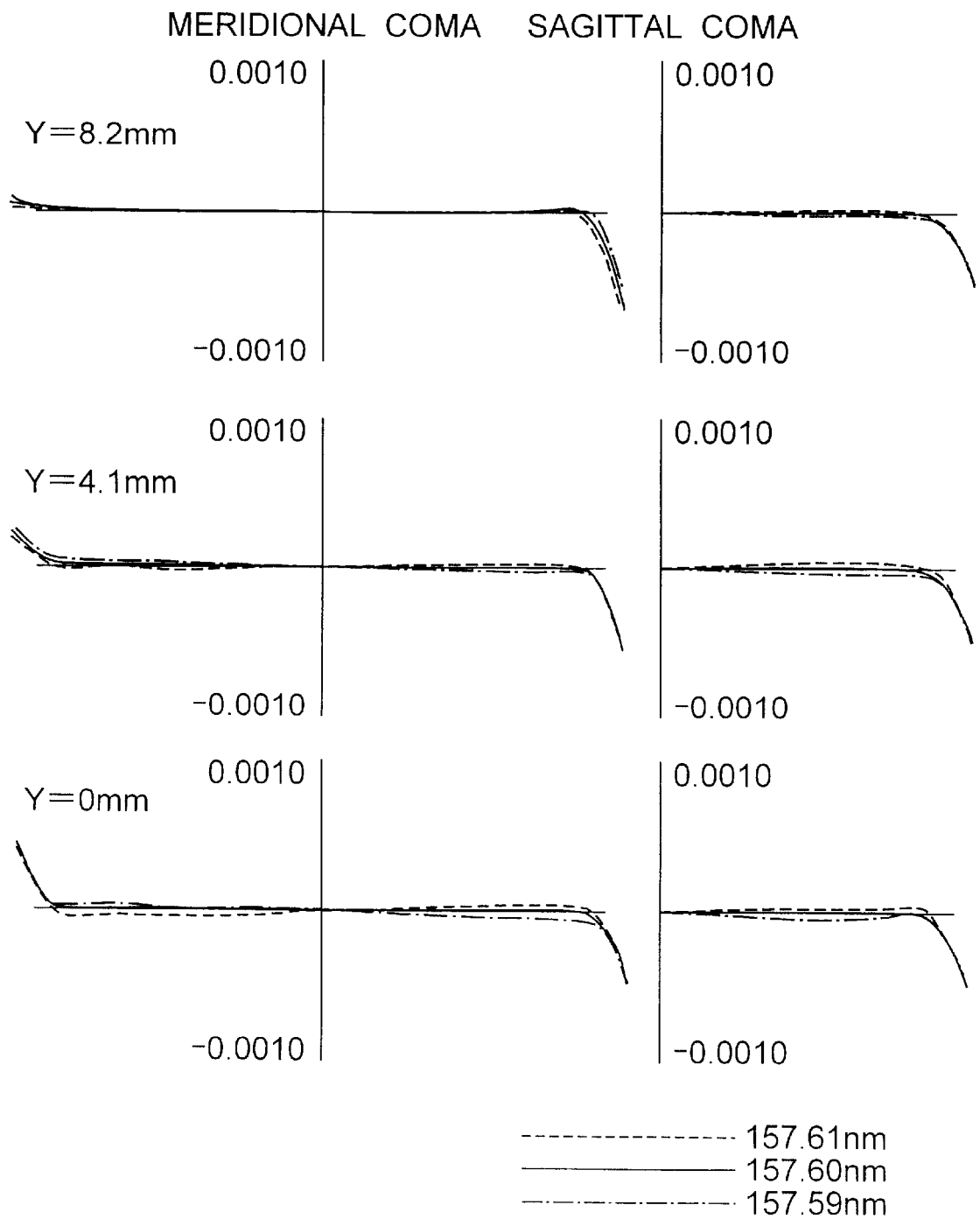
FIG. 5 is a view for showing tranverse aberrations in the second example.

FIG. 5 is a view for showing tranverse aberrations in the second example.

In the aberration view, Y represents the image height, the solid line the central wavelength of 157.6 nm, the broken line the wavelength of 157.6 nm+10 pm=157.61 nm, and the dotted line the wavelength of 157.6 nm−10 pm=157.59 nm, respectively.

As clearly seen from the aberration view, in the second example, like in the first example, the chromatic aberration is satisfactorily corrected for the exposure light having the wavelength width of 157.6 nm±10 pm. In addition, it is confirmed, though omitted in the drawing, that other aberrations including the spherical aberration, astigmatism, and distortion are satisfactorily corrected.

As described above, in the catadioptric imaging system of the second example, like that in the first example, it is possible to securely obtain the numerical aperture of 0.75 on the image side without enlarging the size of the maim mirror M1 with the lenses in a small number with respect to the $F_2$ laser beam having the central wavelength of 157.6 nm, and to securely obtain an image circle of 16.4 mm on the wafer. As a result, when the catadioptric imaging system of the second example is applied to a projection exposure apparatus, it is possible to achieve a high resolution of not more than 0.1 μm. Also, in the second example, like in the first example, it is possible to set the exposure area in a rectangular form of 15 mm×6 mm within the image circle having the diameter of 16.4 mm. In this case, it is possible to transfer a mask pattern onto an area of, for example, 30 mm×40 mm, by conducting stitching exposure using two-time scanning exposures.

THIRD EXAMPLE

Figure 6:
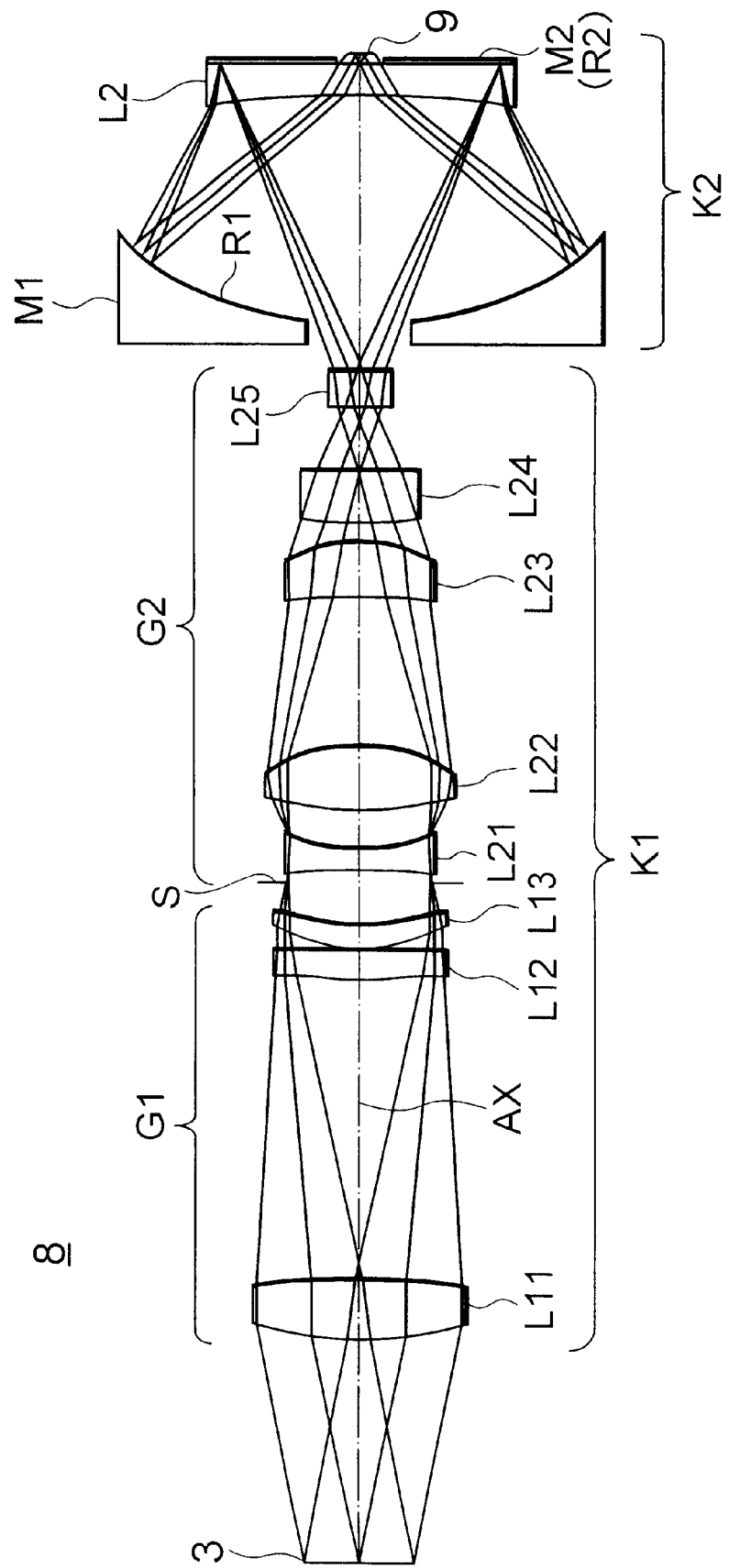
FIG. 6 is a view for showing a lens structure of a catadioptric imaging system (projection optical system) according to a third example.

FIG. 6 is a view for showing a lens structure of a catadioptric imaging system (projection optical system) according to a third example. In the third example, unlike in the first and second examples, the present invention is applied to a projection optical system in which the aberrations including the chromatic aberration are corrected for the exposure light having the wavelength width of 157.6 nm±2 pm.

In the catadioptric imaging system of FIG. 6, the first lens group G1 is comprised of a double convex lens L11 having the surface on the mask side formed to be aspherical, a double convex lens L12 having the surface on the mask side formed to be aspherical, and a positive meniscus lens 13 having the aspherical concave surface facing the wafer side, in this order from the mask side.

Also, the second lens group G2 is comprised of a double concave lens L21 having the surface on the mask side formed to be aspherical, a double convex lens L22 having the surface on the mask side formed to be aspherical, a positive meniscus lens L23 having the aspherical convex surface facing the wafer side, a positive meniscus lens L24 having the aspherical concave surface facing the wafer side, and a double concave lens L25 having the surface on the mask side formed to be aspherical, in this order from the mask side.

Further, the lens component L2 for constituting the refracting portion of the rear surface reflecting mirror (M2, L2) is formed in the shape of a negative meniscus lens having the aspherical concave surface facing the mask side. The reflecting surface R2 of the secondary mirror M2 is formed to have the concave surface facing the mask side.

The following Table 3 shows values for specifications of the catadioptric imaging system of the third example.

In the Table 3, λ represents the central wavelength of the exposure light, β represents a projection magnification, NA represents the numerical aperture on the image side, and φ represents the diameter of an image circle on the wafer, respectively. A plane number indicates the order of a plane from the mask side along a direction of propagation of the beam from the mask plane serving as an object plane to the wafer plane, r represents the radius of curvature of each surface (the radius of curvature at the apex in an aspherical surface: mm), d represents the distance on the axis between each adjacent surfaces or a surface distance (mm), and n represents the refractive index with respect to the central wavelength, respectively.

Note that the sign of the surface distance d is to be changed for each reflection. Therefore, the sign of the surface distance d is negative in an optical path from the rear surface reflecting surface R2 to the front surface reflecting surface R1, and positive in other optical paths. Then, the radius of curvature of the convex surfaces toward the mask side is arranged to be positive, and the radius of curvature of the concave surfaces is to be negative, irrespective of the incident direction of the light ray.

TABLE 3

(Main specifications)

λ = 157.6 nm
β = 0.2500
NA = 0.75
φ = 26.4 mm (Optical member specifications)

| Surface No. | r | d | n |
|---|---|---|---|
| | (Mask plane) | 212.4984 | |
| 1* | 271.1840 | 55.1190 | 1.5600000 (Lens L11) |
| 2 | −1813.8535 | 292.8580 | |
| 3* | 311.8049 | 27.9307 | 1.5600000 (Lens L12) |
| 4 | −5255.1075 | 1.0000 | |
| 5 | 152.8546 | 25.0365 | 1.5600000 (Lens L13) |
| 6* | 216.9976 | 40.6000 | |
| 7 | ∞ | 11.5638 | (Aperture stop S) |
| 8* | −6722.7061 | 18.6098 | 1.5600000 (Lens L21) |
| 9 | 161.3409 | 42.0666 | |
| 10* | 423.2188 | 60.0000 | 1.5600000 (Lens L22) |
| 11 | −178.2896 | 146.6461 | |
| 12 | −744.0670 | 54.2587 | 1.5600000 (Lens L23) |
| 13* | −142.1914 | 16.5488 | |
| 14 | 278.3048 | 50.6377 | 1.5600000 (Lens L24) |
| 15* | 2290.2523 | 63.5676 | |
| 16 | −4911.6877 | 35.3230 | 1.5600000 (Lens L25) |
| 17* | 7183.0248 | 266.3990 | |
| 18* | −951.7953 | 30.2109 | 1.5600000 (Lens component L2) |
| 19 | −4911.6877 | −30.2109 | 1.5600000 (Rear surface reflecting surface R2) |
| 20* | −951.7953 | −226.3990 | |
| 21 | 344.7892 | 226.3990 | 1.5600000 (Front surface reflecting surface R1) |
| 22* | −951.7953 | 30.2109 | 1.5600000 (Lens component L2) |
| 23 | −4911.6877 | 10.0000 | |
| | (Wafer plane) | | |

(aspherical data)

1st surface
r = 271.1840
κ = 0.00000
$C_4$ = −4.13100 × 10$^{-9}$
$C_6$ = −4.86836 × 10$^{-14}$
$C_8$ = 5.18033 × 10$^{-19}$
$C_{10}$ = −2.34891 × 10$^{-23}$
$C_{12}$ = 0.00000
$C_{10}$ = 0.00000

3rd surface
r = 311.8049
κ = 0.00000
$C_4$ = −1.61517 × 10$^{-7}$
$C_6$ = −1.25518 × 10$^{-12}$
$C_8$ = 1.97882 × 10$^{-16}$
$C_{10}$ = 5.26274 × 10$^{-21}$
$C_{12}$ = −6.29521 × 10$^{-25}$
$C_{14}$ = 0.00000

6th surface
r = 216.9976
κ = 0.00000
$C_4$ = −1.23619 × 10$^{-7}$
$C_6$ = 3.70374 × 10$^{-12}$
$C_8$ = 6.92531 × 10$^{-16}$
$C_{10}$ = −5.14929 × 10$^{-20}$
$C_{12}$ = 9.15839 × 10$^{-26}$
$C_{14}$ = 0.00000

8th surface
r = −6722.7061
κ = 0.00000
$C_4$ = −7.87222 × 10$^{-8}$
$C_6$
$C_8$
$C_{10}$

TABLE 3-continued

|  | $-5.25993 \times 10^{-12}$ | $6.65324 \times 10^{-17}$ | $-2.77521 \times 10^{-21}$ |
|---|---|---|---|
|  | $C_{12}$ | $C_{14}$ |  |
|  | $-2.07292 \times 10^{-24}$ | 0.00000 |  |
|  | r | κ | $C_4$ |
| 10th surface | 423.2188 | 0.00000 | $2.83109 \times 10^{-8}$ |
|  | $C_6$ | $C_8$ | $C_{10}$ |
|  | $1.39256 \times 10^{-12}$ | $-1.14067 \times 10^{-16}$ | $1.60286 \times 10^{-22}$ |
|  | $C_{12}$ | $C_{14}$ |  |
|  | 0.00000 | 0.00000 |  |
|  | r | κ | $C_4$ |
| 13th surface | $-142.1914$ | 0.00000 | $6.81342 \times 10^{-8}$ |
|  | $C_6$ | $C_8$ | $C_{10}$ |
|  | $-4.96671 \times 10^{-13}$ | $2.11714 \times 10^{-16}$ | $-9.23870 \times 10^{-22}$ |
|  | $C_{12}$ | $C_{14}$ |  |
|  | $7.74512 \times 10^{-25}$ | 0.00000 |  |
|  | r | κ | $C_4$ |
| 15th surface | 2290.2523 | 0.00000 | $-3.65549 \times 10^{-8}$ |
|  | $C_6$ | $C_8$ | $C_{10}$ |
|  | $3.60552 \times 10^{-12}$ | $-3.34833 \times 10^{-16}$ | $-5.30167 \times 10^{-20}$ |
|  | $C_{12}$ | $C_{14}$ |  |
|  | 0.00000 | 0.00000 |  |
|  | r | κ | $C_4$ |
| 17th surface | 7183.0248 | 0.00000 | $-2.46580 \times 10^{-8}$ |
|  | $C_6$ | $C_8$ | $C_{10}$ |
|  | $1.69228 \times 10^{-12}$ | $1.62175 \times 10^{-16}$ | $-2.27785 \times 10^{-19}$ |
|  | $C_{12}$ | $C_{14}$ |  |
|  | $5.70974 \times 10^{-35}$ | 0.00000 |  |
|  | r | κ | $C_4$ |
| 18th surface | $-951.7953$ | 16.818076 | $8.20688 \times 10^{-9}$ |
| 20th surface | $C_6$ | $C_8$ | $C_{10}$ |
| 22nd surface | $-2.48038 \times 10^{-14}$ | $-8.45982 \times 10^{-19}$ | $8.17477 \times 10^{-23}$ |
|  | $C_{12}$ | $C_{14}$ |  |
|  | $-1.96463 \times 10^{-27}$ | $2.43799 \times 10^{-32}$ |  |

(Values corresponding to the conditional expression)

D = 292.019 mm
R = −951.795 mm
β1 = 0.6083
β2 = 0.4110
(1) D/|R| = 0.3068
(2) |β1/β2| = 1.4799

Figure 7:
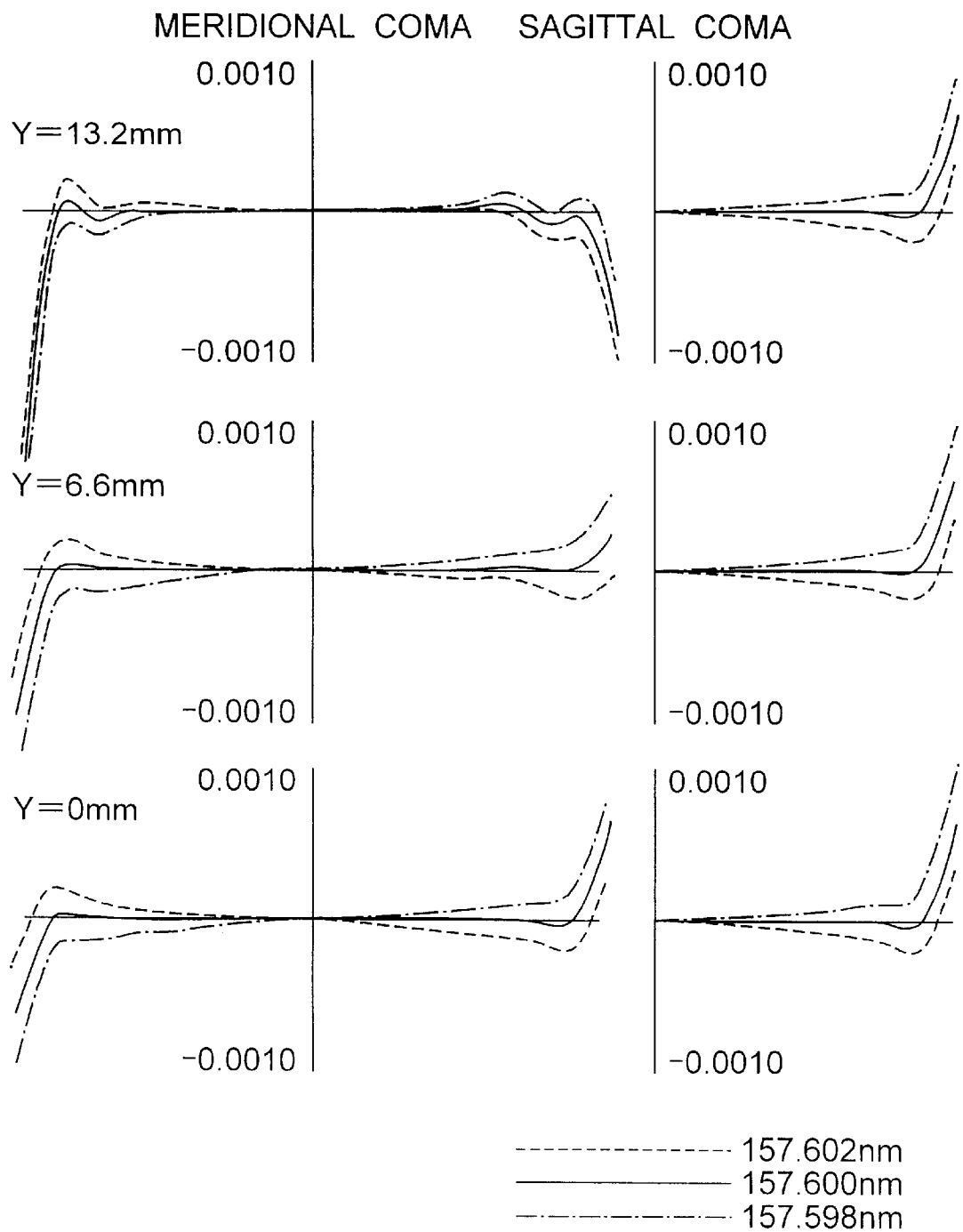
FIG. 7 is a view for showing tranverse aberrations in the third example.

FIG. 7 is a view for showing tranverse aberrations in the third example.

In the aberration view, Y represents the image height, the solid line the central wavelength of 157.6 nm, the broken line the wavelength of 157.6 nm+2 pm=157.602 nm, and the dotted line the wavelength of 157.6 nm−2 pm=157.598 nm.

As clearly seen from the aberration view, in the third example, the chromatic aberration is satisfactorily corrected for the exposure light having the wavelength width of 157.6 nm±2 pm. In addition, it is confirmed, though omitted in the drawing, that other aberrations including the spherical aberration, astigmatism, and distortion are also satisfactorily corrected.

As described above, in the catadioptric imaging system of the third example, it is possible to securely obtain the numerical aperture of 0.75 on the image side without enlarging the size of the maim mirror M1 with the lenses in a small number with respect to the $F_2$ laser beam having the central wavelength of 157.6 nm, and to securely obtain an image circle of 26.4 mm on the wafer. As a result, when the catadioptric imaging system of the third example is applied to a projection exposure apparatus, it is possible to achieve a high resolution of not more than 0.1 μm. Also, it is possible to set the exposure area in a rectangular form of, for example, 25 mm×8 mm, and to transfer a mask pattern onto an area of 25 mm×33 mm by one scanning exposure. It is also possible to conduct the stitching exposure by performing scanning exposures a plurality of times, like in the first and second examples.

FOURTH EXAMPLE

Figure 8:
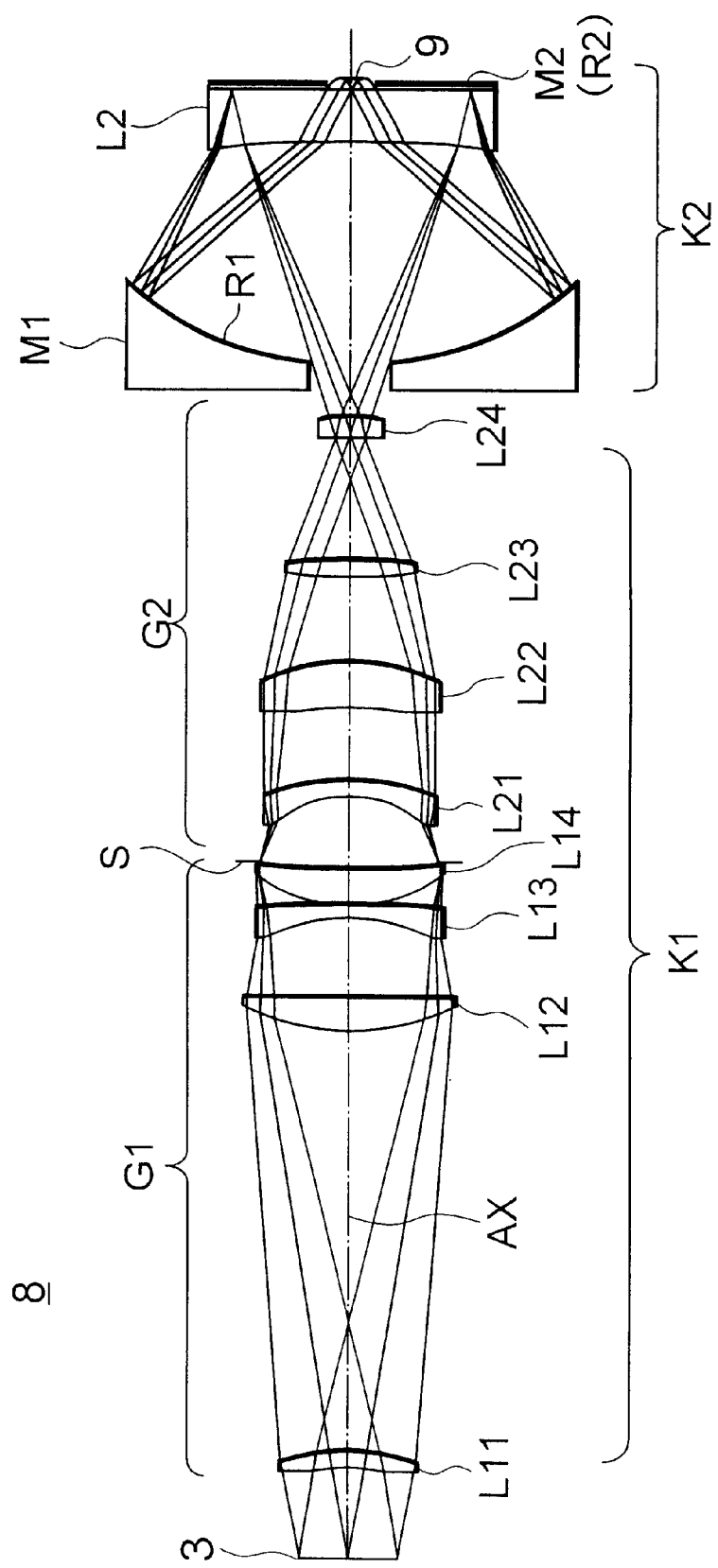
FIG. 8 is a view for showing a lens structure of a catadioptric imaging system (projection optical system) according to a fourth example.

FIG. 8 is a view for showing a lens structure of a catadioptric imaging system (projection optical system) according to a fourth example. In the fourth example, like in the third example, the present invention is applied to a projection optical system in which the aberrations including the chromatic aberration are corrected for the exposure light having the wavelength width of 157.6 nm±2 pm.

In the catadioptric imaging system of FIG. 8, the first lens group G1 is comprised of a positive meniscus lens L11 having the aspherical concave surface facing the mask side, a positive meniscus lens L12 having the aspherical convex surface facing the mask side, a negative meniscus lens L13 having the aspherical concave surface facing the mask side, and a positive meniscus lens L14 having the aspherical convex surface facing the mask side, in this order from the mask side.

Also, the second lens group G2 is comprised of a negative meniscus lens L21 having the aspherical concave surface facing the mask side, a positive meniscus lens L22 having the aspherical concave surface facing the mask side, a double convex lens L23 having the surface on the mask side formed to be aspherical, and a double convex lens L24 having the surface on the wafer side formed to be aspherical, in this order from the mask side.

Further, the lens component L2 for constituting the refracting portion of the rear surface reflecting mirror (M2, L2) is formed in the shape of a double concave lens having the aspherical concave surface facing the mask side. The reflecting surface R2 of the secondary mirror M2 is formed to have the convex surface facing the mask side.

The following Table 4 shows values for specifications of the catadioptric imaging system of the fourth example.

In the Table 4, λ represents the central wavelength of the exposure light, β represents a projection magnification, NA represents the numerical aperture on the image side, and φ represents the diameter of an image circle on the wafer, respectively. A plane number indicates the order of a plane from the mask side along a direction of propagation of the beam from the mask plane serving as an object plane to the wafer plane, r represents the radius of curvature of each surface (the radius of curvature at the apex in an aspherical surface: mm), d represents the distance on the axis between each adjacent surfaces or a surface distance (mm), and n represents the refractive index with respect to the central wavelength, respectively.

Note that the sign of the surface distance d is to be changed for each reflection. Therefore, the sign of the surface distance d is negative in an optical path from the rear surface reflecting surface R2 to the front surface reflecting surface R1, and positive in other optical paths. Then, the radius of curvature of the convex surfaces toward the mask side is arranged to be positive, and the radius of curvature of the concave surfaces is to be negative, irrespective of the incident direction of the light ray.

TABLE 4

(Main specifications)

$\lambda$ = 157.6 nm
$\beta$ = 0.2500
NA = 0.75
$\phi$ = 26.4 mm (Optical member specifications)

| Surface No. | r | d | n | |
|---|---|---|---|---|
| | (Mask plane) | 90.0000 | | |
| 1* | −1040.1889 | 16.8787 | 1.5600000 | (Lens L11) |
| 2 | −284.5252 | 441.0860 | | |
| 3* | 248.9993 | 31.6042 | 1.5600000 | (Lens L12) |
| 4 | 1868.1161 | 86.0264 | | |
| 5* | −256.4757 | 15.0000 | 1.5600000 | (Lens L13) |
| 6 | −1079.5886 | 1.0001 | | |
| 7* | 160.4237 | 39.0505 | 1.5600000 | (Lens L14) |
| 8 | 1268.4783 | 3.7000 | | |
| 9 | ∞ | 70.0471 | | (Aperture stop S) |
| 10* | −129.2757 | 15.0000 | 1.5600000 | (Lens L21) |
| 11 | −277.5549 | 78.6066 | | |
| 12* | −1494.7189 | 45.0000 | 1.5600000 | (Lens L22) |
| 13 | −238.2212 | 91.8347 | | |
| 14* | 365.9254 | 18.9298 | 1.5600000 | (Lens L23) |
| 15 | −701.6534 | 129.1513 | | |
| 16 | 4243.7172 | 16.9695 | 1.5600000 | (Lens L24) |
| 17* | −216.4772 | 290.1728 | | |
| 18* | −2125.3388 | 59.9425 | 1.5600000 | (Lens component L2) |
| 19 | 5996.9618 | −59.9425 | 1.5600000 | (Rear surface reflecting surface R2) |
| 20* | −2125.3388 | −230.3293 | | |
| 21 | 350.1412 | 230.3293 | | (Front surface reflecting surface R1) |
| 22* | −2125.3388 | 59.9425 | 1.5600000 | (Lens component L2) |
| 23 | 5996.9618 | 10.0000 | | |
| | (Wafer plane) | | | |

(aspherical data)

| | r | $\kappa$ | $C_4$ | $C_6$ | $C_8$ | $C_{10}$ | $C_{12}$ | $C_{14}$ |
|---|---|---|---|---|---|---|---|---|
| 1st surface | −1040.1889 | 0.00000 | $8.50114 \times 10^{-9}$ | $9.40854 \times 10^{-14}$ | $3.85092 \times 10^{-18}$ | $-5.46679 \times 10^{-22}$ | 0.00000 | 0.00000 |
| 3rd surface | 248.9993 | 0.00000 | $-1.42904 \times 10^{-10}$ | $6.60616 \times 10^{-14}$ | $3.65786 \times 10^{-18}$ | $-1.09842 \times 10^{-22}$ | $4.97484 \times 10^{-27}$ | 0.00000 |
| 5th surface | −256.4757 | 0.00000 | $5.80903 \times 10^{-9}$ | $1.21604 \times 10^{-13}$ | $1.20391 \times 10^{-17}$ | $1.45440 \times 10^{-22}$ | $6.87071 \times 10^{-27}$ | 0.00000 |
| 7th surface | 160.4237 | 0.00000 | $-6.83384 \times 10^{-9}$ | $5.93636 \times 10^{-13}$ | $6.46685 \times 10^{-18}$ | $5.93586 \times 10^{-22}$ | $9.08641 \times 10^{-26}$ | 0.00000 |
| 10th surface | −129.2757 | 0.00000 | $-1.19158 \times 10^{-8}$ | $5.20234 \times 10^{-12}$ | $1.68410 \times 10^{-16}$ | $6.16591 \times 10^{-21}$ | $-3.28458 \times 10^{-25}$ | 0.00000 |
| 12th surface | −1494.7189 | 0.00000 | $3.04547 \times 10^{-8}$ | $-2.21766 \times 10^{-12}$ | $1.10527 \times 10^{-16}$ | $-3.25713 \times 10^{-21}$ | $1.29445 \times 10^{-25}$ | 0.00000 |
| 14th surface | 365.9254 | 0.00000 | $-3.76800 \times 10^{-8}$ | $1.05958 \times 10^{-13}$ | $-2.08225 \times 10^{-17}$ | $1.53887 \times 10^{-21}$ | $-1.62147 \times 10^{-25}$ | 0.00000 |
| 17th surface | −216.4772 | 0.00000 | $1.07160 \times 10^{-8}$ | $-1.20868 \times 10^{-13}$ | $-2.81385 \times 10^{-18}$ | $2.81683 \times 10^{-21}$ | 0.00000 | 0.00000 |
| 18th surface 20th surface 22nd surface | −2125.3388 | 91.723346 | $5.77862 \times 10^{-10}$ | $2.56941 \times 10^{-14}$ | $1.81191 \times 10^{-18}$ | $4.17947 \times 10^{-23}$ | $1.10317 \times 10^{-27}$ | $1.11337 \times 10^{-32}$ |

(Values corresponding to the conditional expression)

D = 290.300
R = −2125.339 mm
$\beta 1$ = 0.5350
$\beta 2$ = 0.4673
(1) D/|R| = 0.1366
(2) |$\beta 1/\beta 2$| = 1.1449

Figure 9:
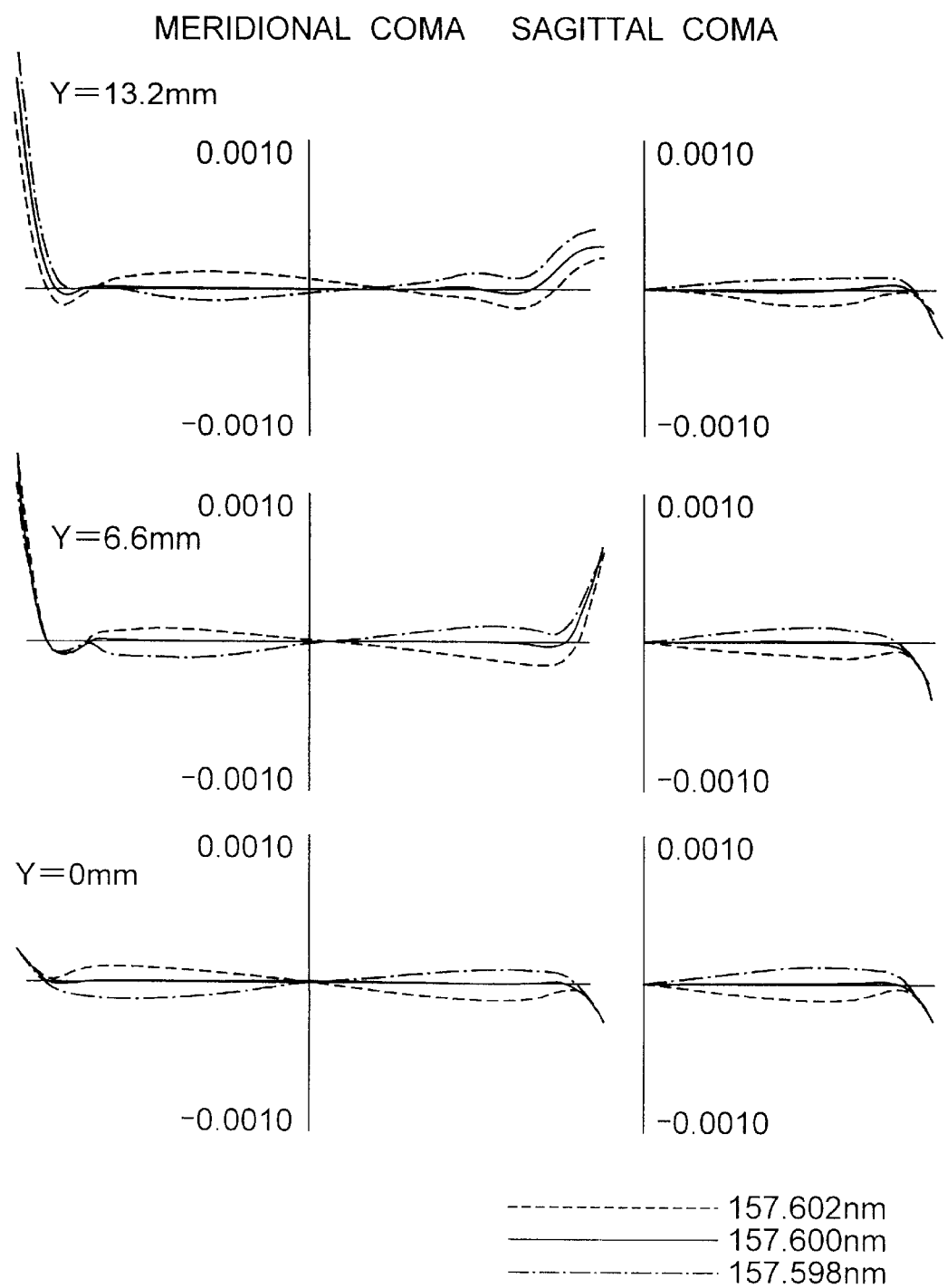
FIG. 9 is a view for showing tranverse aberrations in the fourth example.

FIG. 9 is a view for showing tranverse aberrations in the fourth example.

In the aberration view, Y represents the image height, the solid line the central wavelength of 157.6 nm, the broken line the wavelength of 157.6 nm+2 pm=157.602 nm, and the dotted line the wavelength of 157.6 nm−2 pm=157.598 nm.

As clearly seen from the aberration view, in the fourth example, like in the third example, the chromatic aberration is satisfactorily corrected for the exposure light having the wavelength width of 157.6 nm±2 pm. In addition, it is confirmed, though omitted in the drawing, that other aberrations including the spherical aberration, astigmatism, and distortion are also satisfactorily corrected.

As described above, in the catadioptric imaging system of the fourth example, like in the third example, it is possible to securely obtain the numerical aperture of 0.75 on the image side without enlarging the size of the maim mirror M1 with the lenses in a small number with respect to the $F_2$ laser beam having the central wavelength of 157.6 nm, and to securely obtain an image circle of 26.4 mm on the wafer. As a result, when the catadioptric imaging system of the fourth example is applied to a projection exposure apparatus, it is possible to achieve a high resolution of not more than 0.1 $\mu$m. Also, like in the third example, it is possible to set the exposure area in a rectangular form of, for example, 25 mm×8 mm, and to transfer a mask pattern onto an area of 25 mm×33 mm by one scanning exposure. It is also possible to conduct the stitching exposure by performing scanning exposures a plurality of times, like in the first and second examples.

Second Embodiment

A catadioptric imaging system according to a second embodiment of the present invention will be described in the following.

The entire structure of a projection exposure apparatus which is provided with the catadioptric imaging system according to the second embodiment is the same as that shown in FIG. 1, and the description on the first embodiment can be referred here as it is. Thus, redundant explanation will be omitted here.

Description will be made on a projection optical system 8 comprising a catadioptric imaging system according to the present embodiment, with reference to FIGS. 10 and 12 which are corresponding to the examples to be specifically described below. The projection optical system 8 is comprised of a first imaging optical system K1 for forming a primary image (intermediate image) of a pattern of the mask 3, and a second imaging optical system K2 for forming a secondary image of the mask pattern with reduction magnification on the wafer 9 serving as a photosensitive substrate, based on the light from the primary image. The first imaging optical system K1 is comprised of a first lens group G1 having the positive refracting power, an aperture stop S, and a second lens group G2 having the positive refracting power, in this order from the mask side.

The second imaging optical system K2 is comprised of a primary mirror M1 having a front surface reflecting surface R1 with its concave surface toward the wafer and an opening (a radiation transmitting portion) at the center thereof, a lens component L2, and a secondary mirror M2 which is provided with a reflecting surface R2 having an opening (a radiation transmitting portion) at the center thereof.

All the optical elements (G1, G2, M1, M2, and L2) for constituting the projection optical system 8 are disposed along the single optical axis AX. Also, the primary mirror M1 is disposed in the vicinity of the forming position of the primary image I, and the secondary mirror M2 is in approximation to the wafer 9.

Thus, according to the present embodiment, the light from the pattern of the mask 3 passes through the first imaging optical system K1 to form the primary image (intermediate image) of the mask pattern. The light from the primary image passes through the central opening of the maim mirror M1 and the lens component L2 and is reflected by the secondary mirror M2, and the light reflected by the secondary mirror M2 passes through the lens component L2 and is reflected by the primary mirror M1. The light reflected by the primary mirror M1 passes through the lens component L2 and the central opening of the secondary mirror 2 to form the secondary image of the mask pattern on the wafer 9 with reduction magnification.

According to the present embodiment, fluorite ($CaF_2$ crystal) is employed for all of the refracting optical members (lens components) for constituting the projection optical system 8. The central oscillating wavelength of the $F_2$ laser beam serving as the exposure light is set to be 157.6 nm, and the refractive index of $CaF_2$ around the wavelength of 157.6 nm changes at the rate of $-2.4 \times 10^{-6}$ for every change of +1 pm in the wavelength, and at the rate of $+2.4 \times 10^{-6}$ per every change of −1 pm in the wavelength.

Accordingly, the refractive index of the $CaF_2$ for the central wavelength 157.6 nm is 1.5600000. Then, in each of the examples, the refractive index of the $CaF_2$ for 157.6 nm+10 pm=157.61 nm is 1.5599760, and the refractive index of the $CaF_2$ for 157.6 nm−10 pm=157.59 nm is 1.5600240.

In each of the examples to be described later, an aspherical surface is expressed by the numerical formula (a) which has already described in the first embodiment. Note that in each of the following examples, a lens surface formed to be aspherical is accompanied by the mark * on the right side of the plane number thereof.

FIFTH EXAMPLE

Figure 10:
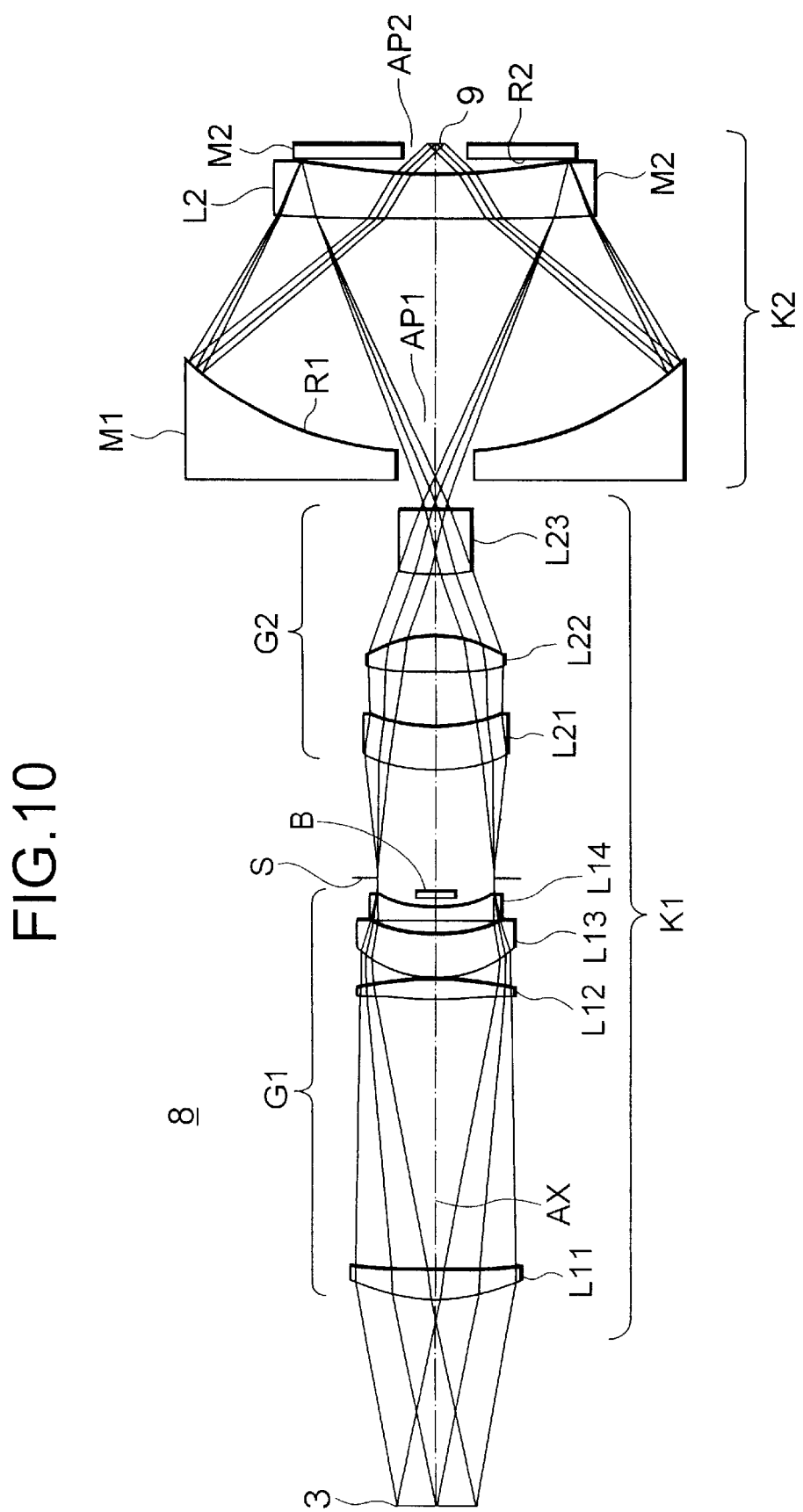
FIG. 10 is a view for showing a lens structure of a fifth example embodying a catadioptric imaging system (projection optical system) according to a second embodiment of the present invention.

FIG. 10 is a view for showing a lens structure of a catadioptric imaging system (projection optical system) according to a fifth example. In the fifth example, the present invention is applied to a projection optical system in which the aberrations including the chromatic aberration are corrected for the exposure light having the wavelength width of 157.6 nm±10 pm. The catadioptric imaging system of FIG. 10 comprises a first imaging optical system K1 of dioptric type for forming an intermediate image of the mask 3, and a second imaging optical system K2 of catadioptric type for forming the final image of the mask 3 on the basis of the light from the intermediate image on the wafer 9 with reduction magnification. The first imaging optical system K1 comprises a first lens group G1 of the positive refracting power, an aperture stop S, and a second lens group G2 of the positive refracting power, in this order from the mask 3, while the second imaging optical system K2 comprises a primary mirror M1 consisting of a first reflecting surface R1 of the negative refracting power having a first radiation transmitting portion AP1 at the center thereof, a secondary mirror M2 consisting of a second reflecting surface R2 having a second radiation transmitting portion AP2 at the center thereof, and a lens component L2 separated from the first reflecting surface R1 and the second reflecting surface R2 and having a refracting surface with the concave surface facing the wafer side.

The first lens group G1 comprises a meniscus lens L11 having the aspherical convex surface facing the mask side, a double convex lens L12 having the aspherical convex surface facing the mask side, a meniscus lens L13 having the aspherical concave surface facing the wafer side, and a meniscus lens L14 having the aspherical convex surface facing the mask side, in this order from the mask side.

Also, the second lens group G2 is comprised of a meniscus lens L21 having the aspherical convex surface facing the mask side, a double convex lens L22 having the aspherical convex surface facing the wafer side, and a meniscus lens L23 having the aspherical concave surface facing the wafer side, in this order from the mask side.

Further, the second imaging optical system K2 includes a negative meniscus lens L2 having the aspherical concave surface facing the wafer side.

Also, the first imaging optical system K1 comprises a central shielding member B which is disposed at a position different from the aperture stop S in the direction of the optical axis AX for shielding light in the vicinity of the optical axis AX.

In such a structure, the light from the first imaging optical system K1 passes through the first radiation transmitting portion AP1 and the lens component L2 to be reflected by the second reflecting surface R2, the light reflected by the second reflecting surface R2 passes through the lens component L2 and is reflected by the first reflecting surface R1, and the light reflected by the first reflecting surface R1 passes through the lens component L2 and the second radiation transmitting portion AP2 of the secondary mirror M2 to form the final image on the wafer 9.

The following Table 5 shows values for specifications of the catadioptric imaging system of the fifth example.

In the Table 5, $\lambda$ represents the central wavelength of the exposure light, $\beta$ represents a projection magnification, NA represents the numerical aperture on the image side, and $\phi$ represents the diameter of an image circle on the wafer, respectively. A plane number indicates the order of a plane from the mask side along a direction of propagation of the beam from the mask plane serving as an object plane to the wafer plane, r represents the radius of curvature of each surface (the radius of curvature at the apex in an aspherical surface: mm), d represents the distance on the axis between each adjacent surfaces or a surface distance (mm), and n represents the refractive index with respect to the central wavelength ($\lambda$=157.6 nm), respectively.

Note that the sign of the surface distance d is to be changed for each reflection. Therefore, the sign of the surface distance d is negative in an optical path from the reflecting surface R2 to the reflecting surface R1, and positive in other optical paths. Then, the radius of curvature of the convex surfaces toward the mask side is arranged to be positive, and the radius of curvature of the concave surfaced is to be negative, irrespective of the incident direction of the light ray. In this respect, the referential numerals and symbols which are the same as those in the fifth example are used in the following sixth example.

TABLE 5

(Main specifications)

$\lambda$ = 157.6 nm ± 10 pm
$\beta$ = 0.2500
NA = 0.75
$\phi$ = 16.4 mm
$\Delta n/\Delta\lambda$ = 2.4 × 10$^{-6}$ ($\Delta\lambda$ = 1 pm)

| Surface No. | r | d | n |
|---|---|---|---|
| 1* | 169.7986 | 25.120 | 1.5600000 |
| 2 | 828.2434 | 248.638 | |
| 3* | 419.3057 | 17.377 | 1.5600000 |
| 4 | −358.6668 | 1.000 | |
| 5 | 99.9661 | 38.596 | 1.5600000 |
| 6* | 141.0006 | 11.462 | |
| 7* | 64162.6646 | 15.000 | 1.5600000 |
| 8 | 156.1861 | 10.033 | |
| 9 | 0.0000 | 115.356 | (Aperture stop) |
| 10* | 126.7181 | 39.667 | 1.5600000 |
| 11 | 140.6882 | 48.857 | |
| 12 | 360.0217 | 32.301 | 1.5600000 |
| 13* | −111.1630 | 60.049 | |
| 14 | 168.2754 | 60.000 | 1.5600000 |
| 15* | 188.7785 | 14.271 | |
| 16 | 0.0000 | 253.659 | |
| 17 | 1763.6223 | 39.730 | 1.5600000 |
| 18* | 604.2607 | 12.936 | |
| 19 | 0.0000 | −12.936 | |
| 20* | 604.2607 | −39.730 | 1.5600000 |
| 21 | 1763.6223 | −213.659 | |
| 22 | 341.6710 | 213.659 | |
| 23 | 1763.6226 | 39.730 | 1.5600000 |
| 24* | 604.2607 | 25.936 | |

(aspherical data)

| | r | κ | $C_4$ | $C_6$ | $C_8$ | $C_{10}$ | $C_{12}$ | $C_{14}$ |
|---|---|---|---|---|---|---|---|---|
| 1st surface | 169.7986 | 0.00000 | −1.77640 × 10$^{-8}$ | −3.15876 × 10$^{-13}$ | −4.58542 × 10$^{-18}$ | −4.33089 × 10$^{-22}$ | 0.00000 | 0.00000 |
| 3rd surface | 419.3057 | 0.00000 | −2.26166 × 10$^{-7}$ | 6.74494 × 10$^{-13}$ | 2.78902 × 10$^{-16}$ | −8.28386 × 10$^{-21}$ | −1.96187 × 10$^{-26}$ | 0.00000 |
| 6th surface | 141.0006 | 0.00000 | −1.79523 × 10$^{-7}$ | 3.36890 × 10$^{-11}$ | 2.84625 × 10$^{-15}$ | −3.81299 × 10$^{-19}$ | 4.94390 × 10$^{-23}$ | 0.00000 |
| 7th surface | 64162.6646 | 0.00000 | 1.11972 × 10$^{-7}$ | −5.67876 × 10$^{-12}$ | 4.12815 × 10$^{-16}$ | 5.65399 × 10$^{-20}$ | −2.14735 × 10$^{-23}$ | 0.00000 |
| 10th | 126.7181 | 0.00000 | −5.63527 × 10$^{-8}$ | 3.24172 × 10$^{-13}$ | −5.77177 × 10$^{-17}$ | 5.45422 × 10$^{-21}$ | 0.00000 | 0.00000 |

TABLE 5-continued

| surface | | | | | | | | |
|---|---|---|---|---|---|---|---|---|
| 13th surface | −111.1630 | 0.00000 | $1.28904 \times 10^{-7}$ | $2.37711 \times 10^{-12}$ | $3.46806 \times 10^{-16}$ | $-1.34551 \times 10^{-22}$ | $2.44040 \times 10^{-24}$ | 0.00000 |
| 15th surface | 188.7785 | 0.00000 | $-5.43671 \times 10^{-8}$ | $4.63484 \times 10^{-12}$ | $1.53536 \times 10^{-14}$ | $-1.26491 \times 10^{-17}$ | 0.00000 | 0.00000 |
| 18th 20th surface 24th surface | 604.2607 | 0.00000 | $-9.80093 \times 10^{-9}$ | $1.49563 \times 10^{-14}$ | $9.52668 \times 10^{-18}$ | $5.35859 \times 10^{-22}$ | $1.52780 \times 10^{-26}$ | $1.91921 \times 10^{-31}$ |

(Values corresponding to the conditional expression)

(3) $f1/d1 = -64.0760$
(4) $|\beta 1/\beta 2| = 1.5271$

FIG. 11 is a view for showing tranverse aberrations in the fifth example.

In the aberration view, Y represents the image height, the solid line the central wavelength of 157.6 nm, the broken line the wavelength of 157.6 nm+10 pm=157.61 nm, and the dotted line the wavelength of 157.6 nm−10 pm=157.59 nm. As clearly seen from the aberration view, in the fifth example, the chromatic aberration is satisfactorily corrected for the exposure light having the wavelength width of 157.6 nm±10 pm. In addition, it is confirmed, though omitted in the drawing, that other aberrations including the spherical aberration, astigmatism, and distortion are satisfactorily corrected.

As described above, in the catadioptric imaging system of the fifth example, it is possible to securely obtain the numerical aperture of 0.75 on the image side without enlarging the size of the maim mirror M1 with the lenses in a small number with respect to the $F_2$ laser beam having the central wavelength of 157.6 nm, and to securely obtain an image circle of 16.4 mm on the wafer. As a result, when the catadioptric imaging system of the fifth example is applied to a projection exposure apparatus, it is possible to achieve a high resolution of not more than 0.1 μm. In the fifth example, it is possible to set the exposure area in a rectangular form of 15 mm×6 mm within the image circle having the diameter of 16.4 mm. Here, it is possible to transfer a mask pattern onto an area of, for example, 30 mm×40 mm by conducting the stitching exposure by employing scanning exposure two times.

SIXTH EXAMPLE

Figure 12:
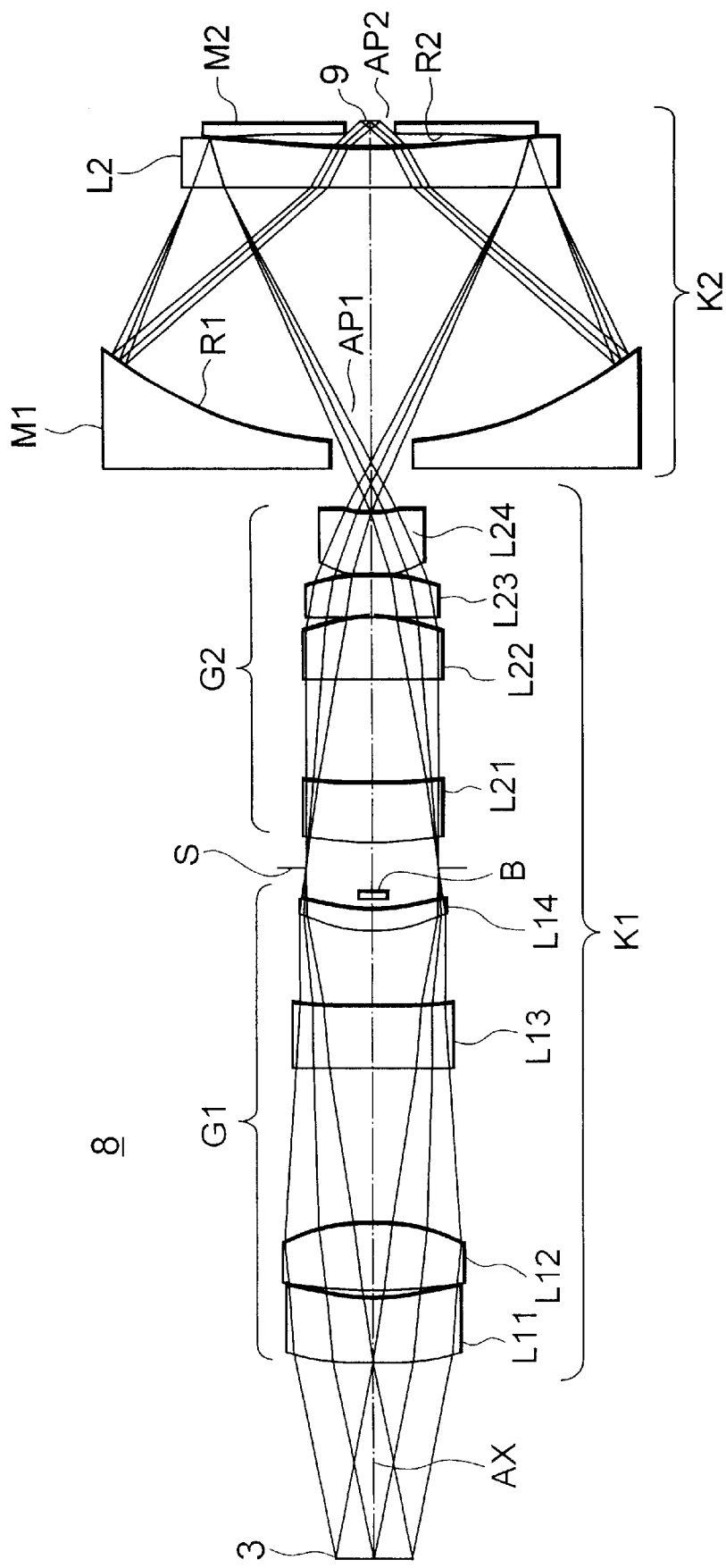
FIG. 12 is a view for showing a lens structure of a catadioptric imaging system (projection optical system) according to a sixth embodiment which is modified from the fifth embodiment.

FIG. 12 is a view for showing a lens structure of a catadioptric imaging system (projection optical system) according to a sixth example. In the sixth example, like in the fifth example, the present invention is applied to a projection optical system in which the aberrations including the chromatic aberration are corrected for the exposure light having the wavelength width of 157.6 nm±10 pm.

The catadioptric imaging system of FIG. 12 comprises a first imaging optical system K1 of dioptric type for forming an intermediate image of the mask 3, and a second imaging optical system K2 of catadioptric type for forming the final image of the mask 3 on the basis of the light from the intermediate image on the wafer 9 with reduction magnification. The first imaging optical system K1 comprises a first lens group G1 of the positive refracting power, an aperture stop S, and a second lens group G2 of the positive refracting power, in this order from the mask 3, while the second imaging optical system K2 comprises a primary mirror M1 consisting of a first reflecting surface R1 of the negative refracting power having a first radiation transmitting portion AP1 at the center thereof, a secondary mirror M2 consisting of a second reflecting surface R2 having a second radiation transmitting portion AP2 at the center thereof, and a lens component L2 separated from the first reflecting surface R1 and the second reflecting surface R2 and having a refracting surface with the concave surface facing the wafer side.

The first lens group G1 comprises a meniscus lens L11 having the aspherical convex surface facing the mask side, a double convex lens L12 having the aspherical convex surface facing the mask side, a meniscus lens L13 having the aspherical concave surface facing the wafer side, and a meniscus lens L14 having the aspherical convex surface facing the mask side, in this order from the mask side.

Also, the second lens group G2 is comprised of a meniscus lens L21 having the aspherical convex surface facing the mask side, a double convex lens L22 having the aspherical convex surface facing the wafer side, a meniscus lens L23 having the aspherical convex surface facing the wafer side, and a meniscus lens L24 having the aspherical concave surface facing the wafer side, in this order from the mask side. Further, the second imaging optical system K2 includes a negative meniscus lens L2 having the aspherical concave surface facing the wafer side.

Also, the first imaging optical system K1 comprises a central shielding member B which is disposed at a position different from the aperture stop S in the direction of the optical axis AX for shielding light in the vicinity of the optical axis AX.

In such a structure, the light from the first imaging optical system K1 passes through the first radiation transmitting portion AP1 of the primary mirror M1 and the lens component L2 to be reflected by the second reflecting surface R2, the light reflected by the second reflecting surface R2 passes through the lens component L2 and is reflected by the lens component L1 and is reflected by the first reflecting surface R1, and the light reflected by the first reflecting surface R1 passes through the lens component L2 and the second radiation transmitting portion AP2 of the secondary mirror M2 to form the final image on the wafer 9.

The following Table 6 shows values for specifications of the catadioptric imaging system of the sixth example.

TABLE 6

(Main specifications)

$\lambda$ = 157.6 nm ± 10 pm
$\beta$ = 0.2500
NA = 0.75
$\phi$ = 16.4 mm
$\Delta n/\Delta\lambda$ = 2.4 × 10$^{-6}$ ($\Delta\lambda$ = 1 pm)

| Surface No. | r | d | n |
|---|---|---|---|
| 1* | 412.2670 | 55.000 | 1.5600000 |
| 2 | 278.2710 | 4.037 | |
| 3* | 351.6360 | 55.000 | 1.5600000 |
| 4 | −196.4722 | 128.641 | |
| 5 | 1852.9256 | 55.000 | 1.5600000 |
| 6* | 737.1318 | 64.319 | |
| 7* | 115.3693 | 20.000 | 1.5600000 |
| 8 | 195.0739 | 9.315 | |
| 9 | 0.0000 | 47.118 | (Aperture stop) |
| 10* | 176.4495 | 49.110 | 1.5600000 |
| 11 | 471.5455 | 87.737 | |
| 12 | 962.6665 | 52.276 | 1.5600000 |
| 13* | −200.4321 | 2.246 | |
| 14 | −2276.0089 | 35.813 | 1.5600000 |
| 15* | −117.9540 | 1.000 | |
| 16 | 95.8649 | 52.621 | |
| 17* | 59.4260 | 21.926 | 1.5600000 |
| 18 | 0.000 | 249.860 | |
| 19 | 4745.5417 | 35.000 | |
| 20* | 1103.5766 | 13.736 | 1.5600000 |
| 21 | −1937.5263 | −13.736 | |
| 22* | 1103.5766 | −35.000 | 1.5600000 |
| 23 | 4745.5417 | −209.860 | |
| 24 | 353.9951 | 209.860 | |
| 25 | 4745.5417 | 35.000 | 1.5600000 |
| 26* | 1103.5766 | 23.736 | |

(aspherical data)

| | r | κ | $C_4$ | $C_6$ | $C_8$ | $C_{10}$ | $C_{12}$ | $C_{14}$ |
|---|---|---|---|---|---|---|---|---|
| 1st surface | 412.2670 | 0.00000 | 3.27122 × 10$^{-8}$ | −1.25498 × 10$^{-12}$ | 1.61545 × 10$^{-18}$ | 9.57506 × 10$^{-22}$ | 0.00000 | 0.00000 |
| 3rd surface | 351.6360 | 0.00000 | −5.65486 × 10$^{-8}$ | 5.36737 × 10$^{-13}$ | 2.99175 × 10$^{-17}$ | −1.10610 × 10$^{-21}$ | 5.74319 × 10$^{-26}$ | 0.00000 |
| 6th surface | 737.1318 | 0.00000 | 1.01578 × 10$^{-7}$ | −3.89894 × 10$^{-12}$ | 1.30511 × 10$^{-16}$ | 3.97806 × 10$^{-21}$ | −1.68419 × 10$^{-24}$ | 0.00000 |
| 7th surface | 115.3693 | 0.00000 | −4.36213 × 10$^{-8}$ | −9.63479 × 10$^{-12}$ | −3.88721 × 10$^{-16}$ | 2.56221 × 10$^{-20}$ | −8.85379 × 10$^{-24}$ | 0.00000 |
| 10th surface | 176.4495 | 0.00000 | −1.13559 × 10$^{-7}$ | −3.09916 × 10$^{-12}$ | −2.68461 × 10$^{-16}$ | −4.57597 × 10$^{-20}$ | 0.00000 | 0.00000 |
| 13th surface | −200.4321 | 0.00000 | −1.82574 × 10$^{-7}$ | −1.23744 × 10$^{-11}$ | 2.29903 × 10$^{-15}$ | .45553 × 10$^{-19}$ | −1.80396 × 10$^{-23}$ | −2.73373 × 10$^{-27}$ |
| 15th surface | −117.9540 | 0.00000 | 5.37993 × 10$^{-7}$ | −3.74964 × 10$^{-11}$ | 1.14000 × 10$^{-14}$ | −2.61321 × 10$^{-18}$ | 2.78112 × 10$^{-22}$ | 0.00000 |
| 17th surface | 59.4260 | 0.00000 | −1.04755 × 10$^{-6}$ | 1.86438 × 10$^{-10}$ | −7.77809 × 10$^{-14}$ | −7.29218 × 10$^{-17}$ | 0.00000 | 0.00000 |
| 20th surface | 1103.5766 | 0.00000 | −2.23719 × 10$^{-9}$ | −5.41768 × 10$^{-17}$ | −5.34948 × 10$^{-21}$ | 1.98586 × 10$^{-23}$ | −8.17492 × 10$^{-28}$ | 1.14608 × 10$^{-32}$ |
| 22nd surface | | | | | | | | |
| 26th surface | | | | | | | | |

(Values corresponding to the conditional expression)

(3) f1/d1 = −108.5570
(4) |β1/β2| = 1.0521

FIG. 13 is a view for showing tranverse aberrations in the sixth example. In the aberration view, Y represents the image height, the solid line the central wavelength of 157.6 nm, the broken line the wavelength of 157.6 nm+10 pm=157.61 nm, and the dotted line the wavelength of 157.6 nm−10 pm=157.59 nm. As clearly seen from the aberration view, in the sixth example, the chromatic aberration is satisfactorily corrected for the exposure light having the wavelength width of 157.6 nm+10 pm. In addition, it is confirmed, though omitted in the drawing, that other aberrations including the spherical aberration, astigmatism, and distortion are satisfactorily corrected.

As described above, in the catadioptric imaging system of the sixth example, it is possible to securely obtain the numerical aperture of 0.75 on the image side without enlarging the size of the maim mirror M1 with the lenses in a small number with respect to the $F_2$ laser beam having the central wavelength of 157.6 nm, and to securely obtain an image circle of 16.4 mm on the wafer. As a result, when the catadioptric imaging system of the sixth example is applied to a projection exposure apparatus, it is possible to achieve a high resolution of not more than 0.1 $\mu$m. In the sixth example, it is possible to set the exposure area in a rectangular form of 15 mm×6 mm within the image circle having the diameter of 16.4 mm. Here, it is possible to transfer a mask pattern onto an area of, for example, 30 mm×40 mm by conducting the stitching exposure by employing scanning exposure two times.

Third Embodiment

A catadioptric imaging system according to a third embodiment of the present invention will be described in the following.

The entire structure of a projection exposure apparatus which is provided with the catadioptric imaging system according to the third embodiment is the same as that shown in FIG. 1, and the description on the first embodiment can be referred here as it is. Thus, redundant explanation will be omitted here.

Description will be made on the projection optical system 8 consisting of a catadioptric imaging system according to the present embodiment, with reference to FIGS. 14, 16 and 18 which are corresponding to the examples to be specifically described below. The projection optical system 8 is comprised of a first imaging optical system K1 for forming a primary image (intermediate image) of a pattern of the mask 3, a second imaging optical system K2 for forming a secondary image (final image) of the mask pattern with reduction magnification on the wafer 9 serving as a photosensitive substrate, based on the light from the primary image, and a chromatic aberration correction lens L3 sandwiched by and between the both optical systems K1 and K2 for correcting the chromatic aberration. The first imaging optical system K1 is comprised of a first lens group G1 having the positive refracting power, an aperture stop S, and a second lens group G2 having the positive refracting power, in this order from the mask side.

The second imaging optical system K2 is comprised of a primary mirror M1 having a front surface reflecting surface R1 with its concave surface toward the wafer and an opening (a radiation transmitting portion) at the center thereof, a lens component L3, and a secondary mirror M2 which is provided with a reflecting surface R2 having an opening (a radiation transmitting portion) at the center thereof.

All the optical elements (G1, G2, M1, M2, and L3) for constituting the projection optical system 8 are disposed along the single optical axis AX. Also, the primary mirror M1 is disposed in the vicinity of the forming position of the primary image, and the secondary mirror M2 is in approximation to the wafer 9.

Thus, according to the present embodiment, the light from the pattern of the mask 3 passes through the first imaging optical system K1 to form the primary image (intermediate image) of the mask pattern. The light from the primary image passes through the chromatic aberration correction lens L3, then through the central opening of the maim mirror M1, and is reflected by the secondary mirror M2, and the light reflected by the secondary mirror M2 is reflected by the primary mirror M1. The light reflected by the primary mirror M1 passes through the central opening of the secondary mirror M2 to form the secondary image of the mask pattern on the wafer 9 with reduction magnification.

According to the present embodiment, fluorite ($CaF_2$ crystal) is employed for all of the refracting optical members (lens components) for constituting the projection optical system 8. The central oscillating wavelength of the $F_2$ laser beam serving as the exposure light is set to be 157.6 nm. The refractive index of $CaF_2$ around the wavelength of 157.6 nm and changes thereof are as described in the foregoing embodiments.

In each of the examples to be described later, an aspherical surface is expressed by the numerical formula (a) which has already described in the first embodiment. Note that in each of the following examples, a lens surface formed to be aspherical is accompanied by the mark * on the right side of the plane number thereof.

SEVENTH EXAMPLE

Figure 14:
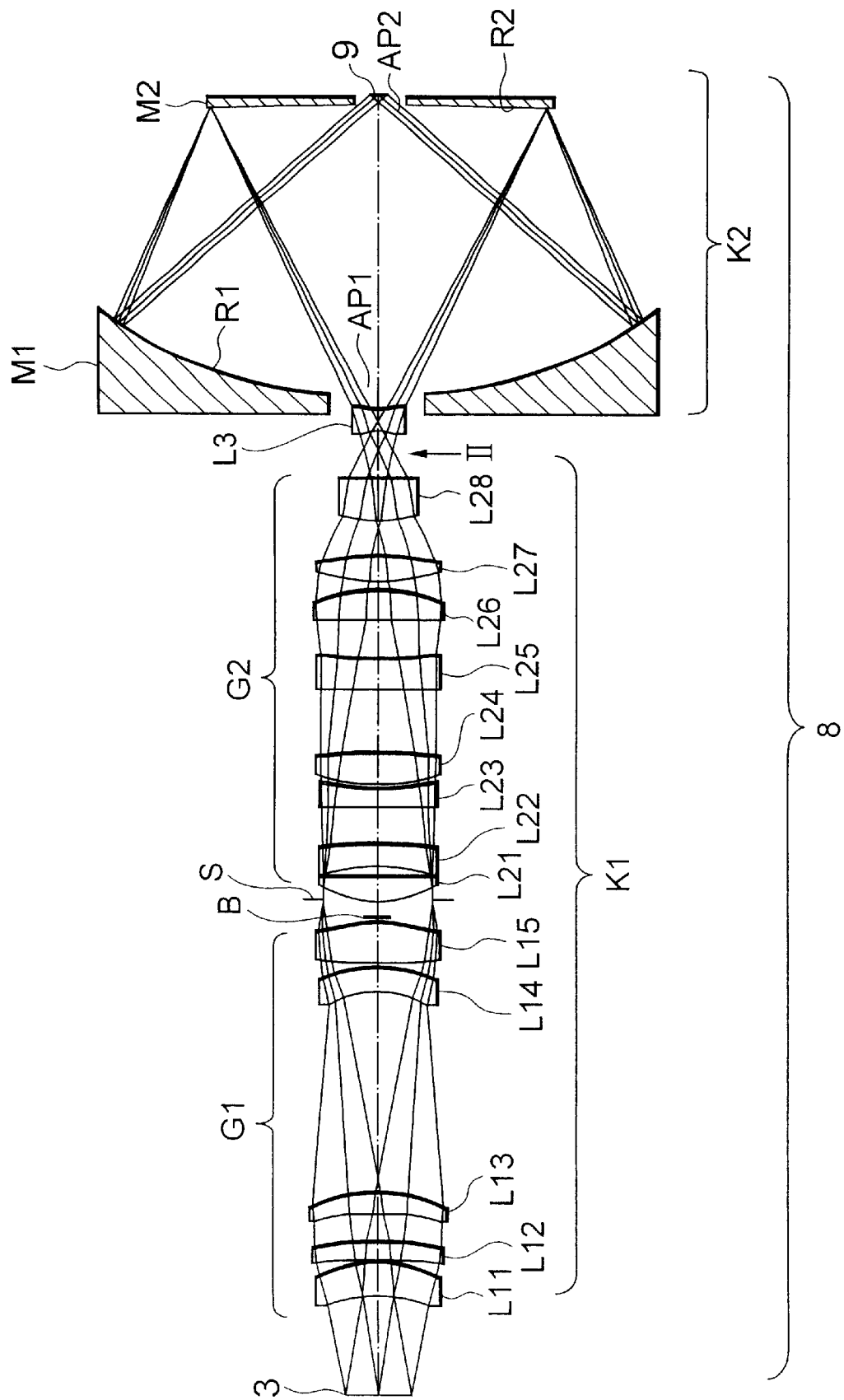
FIG. 14 is a view for showing a lens structure of a seventh example embodying a catadioptric imaging system (projection optical system) according to a third embodiment of the present invention.

FIG. 14 is a view for showing a lens structure of a catadioptric imaging system (projection optical system) according to a seventh example. In the seventh example, the present invention is applied to a projection optical system in which the aberrations including the chromatic aberration are corrected for the exposure light having the wavelength width of 157.624 nm±1 pm. The catadioptric imaging system of FIG. 14 comprises a first imaging optical system K1 of dioptric type for forming an intermediate image II of the mask 3, a second imaging optical system K2 of catadioptric type for forming the final image of the mask 3 on the basis of the light from the intermediate image II on the wafer 9 with reduction magnification, and a chromatic aberration correction lens L3 sandwiched by and between the both optical systems K1 and K2. The first imaging optical system K1 comprises a first lens group G1 of the positive refracting power, an aperture stop S, and a second lens group G2 of the positive refracting power, in this order from the mask 3, while the second imaging optical system K2 comprises a primary mirror M1 consisting of a first reflecting surface R1 of the negative refracting power having a first radiation transmitting portion AP1 at the center thereof, and a secondary mirror M2 consisting of a second reflecting surface R2 having a second radiation transmitting portion AP2 at the center thereof.

The first lens group G1 is comprised of a meniscus lens L11 having the aspherical convex surface facing the wafer side, a meniscus lens L12 in a double spherical form with the convex surface facing the wafer side, a meniscus lens L13 having the aspherical convex surface facing the wafer side, a meniscus lens L14 having the aspherical concave surface facing the mask side, and a double convex lens L15 in a spherical form, in this order from the mask side.

Also, the second lens group G2 is comprised of a double convex lens L21 having the aspherical convex surface facing the mask side, a meniscus lens L22 in a double spherical form having the convex surface facing the wafer side, a meniscus lens L23 having the aspherical convex surface facing the mask side, and a double convex lens L24 having the aspherical convex surface facing the mask side, a meniscus lens L25 having the aspherical concave surface facing the wafer side, a double convex lens L26 in a spherical form, a double convex lens L27 having the aspherical convex surface facing the mask side, and a double convex lens L28 in a spherical form, in this order from the mask side.

The chromatic aberration correction lens L3 which is a double concave lens in a spherical form is disposed at a position behind the position at which, in the rear of the second lens group G2, the intermediate image II is formed and in front of the first radiation transmitting portion AP1 provided in the primary mirror M1.

Also, the first imaging optical system K1 comprises a central shielding member B which is disposed at a position different from the aperture stop S in the direction of the optical axis AX for shielding light in the vicinity of the optical axis AX.

In such a structure, the light from the first imaging optical system K1 passes through the chromatic aberration correction lens L3 and is reflected by the second reflecting surface R2 through the first radiation transmitting portion AP1 of the primary mirror M1. The light reflected by the second reflecting surface R2 is reflected by the first reflecting surface R1, and the light reflected by the first reflecting surface R1 passes through the second radiation transmitting portion AP2 of the secondary mirror M2 to form the final image on the wafer 9.

The following Table 7 shows values for specifications of the catadioptric imaging system of the seventh example.

In the Table 7, $\lambda$, $\beta$, NA, and $\phi$ are the same symbols as those described in the above Table 1. Also, a plane number, r, d, and n are the same as those described in the above Table 1. In this respect, the referential numerals and symbols which are the same as those in the seventh example are used in the following eighth and ninth examples.

TABLE 7

(Main specifications)
$\lambda$ = 157.624 nm ± 1 pm
$\beta$ = 0.2500
NA = 0.75
$\phi$ = 16.4 mm
$\Delta n/\Delta \lambda = -2.4 \times 10^{-6} (\Delta \lambda = 1$ pm$)$

| Surface No. | r | d | n | |
|---|---|---|---|---|
| | (Mask plane) | 97.4647 | | |
| 1 | −133.8316 | 35.0000 | 1.559238 | (Lens L11) |
| 2* | −116.4714 | 1.0000 | | |
| 3 | −554.1774 | 20.5256 | 1.559238 | (Lens L12) |
| 4 | −213.7250 | 25.1023 | | |
| 5 | −261.9616 | 20.0289 | 1.559238 | (Lens L13) |
| 6* | −168.6391 | 20.3246 | | |
| 7* | −96.4098 | 25.0000 | 1.559238 | (Lens L14) |
| 8 | −163.9518 | 5.8731 | | |
| 9 | 782.1145 | 40.0000 | 1.559238 | (Lens L15) |
| 10 | −194.0414 | 1.1373 | | |
| 11 | ∞ | 20.6498 | | (Aperture stop S) |
| 12* | 104.9826 | 24.2585 | 1.559238 | (Lens L21) |
| 13 | −1294.5816 | 10.7993 | | |
| 14 | −152.5389 | 20.0000 | 1.559238 | (Lens L22) |
| 15 | −858.7147 | 38.4039 | | |
| 16* | 798.2520 | 20.1464 | 1.559238 | (Lens L23) |
| 17 | 198.7615 | 4.1296 | | |
| 18* | 261.7539 | 29.0815 | 1.559238 | (Lens L24) |
| 19 | −501.0834 | 63.3677 | | |
| 20 | 3299.4456 | 30.0000 | 1.559238 | (Lens L25) |
| 21* | 360.6533 | 39.6971 | | |
| 22 | 1401.8392 | 34.4568 | 1.559238 | (Lens L26) |
| 23 | −170.8148 | 5.9831 | | |
| 24* | 266.5085 | 24.4029 | 1.559238 | (Lens L27) |
| 25 | −370.3218 | 38.2791 | | |
| 26 | 255.6101 | 39.9997 | 1.559238 | (Lens L28) |
| 27 | −1343.1549 | 49.5384 | | |
| 28 | −142.9084 | 21.2041 | 1.55.9238 | (Lens L3) |
| 29 | 112.3957 | 14.2675 | | |
| 30 | 427.9297 | 284.4437 | | |
| 31 | −3734.1426 | −284.4437 | | (reflecting surface R1) |
| 32 | 427.9297 | 284.4437 | | (reflecting surface R2) |
| 33 | −3734.1426 | 13.3911 | | |
| | (Wafer plane) | 0.0000 | | |

(aspherical data)

| | r | κ | $C_4$ |
|---|---|---|---|
| 2nd surface | −116.4714 | 0.00000 | $7.4338 \times 10^{-8}$ |

TABLE 7-continued

| | $C_6$ | $C_8$ | $C_{10}$ |
|---|---|---|---|
| | $1.4821 \times 10^{-12}$ | $2.8340 \times 10^{-16}$ | $1.0465 \times 10^{-21}$ |
| | $C_{12}$ | $C_{14}$ | |
| | $2.3982 \times 10^{-24}$ | 0.00000 | |
| | r | κ | $C_4$ |
| 6th surface | −168.6391 | 0.00000 | $-3.1895 \times 10^{-8}$ |
| | $C_6$ | $C_8$ | $C_{10}$ |
| | $1.5252 \times 10^{-12}$ | $-1.5642 \times 10^{-16}$ | $1.0493 \times 10^{-20}$ |
| | $C_{12}$ | $C_{14}$ | |
| | $-7.2790 \times 10^{-25}$ | 0.00000 | |
| | r | κ | $C_4$ |
| 7th surface | −96.4098 | 0.00000 | $-1.8862 \times 10^{-7}$ |
| | $C_6$ | $C_8$ | $C_{10}$ |
| | $-2.5593 \times 10$-12 | $-1.2889 \times 10^{-15}$ | $1.3308 \times 10^{-19}$ |
| | $C_{12}$ | $C_{14}$ | |
| | $2.2662 \times 10^{-23}$ | 0.00000 | |
| | r | κ | $C_4$ |
| 12th surface | 104.9826 | 0.00000 | $-1.7279 \times 10^{-7}$ |
| | $C_6$ | $C_8$ | $C_{10}$ |
| | $-2.6931 \times 10^{-11}$ | $-2.7058 \times 10^{-15}$ | $-2.7673 \times 10^{-19}$ |
| | $C_{12}$ | $C_{14}$ | |
| | $-8.2067 \times 10^{-23}$ | 0.00000 | |
| | r | κ | $C_4$ |
| 16th surface | 798.2520 | 0.00000 | $-7.8055 \times 10^{-8}$ |
| | $C_6$ | $C_8$ | $C_{10}$ |
| | $2.4611 \times 10^{-11}$ | $-3.3373 \times 10^{-15}$ | $-5.8685 \times 10^{-19}$ |
| | $C_{12}$ | $C_{14}$ | |
| | $6.5684 \times 10^{-23}$ | 0.00000 | |
| | r | κ | $C_4$ |
| 18th surface | 261.7539 | 0.00000 | $1.4844 \times 10^{-8}$ |
| | $C_6$ | $C_8$ | $C_{10}$ |
| | $-1.7927 \times 10^{-11}$ | $3.0001 \times 10^{-15}$ | $3.4128 \times 10^{-19}$ |
| | $C_{12}$ | $C_{14}$ | |
| | $-7.3746 \times 10^{-23}$ | 0.00000 | |
| | r | κ | $C_4$ |
| 21st surface | 360.6533 | 0.00000 | $9.0882 \times 10^{-8}$ |
| | $C_6$ | $C_8$ | $C_{10}$ |
| | $-1.6366 \times 10^{-12}$ | $1.4369 \times 10^{-16}$ | $-9.1173 \times 10^{-20}$ |
| | $C_{12}$ | $C_{14}$ | |
| | $4.3321 \times 10^{-24}$ | 0.00000 | |
| | r | κ | $C_4$ |
| 24th surface | 266.5085 | 0.00000 | $1.3982 \times 10^{-8}$ |
| | $C_6$ | $C_8$ | $C_{10}$ |
| | $2.9315 \times 10^{-13}$ | $8.0049 \times 10^{-17}$ | $-2.5823 \times 10^{-20}$ |
| | $C_{12}$ | $C_{14}$ | |
| | $1.2241 \times 10^{-24}$ | 0.00000 | |

(Values corresponding to the conditional expression)
f2 = −109.2
d2 = −248.4
d3 = −13.4
$\beta$ = 0.25
$\beta$3 = 0.392
$\beta$4 = −1.255
(5)  $f2/|d2|$ = −0.4396
(6)  $|\beta/\beta3|$ = 0.6378
(7)  $|\beta/\beta4|$ = −0.1992
(8)  $|d3/d2|$ = 0.0539

Figure 15:
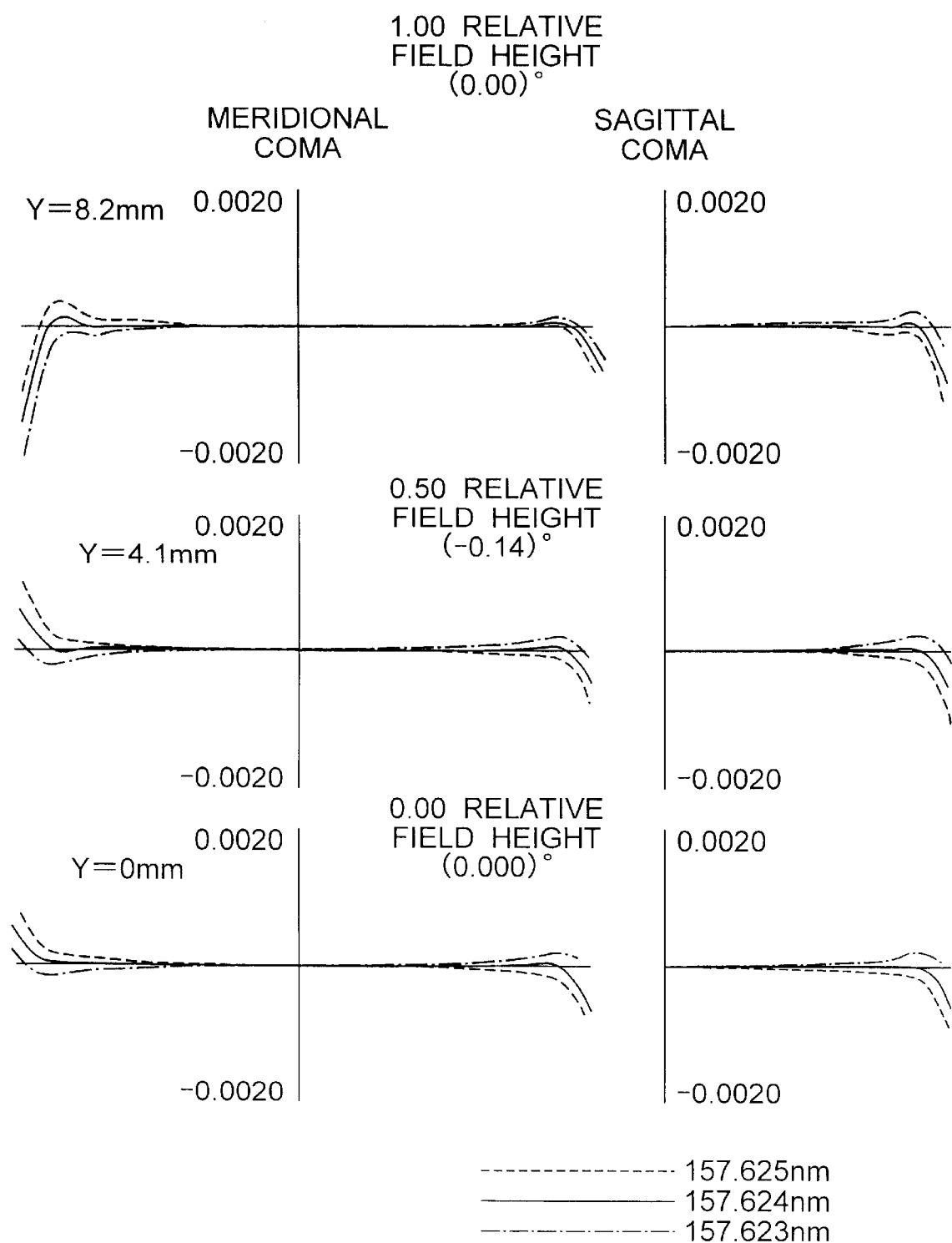
FIG. 15 is a view for showing tranverse aberrations in the seventh example.

FIG. 15 is a view for showing tranverse aberrations in the seventh example. In the aberration view, Y represents the image height, the solid line the central wavelength of 157.624 nm, the broken line the wavelength of 157.624 nm+1 pm=157.6625 nm, and the dotted line the wavelength of 157.624 nm−1 pm=157.623 nm, respectively. As clearly seen from the aberration view, in the seventh example, the chromatic aberration is satisfactorily corrected for the exposure light having the wavelength width of 157.624 nm±1 pm. In addition, it is confirmed, though omitted in the drawing, that other aberrations including the spherical aberration, astigmatism, and distortion are satisfactorily corrected.

As described above, in the catadioptric imaging system of the seventh example, it is possible to securely obtain the numerical aperture of 0.75 on the image side without enlarging the size of the maim mirror M1 with the lenses in a small number with respect to the $F_2$ laser beam having the central wavelength of 157.624 nm, and to securely obtain an image circle of 16.4 mm on the wafer. As a result, when the catadioptric imaging system of the seventh example is applied to a projection exposure apparatus, it is possible to achieve a high resolution of not more than 0.1 μm. In the seventh example, it is possible to set the exposure area in a rectangular form of 15 mm×6 mm within the image circle having the diameter of 16.4 mm. Here, it is possible to transfer a mask pattern onto an area of, for example, 30 mm×40 mm by conducting the stitching exposure by employing scanning exposure two times.

EIGHTH EXAMPLE

Figure 16:
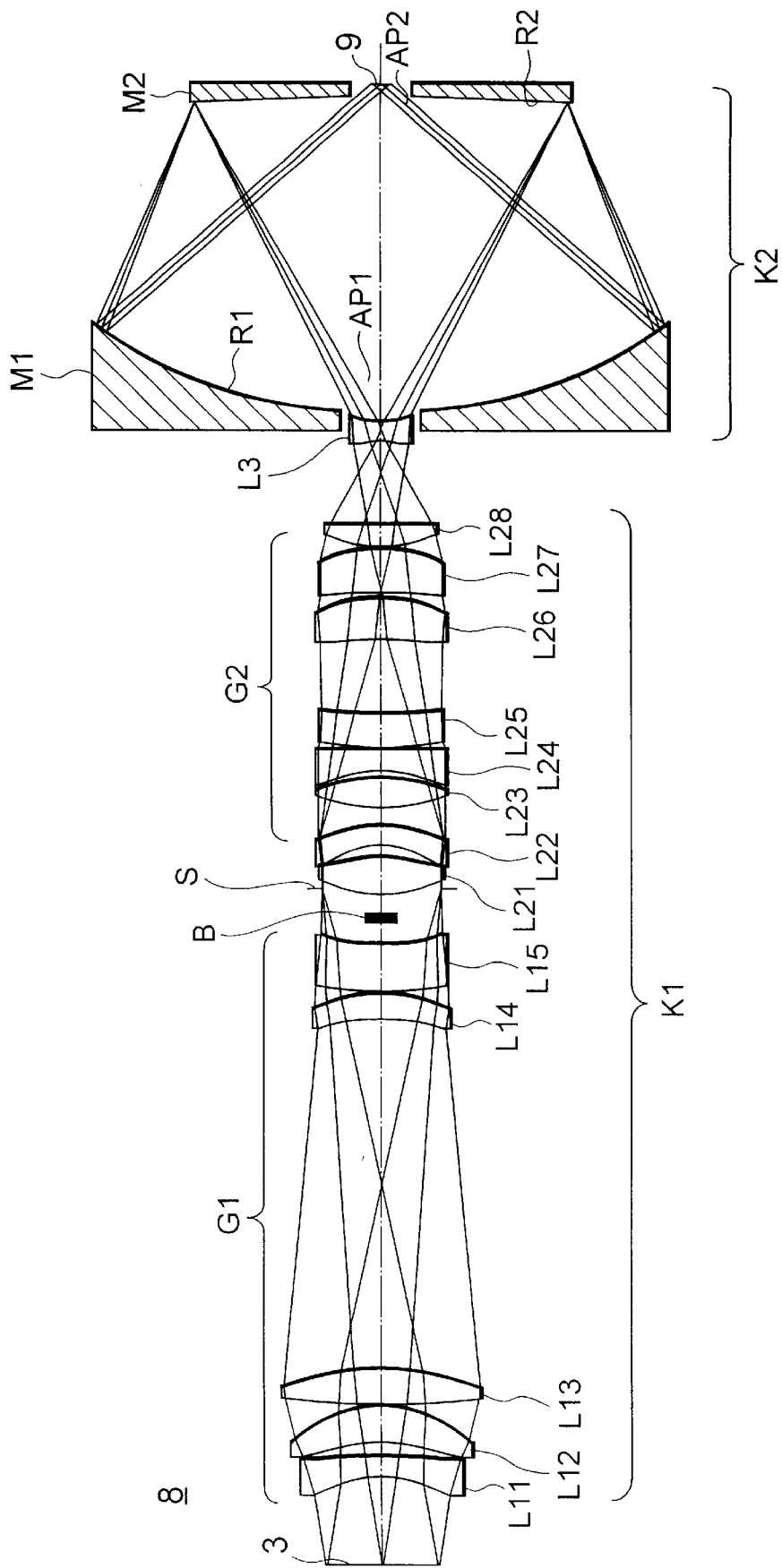
FIG. 16 is a view for showing a lens structure of a catadioptric imaging system (projection optical system)

FIG. 16 is a view for showing a lens structure of a catadioptric imaging system (projection optical system) according to an eighth example. In the eighth example, like in the seventh example, the present invention is applied to a projection optical system in which the aberrations including the chromatic aberration are corrected for the exposure light having the wavelength width of 157.624 nm±1 pm.

The catadioptric imaging system of FIG. 16 comprises a first imaging optical system K1 of dioptric type for forming an intermediate image of the mask 3, a second imaging optical system K2 of catadioptric type for forming the final image of the mask 3 on the basis of the light from the intermediate image on the wafer 9 with reduction magnification, and a chromatic aberration correction lens L3 sandwiched by and between the both optical systems K1 and K2. The first imaging optical system K1 comprises a first lens group G1 of the positive refracting power, an aperture stop S, and a second lens group G2 of the positive refracting power, in this order from the mask 3, while the second imaging optical system K2 comprises a primary mirror M1 consisting of a first reflecting surface R1 of the negative refracting power having a first radiation transmitting portion API at the center thereof, and a secondary mirror M2 consisting of a second reflecting surface R2 having a second radiation transmitting portion AP2 at the center thereof.

The first lens group G1 comprises a meniscus lens L11 having the aspherical convex surface facing the wafer side, a meniscus lens L12 in a double spherical form with the convex surface facing the wafer side, a double convex lens L13 having the aspherical convex surface facing the wafer side, a meniscus lens L14 having the aspherical concave surface facing the mask side, and a meniscus lens L15 having the aspherical concave surface facing the wafer side, in this order from the mask side.

Also, the second lens group G2 is comprised of a double convex lens L21 having the aspherical convex surface facing the mask side, a meniscus lens L22 having the aspherical concave surface facing the mask side, a double convex lens L23 having the aspherical convex surface facing the mask side, a double concave lens L24 having the aspherical concave surface facing the mask side, a meniscus lens L25 having the concave surface facing the wafer side, a meniscus lens L26 in a double spherical form having the convex surface facing the wafer side, a meniscus lens L27 having the aspherical concave surface facing the mask side, and a meniscus lens L28 in a double spherical form having the convex surface facing the mask side, in this order from the mask side.

The chromatic aberration correction lens L3 which is a double concave lens in a spherical form is disposed behind the position at which, in the rear of the second lens group G2 the intermediate image, is formed and in front of the first radiation transmitting portion AP1 provided in the primary mirror M1.

Also, the first imaging optical system K1 comprises a central shielding member B which is disposed at a position different from the aperture stop S in the direction of the optical axis AX for shielding light in the vicinity of the optical axis AX.

In such a structure, the light from the first imaging optical system K1 passes through the chromatic aberration correction lens L3 and is reflected by the second reflecting surface R2 through the first radiation transmitting portion API of the primary mirror M1. The light reflected by the second reflecting surface R2 is reflected by the first reflecting surface R1, and the light reflected by the first reflecting surface R1 passes through the second radiation transmitting portion AP2 of the secondary mirror M2 to form the final image on the wafer 9.

The following Table 8 shows values for specifications of the catadioptric imaging system of the eighth example.

TABLE 8

(Main specifications)
$\lambda$ = 157.624 nm ± 1 pm
$\beta$ = 0.2500
NA = 0.75
$\phi$ = 19.5 mm
$\Delta n/\Delta\lambda = -2.4 \times 10^{-6} (\Delta\lambda = 1\ pm)$

| Surface No. | r | d | n | |
|---|---|---|---|---|
| | (Mask plane) | 74.6950 | | |
| 1 | −122.0212 | 20.0000 | 1.559238 | (Lens L11) |
| 2* | −426.3504 | 11.7819 | | |
| 3 | −170.7647 | 31.8207 | 1.559238 | (Lens L12) |
| 4 | −112.7426 | 1.0000 | | |
| 5 | 677.6138 | 30.9654 | 1.559238 | (Lens L13) |
| 6* | −267.5441 | 312.5891 | | |
| 7* | −457.1505 | 25.0000 | 1.559238 | (Lens L14) |
| 8 | −136.1132 | 1.0000 | | |
| 9 | 371.1954 | 40.0000 | 1.559238 | (Lens L15) |
| 10* | 90.1479 | 33.3921 | | |
| 11 | ∞ | 14.7189 | | (Aperture stop S) |
| 12* | 81.7494 | 31.6956 | 1.559238 | (Lens L21) |
| 13 | −183.7422 | 11.6085 | | |
| 14* | −78.5623 | 20.0000 | 1.559238 | (Lens L22) |
| 15 | −139.7036 | 16.2402 | | |
| 16* | 164.6923 | 27.8376 | 1.559238 | (Lens L23) |
| 17 | −179.3500 | 4.8040 | | |
| 18* | −126.8087 | 20.0000 | 1.559238 | (Lens L24) |
| 19 | 835.6533 | 1.0142 | | |
| 20 | 527.3214 | 30.0000 | 1.559238 | (Lens L25) |
| 21* | 471.2666 | 68.6599 | | |
| 22 | −393.2785 | 39.0529 | 1.559238 | (Lens L26) |
| 23 | −162.7512 | 5.1881 | | |
| 24* | −371.2256 | 39.8874 | 1.559238 | (Lens L27) |
| 25 | −127.4034 | 1.0000 | | |
| 26 | 124.0028 | 20.0000 | 1.559238 | (Lens L28) |
| 27 | 6784.0168 | 72.8779 | | |
| 28 | −236.1546 | 20.0000 | 1.559238 | (Lens L3) |
| 29 | 90.5253 | 10.0000 | | |
| 30 | 425.4284 | 280.1707 | | |
| 31 | −3000.0000 | −280.1707 | | (reflecting surface R1) |
| 32 | 425.4284 | 280.1707 | | (reflecting surface R2) |
| 33 | −3000.0000 | 13.0000 | | |
| | (Wafer plane) | 0.0000 | | |

(aspherical data)

| | r | κ | $C_4$ |
|---|---|---|---|
| 2nd surface | −426.3504 | 0.00000 | $9.6251 \times 10^{-8}$ |
| | $C_6$ | $C_8$ | $C_{10}$ |
| | $4.0983 \times 10^{-12}$ | $-1.1849 \times 10^{-16}$ | $-6.65 \times 10^{-20}$ |
| | $C_{12}$ | $C_{14}$ | |
| | $4.8020 \times 10^{-24}$ | 0.00000 | |
| | r | κ | $C_4$ |

TABLE 8-continued

| | | | |
|---|---|---|---|
| 6th surface | −267.5441 | 0.00000 | −3.3841 × 10$^{-8}$ |
| | $C_6$ | $C_8$ | $C_{10}$ |
| | −1.4196 × 10$^{-12}$ | −3.0000 × 10$^{-17}$ | 3.63 × 10$^{-21}$ |
| | $C_{12}$ | $C_{14}$ | |
| | −9.7759 × 10$^{-26}$ | 0.00000 | |
| | r | κ | $C_4$ |
| 7th surface | −457.1505 | 0.00000 | −6.0739 × 10$^{-7}$ |
| | $C_6$ | $C_8$ | $C_{10}$ |
| | 1.1163 × 10$^{-11}$ | −2.1261 × 10$^{-15}$ | −2.42 × 10$^{-19}$ |
| | $C_{12}$ | $C_{14}$ | |
| | 6.4066 × 10$^{-25}$ | 0.00000 | |
| | r | κ | $C_4$ |
| 10th surface | 90.1479 | 0.00000 | −8.5414 × 10$^{-7}$ |
| | $C_6$ | $C_8$ | $C_{10}$ |
| | 7.9335 × 10$^{-12}$ | 1.2430 × 10$^{-15}$ | −5.82 × 10$^{-19}$ |
| | $C_{12}$ | $C_{14}$ | |
| | −2.3671 × 10$^{-23}$ | 0.00000 | |
| | r | κ | $C_4$ |
| 12th surface | 81.7494 | 0.00000 | −4.7617 × 10$^{-7}$ |
| | $C_6$ | $C_8$ | $C_{10}$ |
| | −2.5968 × 10$^{-11}$ | −4.8510 × 10$^{-15}$ | −5.94 × 10$^{-19}$ |
| | $C_{12}$ | $C_{14}$ | |
| | −7.0871 × 10$^{-23}$ | 0.00000 | |
| | r | κ | $C_4$ |
| 14th surface | 78.5623 | 0.00000 | 1.9520 × 10$^{-8}$ |
| | $C_6$ | $C_8$ | $C_{10}$ |
| | 4.6563 × 10$^{-11}$ | 7.8448 × 10$^{-15}$ | −1.83 × 10$^{-18}$ |
| | $C_{12}$ | $C_{14}$ | |
| | 2.1847 × 10$^{-22}$ | 0.00000 | |
| | r | κ | $C_4$ |
| 16th surface | 164.6923 | 0.00000 | 1.1464 × 10$^{-7}$ |
| | $C_6$ | $C_8$ | $C_{10}$ |
| | −1.5979 × 10$^{-11}$ | −9.7522 × 10$^{-15}$ | 1.03 × 10$^{-18}$ |
| | $C_{12}$ | $C_{14}$ | |
| | −4.2695 × 10$^{-22}$ | 0.00000 | |
| | r | κ | $C_4$ |
| 18th surface | −126.8087 | 0.00000 | −1.0844 × 10$^{-7}$ |
| | $C_6$ | $C_8$ | $C_{10}$ |
| | 7.1372 × 10$^{-12}$ | 1.7680 × 10$^{-14}$ | −4.12 × 10$^{-18}$ |
| | $C_{12}$ | $C_{14}$ | |
| | 3.4001 × 10$^{-22}$ | 0.00000 | |
| | r | κ | $C_4$ |
| 21st surface | 471.2666 | 0.00000 | 1.3727 × 10$^{-7}$ |
| | $C_6$ | $C_8$ | $C_{10}$ |
| | 2.1789 × 10$^{-12}$ | 3.8522 × 10$^{-15}$ | −3.43 × 10$^{-18}$ |
| | $C_{12}$ | $C_{14}$ | |
| | 5.1822 × 10$^{-22}$ | 0.00000 | |
| | r | κ | C |
| 24th surface | −371.2256 | 0.00000 | −6.8599 × 10$^{-8}$ |
| | $C_6$ | $C_8$ | $C_{10}$ |
| | −8.4200 × 10$^{-13}$ | −1.4460 × 10$^{-16}$ | 1.80 × 10$^{-20}$ |
| | $C_{12}$ | $C_{14}$ | |
| | 1.3348 × 10$^{-24}$ | 0.00000 | |

(Values corresponding to the conditional expression)
f2 = −114.5
d2 = 280.2
d3 = 13.0
β = 0.20
β3 = 0.378
β4 = −1.330
(5)  f2/|d2| = −0.4087
(6)  |β/β3| = 0.5288
(7)  |β/β4| = −0.1504
(8)  |d3/d2| = 0.0464

FIG. 17 is a view for showing tranverse aberrations in the eighth example. In the aberration view, Y represents the image height, the solid line the central wavelength of 157.624 nm, the broken line the wavelength of 157.624 nm+1 pm=157.6625 nm, and the dotted line the wavelength of 157.624 nm−1 pm=157.623 nm, respectively. As clearly seen from the aberration view, in the eighth example, the chromatic aberration is satisfactorily corrected for the exposure light having the wavelength width of 157.624 nm±1 pm. In addition, it is confirmed, though omitted in the drawing, that other aberrations including the spherical aberration, astigmatism, and distortion are satisfactorily corrected.

As described above, in the catadioptric imaging system of the eighth example, it is possible to securely obtain the numerical aperture of 0.75 on the image side without enlarging the size of the maim mirror M1 with the lenses in a small number with respect to the $F_2$ laser beam having the central wavelength of 157.624 nm, and to securely obtain an image circle of 19.5 mm on the wafer. As a result, when the catadioptric imaging system of the eighth example is applied to a projection exposure apparatus, it is possible to achieve a high resolution of not more than 0.1 μm. In the eighth example, it is possible to set the exposure area in a rectangular form of 18 mm×7.5 mm within the image circle having the diameter of 19.5 mm. Here, it is possible to transfer a mask pattern onto an area of, for example, 18 mm×33 mm by employing scanning exposure once. It is also possible to transfer the mask pattern onto an area of, for example, 36 mm×50 mm by conducting the stitching exposure by employing scanning exposure two times.

NINTH EXAMPLE

FIG. 18 is a view for showing a lens structure of a catadioptric imaging system (projection optical system) according to a ninth example. In the ninth example, like in the seventh example, the present invention is applied to a projection optical system in which the aberrations including the chromatic aberration are corrected for the exposure light having the wavelength width of 157.624 nm±1 pm.

The catadioptric imaging system of FIG. 18 comprises a first imaging optical system K1 of dioptric type for forming an intermediate image of the mask 3, a second imaging optical system K2 of catadioptric type for forming the final image of the mask 3 on the basis of the light from the intermediate image on the wafer 9 with reduction magnification, and a chromatic aberration correction lens L3 sandwiched by and between the both optical systems K1 and K2. The first imaging optical system K1 comprises a first lens group G1 of the positive refracting power, an aperture stop S, and a second lens group G2 of the positive refracting power, in this order from the mask 3, while the second imaging optical system K2 comprises a primary mirror M1 consisting of a first reflecting surface R1 of the negative refracting power having a first radiation transmitting portion AP1 at the center thereof, and a secondary mirror M2 consisting of a second reflecting surface R2 having a second radiation transmitting portion AP2 at the center thereof.

The first lens group G1 comprises a meniscus lens L11 having the aspherical convex surface facing the wafer side, a meniscus lens L12 in a double spherical form having the aspherical convex surface facing the wafer side, a meniscus lens L13 having the aspherical convex surface facing the wafer side, a meniscus lens L14 having the aspherical concave surface facing the wafer side, a meniscus lens L15 having the aspherical concave surface facing the mask side, and a double convex lens L16 having the aspherical convex surface facing the mask side, in this order from the mask side.

Also, the second lens group G2 is comprised of a meniscus lens L21 having the aspherical convex surface facing the mask side, a double convex lens L22 having the aspherical convex surface facing the mask side, a meniscus lens L23 having the aspherical convex surface facing the mask side, a double convex lens L24 having the aspherical convex surface facing the mask side, a meniscus lens L25 having the aspherical concave surface facing the wafer side, a meniscus lens L26 having the aspherical convex surface facing the mask side, a double convex lens L27 in a spherical form, a double convex lens L28 having the aspherical convex surface facing the mask side, a meniscus lens L29 having the aspherical convex surface facing the wafer side, and a meniscus lens L20 in a spherical form having the convex surface facing the wafer side, in this order from the mask side.

The chromatic aberration correction lens L3 which is a double concave lens in a spherical form is disposed behind the position at which, in the rear of the second lens group G2, the intermediate image is formed and in front of the first radiation transmitting portion AP1 provided in the primary mirror M1.

Also, the first imaging optical system K1 comprises a central shielding member B which is disposed at a position different from the aperture stop S in the direction of the optical axis AX for shielding light in the vicinity of the optical axis AX.

In such a structure, the light from the first imaging optical system K1 passes through the chromatic aberration correction lens L3 and is reflected by the second reflecting surface R2 through the first radiation transmitting portion AP1 of the primary mirror M1. The light reflected by the second reflecting surface R2 is reflected by the first reflecting surface R1, and the light reflected by the first reflecting surface R1 passes through the second radiation transmitting portion AP2 of the secondary mirror M2 to form the final image on the wafer 9.

The following Table 9 shows values for specifications of the catadioptric imaging system of the ninth example.

TABLE 9

(Main specifications)
$\lambda = 157.624$ nm ± 1 pm
$\beta = 0.2500$
NA = 0.75
$\phi = 26.4$ mm
$\Delta n/\Delta\lambda = -2.4 \times 10^{-6(\Delta\phi = 1\ pm)}$

| Surface No. | r | d | n | |
|---|---|---|---|---|
| | (Mask plane) | 75.8647 | | |
| 1 | −138.86.50 | 40.0000 | 1.559238 | (Lens L11) |
| 2* | −178.8588 | 12.1586 | | |
| 3 | −391.5927 | 40.0000 | 1.559238 | (Lens L12) |
| 4 | −130.5445 | 12.6974 | | |
| 5 | −1084.4149 | 40.0000 | 1.559238 | (Lens L13) |
| 6* | −200.0000 | 1.0000 | | |
| 7 | 17587.7644 | 20.5646 | 1.559238 | (Lens L14) |
| 8* | 288.1756 | 170.5608 | | |
| 9* | −1672.9950 | 40.0000 | 1.559238 | (Lens L15) |
| 10 | −281.6585 | 53.0696 | | |
| 11* | 2601.8744 | 20.0000 | | |
| 12 | −882.4457 | 6.8108 | | |
| 13 | ∞ | 8.2949 | | (Aperture stop S) |
| 14* | 862.4100 | 40.0000 | 1.559238 | (Lens L21) |
| 15 | 279.7040 | 1.0000 | | |
| 16* | 200.9038 | 37.7536 | 1.559238 | (Lens L22) |
| 17 | −24029.7696 | 33.4585 | | |
| 18* | 1180.0586 | 40.0000 | 1.559238 | (Lens L23) |
| 19 | 182.3363 | 1.0000 | | |
| 20* | 147.6961 | 39.7606 | 1.559238 | (Lens L24) |
| 21 | −23525.3704 | 16.8400 | | |
| 22 | 1074.5932 | 39.6090 | 1.559238 | (Lens L25) |
| 23* | 3065.3181 | 3.6505 | | |
| 24* | 1780.4798 | 20.0000 | 1.559238 | (Lens L26) |
| 25 | 867.2991 | 43.1760 | | |
| 26 | 488.6712 | 29.7592 | 1.559238 | (Lens L27) |
| 27 | −250.0000 | 1.0000 | | |
| 28* | 652.1667 | 24.0002 | 1.559238 | (Lens L28) |

TABLE 9-continued

| | | | | |
|---|---|---|---|---|
| 29 | −250.0000 | 1.0000 | | |
| 30 | −508.1135 | 40.0000 | 1.559238 | (Lens L29) |
| 31* | −195.7954 | 1.0000 | | |
| 32 | −662.4741 | 20.0000 | 1.559238 | (Lens L20) |
| 33 | −258.5729 | 72.4163 | | |
| 34 | −143.5452 | 20.0000 | 1.559238 | (Lens L3) |
| 35 | 114.3829 | 15.0000 | | |
| 36 | 436.0719 | 290.6011 | | |
| 37* | −2770.8948 | −290.6011 | | (reflecting surface R1) |
| 38 | 436.0719 | 290.6011 | | (reflecting surface R2) |
| 39* | −2770.8948 | 13.0000 | | |
| | (Wafer plane) | 0.0000 | | |

(aspherical data)

| | r | κ | $C_4$ |
|---|---|---|---|
| 2nd surface | −178.8588 | 0.00000 | $1.3991 \times 10^{-7}$ |
| | $C_6$ | $C_8$ | $C_{10}$ |
| | $4.0015 \times 10^{-12}$ | $3.5814 \times 10^{-16}$ | $2.6293 \times 10^{-20}$ |
| | $C_{12}$ | $C_{14}$ | |
| | $-7.5676 \times 10^{-24}$ | $3.1558 \times 10^{-28}$ | |
| 6th surface | −200.0000 | 0.00000 | $5.1509 \times 10^{-8}$ |
| | $C_6$ | $C_8$ | $C_{10}$ |
| | $-5.6993 \times 10^{-12}$ | $7.4009 \times 10^{-17}$ | $-1.0761 \times 10^{-20}$ |
| | $C_{12}$ | $C_{14}$ | |
| | $1.2317 \times 10^{-24}$ | $-3.9961 \times 10^{-29}$ | |
| 8th surface | 288.1756 | 0.00000 | $-1.1026 \times 10^{-7}$ |
| | $C_6$ | $C_8$ | $C_{10}$ |
| | $1.4610 \times 10^{-12}$ | $2.9376 \times 10^{-16}$ | $-9.3449 \times 10^{-21}$ |
| | $C_{12}$ | $C_{14}$ | |
| | $-1.8853 \times 10^{-25}$ | $1.7087 \times 10^{-30}$ | |
| 9th surface | −1672.9950 | 0.00000 | $-1.5740 \times 10^{-7}$ |
| | $C_6$ | $C_8$ | $C_{10}$ |
| | $-2.5860 \times 10^{-11}$ | $-1.4744 \times 10^{-15}$ | $-2.5569 \times 10^{-19}$ |
| | $C_{12}$ | $C_{14}$ | |
| | $3.1809 \times 10^{-24}$ | $-6.7776 \times 10^{-27}$ | |
| 11th surface | 2601.8744 | 0.00000 | $2.1540 \times 10^{-8}$ |
| | $C_6$ | $C_8$ | $C_{10}$ |
| | $5.9335 \times 10^{-11}$ | $1.1166 \times 10^{-16}$ | $-4.9143 \times 10^{-19}$ |
| | $C_{12}$ | $C_{14}$ | |
| | $4.7574 \times 10^{-23}$ | $7.5819 \times 10^{-28}$ | |
| 14th surface | 862.4100 | 0.00000 | $-6.8114 \times 10^{-9}$ |
| | $C_6$ | $C_8$ | $C_{10}$ |
| | $-4.9305 \times 10^{-11}$ | $8.9448 \times 10^{-16}$ | $-5.2007 \times 10^{-20}$ |
| | $C_{12}$ | $C_{14}$ | |
| | $-6.9020 \times 10^{-23}$ | $3.8255 \times 10^{-27}$ | |
| 16th surface | 200.9038 | 0.00000 | $-5.7478 \times 10^{-8}$ |
| | $C_6$ | $C_8$ | $C_{10}$ |
| | $-8.1295 \times 10^{-12}$ | $-3.5513 \times 10^{-15}$ | $-6.3355 \times 10^{-19}$ |
| | $C_{12}$ | $C_{14}$ | |
| | $7.6282 \times 10^{-23}$ | $-3.7090 \times 10^{-26}$ | |
| 18th surface | 1180.0586 | 0.00000 | $-6.5369 \times 10^{-8}$ |
| | $C_6$ | $C_8$ | $C_{10}$ |
| | $9.5726 \times 10^{-12}$ | $5.8529 \times 10^{-15}$ | $5.9762 \times 10^{-20}$ |
| | $C_{12}$ | $C_{14}$ | |
| | $6.1398 \times 10^{-24}$ | $-9.6136 \times 10^{-27}$ | |
| 20th surface | 147.6961 | 0.00000 | $-1.6135 \times 10^{-8}$ |
| | $C_6$ | $C_8$ | $C_{10}$ |
| | $1.2448 \times 10^{-11}$ | $-2.7569 \times 10^{-15}$ | $2.1810 \times 10^{-19}$ |
| | $C_{12}$ | $C_{14}$ | |
| | $1.2477 \times 10^{-24}$ | $-4.7232 \times 10^{-27}$ | |
| 23rd surface | 3065.3181 | 0.00000 | $7.8083 \times 10^{-9}$ |
| | $C_6$ | $C_8$ | $C_{10}$ |
| | $1.2104 \times 10^{-11}$ | $2.9461 \times 10^{-15}$ | $-2.1647 \times 10^{-20}$ |
| | $C_{12}$ | $C_{14}$ | |
| | $3.1859 \times 10^{-23}$ | $3.7037 \times 10^{-27}$ | |
| 24th surface | 1780.4798 | 0.00000 | $-6.1057 \times 10^{-8}$ |
| | $C_6$ | $C_8$ | $C_{10}$ |
| | $-1.3001 \times 10^{-11}$ | $1.7148 \times 10^{-15}$ | $-1.9337 \times 10^{-19}$ |

TABLE 9-continued

|  | $C_{12}$ | $C_{14}$ |  |
|---|---|---|---|
|  | $1.5140 \times 10^{-23}$ | $7.5042 \times 10^{-28}$ |  |
|  | r | κ | $C_4$ |
| 28th surface | 652.1667 | 0.00000 | $-7.1641 \times 10^{-8}$ |
|  | $C_6$ | $C_8$ | $C_{10}$ |
|  | $9.5614 \times 10^{-12}$ | $7.2067 \times 10^{-16}$ | $3.0907 \times 10^{-20}$ |
|  | $C_{12}$ | $C_{14}$ |  |
|  | $-7.4253 \times 10^{-24}$ | $1.4707 \times 10^{-28}$ |  |
|  | r | κ | $C_4$ |
| 31st surface | $-195.7954$ | 0.00000 | $3.0509 \times 10^{-8}$ |
|  | $C_6$ | $C_8$ | $C_{10}$ |
|  | $8.0986 \times 10^{-12}$ | $4.9520 \times 10^{-16}$ | $9.3365 \times 10^{-20}$ |
|  | $C_{12}$ | $C_{14}$ |  |
|  | $-1.6508 \times 10^{-23}$ | $2.8405 \times 10^{-27}$ |  |
|  | r | κ | $C_4$ |
| 37th surface | $-2770.8948$ | 0.00000 | $1.2052 \times 10^{-9}$ |
| 39th surface | $C_6$ | $C_8$ | $C_{10}$ |
|  | $-3.9716 \times 10^{-16}$ | $-7.0721 \times 10^{-20}$ | $6.5028 \times 10^{-25}$ |
|  | $C_{12}$ | $C_{14}$ |  |
|  | $-2.3785 \times 10^{-30}$ | $1.6673 \times 10^{-35}$ |  |

(Values corresponding to the conditional expression)
f2 − 110.7
d2 = 290.6
d3 = 13.0
β = 0.25
β3 = 0.392
β4 = −1.349
(5)  f2/ | d2 | = −0.3811
(6)  | β/β3 | = 0.6378
(7)  | β/β4 | = −0.1854
(8)  | d3/d2 | = 0.0447

FIG. 19 is a view for showing tranverse aberrations in the ninth example. In the aberration view, Y represents the image height, the solid line the central wavelength of 157.624 nm, the broken line the wavelength of 157.624 nm+1 pm=157.6625 nm, and the dotted line the wavelength of 157.624 nm−1 pm=157.623 nm, respectively. As clearly seen from the aberration view, in the ninth example, the chromatic aberration is satisfactorily corrected for the exposure light having the wavelength width of 157.624 nm±1 pm. In addition, it is confirmed, though omitted in the drawing, that other aberrations including the spherical aberration, astigmatism, and distortion are satisfactorily corrected.

As described above, in the catadioptric imaging system of the ninth example, it is possible to securely obtain the numerical aperture of 0.75 on the image side without enlarging the size of the maim mirror M1 with the lenses in a small number with respect to the $F_2$ laser beam having the central wavelength of 157.624 nm, and to securely obtain an image circle of 26.4 mm on the wafer. As a result, when the catadioptric imaging system of the ninth example is applied to a projection exposure apparatus, it is possible to achieve a high resolution of not more than 0.1 μm. In the ninth example, it is possible to set the exposure area in a rectangular form of 25 mm×8.5 mm within the image circle having the diameter of 26.4 mm. Here, it is possible to transfer a mask pattern onto an area of, for example, 25 mm×33 mm by employing scanning exposure once. It is also possible to transfer the mask pattern onto an area of, for example, 50 mm×65 mm by conducting the stitching exposure by employing scanning exposure two times.

Fourth Embodiment

FIG. 20 is a view for illustrating in an enlarged manner the vicinity of a wafer of an optical apparatus according to a fourth embodiment of the present invention. In this embodiment, the basic structure of the catadioptric imaging system is the same as that of the second or third embodiment, so that detailed description will be omitted. In FIG. 20, there is provided a lens component L2 to be corresponding to the catadioptric imaging system 8 of the second embodiment. However, in the catadioptric imaging system 8 of the third embodiment, there is no member corresponding to the lens component L2.

The fourth embodiment is different from the second embodiment, and the like, in that a wafer position detecting system is provided for detecting the position of a wafer. The wafer position detecting system is comprised of a light guiding system 20, a light receiving system 22, and a photoelectric conversion unit 24. A beam for detecting the wafer position from the light guiding system 20 (hereinafter called the "AF light") enters the base member of the secondary mirror M2 through a side surface S1 thereof, and propagates inside the base member of the secondary mirror so as to be reflected between the surface on the mask side and the surface on the wafer side of the secondary mirror. Then, the AF light emits from the base member through a side surface S2 thereof, and reaches the surface of the wafer 9 in an area in which the second radiation transmitting portion AP2 is projected onto the wafer 9. Next, the AF light reflected by the wafer 9 enters the base member of the secondary mirror through a side surface S3 thereof, propagates therethrough to be reflected between the surface on the mask side and the surface of the wafer side of the secondary mirror M2, and then emits from the base member through a side surface S4 thereof. Then, the AF light is condensed on a light receiving surface of the photoelectric conversion unit 24 by a condensing optical system 22. An arithmetic operation unit 26 conducts position detection of the wafer 9 on the basis of a signal from the photoelectric conversion unit 24, that is, conducts at least one of focal detection or inclination detection of the wafer plane. The wafer 9 is supported on a wafer holder 10, and the wafer holder 10 is mounted on a wafer stage 11. A drive of the wafer stage 11 is controlled on the basis of a result of detection by the arithmetic operation unit 26, whereby the wafer 9 is changed to have a different position in the optical axis AX or a different inclination with respect to the optical axis AX. Finally, auto focusing and leveling control are conducted so that the image of the mask 3 is projected at an optimal position on the wafer 9.

For such focal detection and inclination detection of the wafer plane, an apparatus which is disclosed in Japanese Patent Laid-Open No. HEI 6-66543, No. HEI 8-219718, No. HEI 9-304016, or No. HEI 10-82611 can be suitably used.

Also, as shown in FIG. 21, it is possible to conduct the focal detection more precisely by making the side surfaces S1 to S4 of the secondary mirror M2 to be plane surfaces substantially perpendicular to the AF light. Further, since the secondary mirror M2 is in a cylindrical form, astigmatism is generated in the AF light. For this reason, as shown in FIG. 22, by forming the portions S1 to S4 through which the AF light is incident linearly with respect to the secondary mirror M2, such astigmatism can be prevented from being generated so as to conduct the focal detection at high precision.

The projection exposure apparatus of each of the foregoing embodiments can be manufactured by the following method.

First, an illumination optical system is prepared for illuminating a pattern on a mask by an illumination radiation having the central wavelength shorter than 180 nm. More specifically, an illumination optical system which illuminates a mask pattern by using an $F_2$ laser beam having the central wavelength of 157.6 nm is prepared. In this case, the illumination optical system is arranged to supply the illumination radiation having a spectral width of not more than a predetermined half maximum width.

Next, a projection optical system for forming an image of a pattern on the mask on a photosensitive surface of a photosensitive substrate is prepared. The step of preparing the projection optical system contains the steps of preparing a plurality of dioptric elements, reflecting mirrors, etc. and assembling these components. Then, it is possible to manufacture the projection exposure apparatus according to each of the embodiments, by electrically mechanically or optically coupling the illumination optical system and the projection optical system to each other so as to achieve the above-mentioned function.

In each of the foregoing embodiments, $CaF_2$ (calcium fluoride) is used as a material for the refractive optical members for constituting the projection optical system. However, it is possible to use, in addition to, or instead of this $CaF_2$, crystalline material such as barium fluoride, lithium fluoride, and manganese fluoride, or silica doped with fluorine. However, it is preferable to constitute the projection optical system of a single optical material as long as a sufficiently band narrowing is possible in an illumination radiation for illuminating the mask. Further, considering that facilitation of manufacturing the projection optical system or the manufacturing cost, it is preferable to constitute the projection optical system of $CaF_2$ only.

In the above first embodiment, the secondary mirror is formed to be a rear surface reflecting surface by providing the lens component which is adjacent to the secondary mirror with a reflecting surface. However, the secondary mirror may be formed as a front surface reflecting surface to be separated from the lens component which is adjacent to the secondary mirror. In this case, the form of the reflecting surface of the secondary mirror is advantageously free from the influence of a change of the surface form due to heat absorption, or the like, of the lens component adjacent to the secondary mirror.

In each of the foregoing embodiments, the inside of the optical path from the light source to the wafer is substituted with helium gas. However, a part or all of the optical path may be substituted with nitrogen ($N_2$) gas.

Further, in each of the foregoing embodiments, the $F_2$ laser is used as the light source, so that the spectral width thereof is narrow-banded by a band-narrowing apparatus. However, harmonics of a solid laser such as an YAG laser having an oscillating spectrum of 157 nm may be used, instead. It is also possible to use the harmonics which are obtained by amplifying a laser beam having a single wavelength in an infrared or visible range oscillated from a DFB semiconductor laser or a fiber laser by means of a fiber amplifier which is doped with, for example, erbium (Er) (or both of erbium (Er) and ytterbium (Yb)) and by converting the wavelength thereof to make them an ultraviolet light beams by means of nonlinear optical crystal.

For example, if the oscillating wavelength of the single wavelength laser light beam is within a range from 1.51 to 1.59 pm, ten times harmonics with the generated wavelength within a range of 151 to 159 nm are output. Particularly, if the oscillating wavelength is within a range from 1.57 to 1.58 μm, ten times harmonics with the generated wavelength within a range of 157 to 158 nm, that is, an ultraviolet light having substantially the same wavelength as the $F_2$ laser beam, can be obtained. Moreover, if the oscillating wavelength is within a range from 1.03 to 1.12 μm, seven times harmonics with the generated wavelength within a range of 147 to 160 nm are output and particularly, if the oscillating wavelength is within a range from 1.099 to 1.106 μm, seven times harmonics with the generated wavelength within a range of 157 to 158 nm, that is, an ultraviolet light having substantially the same wavelength as the $F_2$ laser beam, can be obtained. Note that as such single wavelength oscillation laser, ytterbium (Yb)-doped fiber laser is used.

As described above, when harmonics from a laser light source are used, these harmonics themselves have sufficiently narrow-banded spectral width (for example, 0.3 pm or less), so that these harmonics maybe used instead of the light source 1 in the foregoing embodiments.

Incidentally, the present invention can be applied to both the step-and-repeat system (batch exposure system) in which, mask pattern images are batch transferred onto one shot area on a wafer, the wafer is sequentially and two-dimensionally moved within a plane perpendicular to the optical axis of the projection optical system to batch transfer the mask pattern images onto the next shot area, and this step is repeated subsequently, and the step-and-scan system (scanning exposure system) in which the mask and the wafer are scanned in synchronism with respect to the projection optical system with the projection magnification β as the speed ratio at the exposure of each shot area of the wafer. According to the step-and-scan system, it is sufficient if excellent image forming characteristics can be obtained within an exposure area in a slit form (elongated rectangular form). Thus, it is possible to conduct the exposure in a wider shot area on the wafer without increasing the size of the projection optical system. The form of an exposure area according to the step-and-scan system is not limited to a rectangle, but may be, for example, an isosceles trapezoid, a non-isosceles trapezoid, a rhombus, a hexagon, a circular arc, or the like.

Next, description will be made on an operation for forming a predetermined circuit pattern on the wafer by the step-and-scan system by the use of the projection exposure apparatus of the foregoing embodiments, with reference to a flowchart in FIG. 23. First, at step S1 in FIG. 23, a metallic film is vapor-deposited on a wafer of one lot. At step S2, a photo resist is coated on the metallic film on the wafer 9 of one lot. After that, at step S3, by use of the projection exposure apparatus of FIG. 1 which is provided with the projection optical system 8 of the first to third embodiments (FIGS. 2, 4, 6, 8, 10, 12, 14, 16 and 18), an image of a pattern on the reticle 3 is sequentially exposed and transferred onto each shot area on the wafer 9 of one lot through the projection optical system 8. Then, after the photo resist on the wafer 9 of one lot is developed at step S4, etching is conducted at step S5 with a resist pattern on the wafer 9 of one lot as a mask, so that a circuit pattern corresponding to the pattern on the reticle R is formed in each shot on each wafer. Thereafter, a circuit pattern is formed on an upper layer, so as to manufacture a device such as a semiconductor device, or the like.

In each of the foregoing embodiments, the present invention is applied to the projection exposure apparatus which is used in the manufacture of a semiconductor device. However, it is also possible to apply the present invention not only to such exposure apparatus which is used in the manufacture of a semiconductor device, but also to an exposure apparatus for transferring a device pattern onto a glass plate, used in the manufacture of display devices including a liquid crystal display device, or the like, an exposure apparatus for transferring a device pattern onto a ceramic wafer, used in the manufacture of a thin film magnetic head, and an exposure apparatus used in the manufacture of an image pick-up device (CCD, or the like). The present invention can be also applied to an exposure apparatus which transfers a circuit pattern onto a glass substrate or a silicon wafer for manufacturing a reticle or a mask.

Note that, the present invention is not limited to the foregoing embodiments, but can take various structures within the sprit and scope of the present invention.

What is claimed is:

1. A catadioptric imaging system for forming a reduced image of a first plane onto a second plane, comprising:
   a first imaging optical system having a dioptric imaging optical system;
   a second imaging optical system having a catadioptric imaging optical system; wherein
   said first imaging optical system comprises in the order from the first plane, a first lens group having a positive refracting power, an aperture stop, and a second lens group having a positive refracting power, for forming a primary image of the first plane;
   said second imaging optical system comprises a primary mirror having a first reflecting surface and a first radiation transmitting portion at the center thereof, a secondary mirror having a second reflecting surface with a second radiation transmitting portion at the center thereof, and a refracting member separated from said first reflecting surface and said second reflecting surface, for forming a secondary reduced image of the first plane on the basis of the radiation from said primary image, said first reflecting surface having a front surface reflecting surface in a concave form; and
   the radiation from said primary image passes through said first radiation transmitting portion of said primary mirror and said refracting member to be reflected by said secondary mirror, the radiation reflected by said secondary mirror passes through said refracting member to be reflected by said primary mirror, and the radiation reflected by said primary mirror passes through said refracting member and said second radiation transmitting portion of said secondary mirror to form said secondary image.

2. A catadioptric imaging system according to claim 1, wherein said refracting member has a negative refracting power and satisfies the following condition:

$$-85 < |f1/d1| < -10,$$

where f1 is the focal length of said refracting member, and d1 is the distance between said secondary mirror and said refracting member along the optical axis.

3. A catadioptric imaging system according to claim 1, wherein said refracting member has a refracting surface having a concave surface facing the second plane side.

4. A catadioptric imaging system according to claim 1, satisfying the following condition:

$$0.6 < |\beta 1/\beta 2| < 3.5,$$

where $\beta 1$ is the magnification of said first imaging optical system, and $\beta 2$ is the magnification of said second imaging optical system.

5. A catadioptric imaging system according to claim 1, wherein said reflecting surface of said secondary mirror is a front surface reflecting mirror.

6. A projection exposure apparatus for transferring a pattern on a mask onto workpiece, comprising:
   an illumination system; and
   a catadioptric imaging system of claim 1, arranged in an optical path between said mask and said workpiece, for projecting an image of said pattern of said mask disposed on said first plane onto said workpiece, based on an ultraviolet radiation from said illumination system.

7. A exposure method comprising the steps of:
   preparing a mask;
   preparing a workpiece;
   illuminating said mask using ultraviolet radiation; and
   transferring a pattern on said mask onto said workpiece with the catadioptric imaging system of claim 1.

8. A method of manufacturing a micro-electro device, comprising the steps of:
   preparing a workpiece;
   covering the workpiece with a photosensitive material;
   transferring a pattern onto the workpiece with the photosensitive material using the method of claim 7; and
   developing said photosensitive material.

9. A catadioptric imaging system for optically conjugating a first plane and a second plane to each other, comprising:
   a first imaging optical system, arranged between said first plane and said second plane, for forming an intermediate image of said first plane;
   a second imaging optical system, arranged between said first imaging system and said second plane, for forming an image of said intermediate image;
   one of said first and second imaging optical systems comprises a primary mirror having a first reflecting surface with a concave form and a first radiation transmitting portion at the center thereof, and a secondary mirror comprises a second reflecting surface and a second radiation transmitting portion at the center thereof;
   said primary mirror and said secondary mirror are positioned such that the radiation directed to said first radiation transmitting portion passes through said first radiation transmitting portion to be reflected by said second reflecting surface, the radiation reflected by said second reflecting surface is reflected by said first reflecting surface, and the radiation reflected by said first reflecting surface passes through said second radiation transmitting portion of said secondary mirror;
   said catadioptric imaging system further comprising:
   a central shielding member, arranged in an optical path of said catadioptric imaging system, for shielding the radiation which is not reflected by said first and second reflecting surfaces and which is directed to the second plane;
   a variable aperture stop, arranged different position from said central shielding member in the direction along the optical axis of said catadioptric imaging system, having a variable aperture diameter.

10. A catadioptric imaging system according to claim 9, wherein said first imaging optical system comprises a first lens group having a positive refractive power, said aperture stop and a second lens group having a positive refractive power, in the order from said first plane;
   wherein said second imaging optical system comprises said primary mirror, and said secondary mirror; and
   wherein said central shielding member is disposed in said first imaging optical system.

11. A projection exposure apparatus for transferring a pattern on a mask onto workpiece, comprising:

an illumination system; and a catadioptric imaging system of claim 9, arranged in an optical path between said mask and said workpiece, for projecting an image of said pattern of said mask disposed on said first plane onto said workpiece, based on an ultraviolet radiation from said illumination system.

12. A exposure method comprising the steps of:

preparing a mask;

preparing a workpiece;

illuminating said mask using ultraviolet radiation; and transferring a pattern on said mask onto said workpiece with the catadioptric imaging system of claim 9.

13. A method of manufacturing a micro-electro device, comprising the steps of:

preparing a workpiece;

covering the workpiece with a photosensitive material;

transferring a pattern onto the workpiece with the photosensitive material using the method of claim 12; and developing said photosensitive material.

14. A catadioptric imaging system for optically conjugating a first plane and a second plane to each other, comprising:

a first imaging optical system, arranged between said first plane and said second plane, for forming an intermediate image of said first plane;

a second imaging optical system, arranged between said first imaging optical system and said second plane, for forming an image of said intermediate image; wherein one of said first imaging optical system and said second imaging optical system is a dioptric imaging optical sub-system;

other of said first imaging optical system and said second imaging optical system is a catadioptric imaging optical sub-system;

said dioptric imaging optical sub-system comprises a first lens group having a positive refracting power, a second lens group having a positive refracting power, and an aperture stop arranged between said first lens group and said second lens group;

said catadioptric imaging optical sub-system comprises a primary mirror including a first reflecting surface with concave form having a first radiation transmitting portion at the center thereof, and a secondary mirror including a second reflecting surface having a second radiation transmitting portion at the center thereof;

said catadioptric imaging optical sub-system comprises a first optical path between said first radiation transmitting portion and said second reflecting surface, a second optical path between said second reflecting surface and said first reflecting surface, and a third optical path between said first reflecting surface and said second radiation transmitting portion; and a refracting optical member belonging to said catadioptric imaging system is disposed only in a part of an optical path between said first plane and said second plane which optical path does not include said first, second, and third optical paths.

15. A catadioptric imaging system according to claim 14, wherein said first imaging system is arranged between said second imaging system and said first plane, and wherein said first imaging system forms an intermediate image of said first plane.

16. A catadioptric imaging system according to claim 15, further comprising a chromatic aberration correction lens, disposed in a part of an optical path between said intermediate image and said first reflecting surface which optical path is not between said first radiation transmitting portion and said second radiation transmitting portion.

17. A catadioptric imaging system according to claim 16, satisfying the following condition:

$$-1.10 < f2/|d2| < -0.15,$$

where f2 is the focal length of said chromatic aberration correction lens, and d2 is the distance between said first reflecting surface and said second reflecting surface.

18. A catadioptric imaging system according to claim 15, further comprising a central shielding member, disposed in the vicinity of a rear focal point of said first lens group, for shielding the incident radiation around the center of said second imaging system.

19. A catadioptric imaging system according to claim 18, wherein said first lens group having a field curvature of the pupil, and wherein said central shielding member and said aperture stop are arranged at the positions separated from each other in the direction on an optical axis of said first imaging optical system.

20. A catadioptric imaging system according to claim 14, wherein said catadioptric imaging optical system is bi-telecentric.

21. A catadioptric imaging system according to claim 14, comprising at least ten refracting surfaces, wherein at least five of which have aspherical form.

22. A catadioptric imaging system according to claim 15, satisfying the following conditions:

$$0.15 < |\beta/\beta 3| < 0.95,$$

and $$0.10 < |\beta/\beta 4| < 0.50,$$

where β is the magnification of the entire catadioptric imaging system, β3 is the magnification of said first reflecting surface, and β4 is the magnification of said second reflecting surface.

23. A catadioptric imaging system according to claim 15, wherein the refracting optical members within said catadioptric imaging sub-system are disposed only in an optical path between said first plane and said first radiation transmitting portion.

24. A catadioptric imaging system according to claim 15, satisfying the following condition:

$$0.04 < |d3/d2| < 0.08,$$

where d2 is the distance between said first reflecting surface and said second reflecting surface, and d3 is the distance between said second reflecting surface and said second plane.

25. A catadioptric imaging system according to claim 15, wherein said second imaging optical system forms an image of the intermediate image formed by said first imaging optical system on the second plane as the final image.

26. A catadioptric imaging system according to claim 14, wherein said first radiation transmitting portion and said second radiation transmitting portion are disposed at positions including an optical axis of said catadioptric imaging sub-system.

27. A projection exposure apparatus for transferring a pattern on a mask onto workpiece, comprising:

an illumination system; and a catadioptric imaging system of claim 14, arranged in an optical path between said mask and said workpiece, for projecting an image of said pattern of said mask disposed on said first plane onto said workpiece, based on an ultraviolet radiation from said illumination system.

28. A exposure method comprising the steps of:

preparing a mask;

preparing a workpiece;

illuminating said mask using ultraviolet radiation; and transferring a pattern on said mask onto said workpiece with the catadioptric imaging system of claim 14.

29. A method of manufacturing a micro-electro device, comprising the steps of:

preparing a workpiece;

covering the workpiece with a photosensitive material;

transferring a pattern onto the workpiece with the photosensitive material using the method of claim 28; and developing said photosensitive material.

30. A catadioptric imaging system for optically conjugating a first plane and a second plane to each other, comprising:

a first imaging optical system, arranged between said first plane and said second plane, for forming an intermediate image of said first plane;

a second imaging optical system, arranged between said first imaging system and said second plane, for forming an image of said intermediate image;

one of said first imaging optical system and said second imaging optical system is a dioptric imaging optical sub-system;

other of said first imaging optical system and said second imaging optical system is a catadioptric imaging optical sub-system;

said dioptric imaging optical sub-system comprises a first lens group having a positive refracting power, a second lens group having a positive refractive power, and an aperture stop arranged between said first lens group and said second lens group;

said catadioptric imaging optical sub-system comprises a primary mirror including a first reflecting surface having a first radiation transmitting portion at the center thereof, and a secondary mirror including a second reflecting surface having a second radiation transmitting portion at the center thereof;

said first reflecting surface is a front surface reflecting surface of a concave form;

said second reflecting surface has a concave form; and said catadioptric imaging optical sub-system comprises a first optical path between said first radiation transmitting portion and said second reflecting surface, a second optical path between said second reflecting surface and said first reflecting surface, and a third optical path between said first reflecting surface and said second radiation transmitting portion.

31. A catadioptric imaging system according to claim 30, wherein said second imaging optical system forms an image of the intermediate image formed by said first imaging optical system on the second plane as a final image.

32. A catadioptric imaging system according to claim 30, wherein said catadioptric sub-system comprises a refracting optical member in said first, second, and third optical paths.

33. A catadioptric imaging system according to claim 32, wherein one of the optical surfaces of said refracting optical member in said catadioptric sub-system is provided with a lens surface having a negative refracting power while the other of the optical surfaces is provided with said second reflecting surface.

34. A catadioptric imaging system according to claim 32, wherein the optical surface on said secondary mirror side of said refracting optical member in said catadioptric imaging optical sub-system is separated from said second reflecting surface of said secondary mirror.

35. A catadioptric imaging system according to claim 32, wherein said second reflecting surface is a front surface reflecting surface.

36. A catadioptric imaging system according to claim 30, wherein the refracting optical members within said catadioptric imaging system are disposed only in a part of an optical path between said first plane and said second plane excluding said first, second, and third optical paths.

37. A catadioptric imaging system according to claim 30, wherein all of the refracting optical members within said catadioptric imaging system made of fluorite.

38. A catadioptric imaging system according to claim 30, comprising a shielding member, arranged in an optical path between said first lens group and said second lens group, for shielding a part of the incident beams around the optical axis.

39. A catadioptric imaging system according to claim 38, wherein said shielding member and said aperture stop are disposed at positions different from each other in a direction along an optical axis of said dioptric imaging sub-system.

40. A catadioptric imaging system according to claim 30, wherein an intermediate image of said first plane are formed between said first imaging system and said second imaging system, said catadioptric imaging system further comprising a field stop disposed in the vicinity of the intermediate image forming position.

41. A catadioptric imaging system according to claim 31 further comprising an image circle having the diameter of 10 mm or larger on said second plane.

42. A catadioptric imaging system according to claim 30 wherein said primary mirror in the second imaging optical system comprising a material having a coefficient of linear expansion of not more than 3 ppm/°C.

43. A catadioptric imaging system according to claim 30, further comprising an optical element, disposed in the vicinity of a rear focal point of said first lens group, for relatively giving at least one of a difference in the intensity, a phase difference, and a difference in the polarized state to a beam passing through a first area in a beam section and a beam passing through a second area different from said first area in the beam section.

44. A catadioptric imaging system according to claim 30 wherein all of the refracting optical members, said primary mirror, and said secondary mirror within said catadioptric imaging system are arranged along single linear optical axis.

45. A catadioptric imaging system according to claim 30, wherein the number of all of the lens component within said catadioptric imaging system is not more than ten.

46. A catadioptric imaging system according to claim 30, wherein a magnification of said catadioptric imaging system is in a range of 0.12 to 0.33.

47. A projection exposure apparatus for transferring a pattern on a mask onto workpiece, comprising:

an illumination system; and a catadioptric imaging system of claim 30, arranged in an optical path between said mask and said workpiece, for projecting an image of said pattern of said mask disposed on said first plane onto said workpiece, based on an ultraviolet radiation from said illumination system.

48. A exposure method comprising the steps of:
preparing a mask;
preparing a workpiece;
illuminating said mask using ultraviolet radiation; and
transferring a pattern on said mask onto said workpiece with the catadioptric imaging system of claim 30.

49. A method of manufacturing a micro-electro device, comprising the steps of:
preparing a workpiece;
covering the workpiece with a photosensitive material;
transferring a pattern onto the workpiece with the photosensitive material using the method of claim 48; and
developing said photosensitive material.

50. An optical apparatus provided with an imaging optical system for optically conjugating a first plane and a second plane to each other, comprising:
a substrate position detecting system, optically connected to said second plane, for detecting the position of a workpiece with respect to said second plane; wherein
said imaging optical system comprises a primary mirror including a first reflecting surface with concave form having a first radiation transmitting portion at the center thereof, and a secondary mirror including a second reflecting surface disposed between said primary mirror and said second plane having a second radiation transmitting portion at the center thereof, and a base member provided with said second reflecting surface on a surface thereof; and
said substrate position detecting system comprises a light guiding system, optically connected to said base member, for guiding a detection beam, to detection area which is projected area of said second radiation transmitting portion on said second plane, and a light receiving system, optically connected to said base member, for guiding a reflected beam from said detection area, to a photoelectric conversion unit;
said detection beam toward said detection area passes through said base member;
said reflected beam from said detection area passes through said base member; and
a radiation from said first plane does not pass through said base member.

51. A projection exposure apparatus for transferring a pattern on a mask onto workpiece, comprising:
an illumination system; and
the optical apparatus of claim 50, arranged in an optical path between said mask and said workpiece, for projecting an image of said pattern of said mask disposed on said first plane onto said workpiece, based on an ultraviolet radiation from said illumination system.

52. A exposure method comprising the steps of:
preparing a mask;
preparing a workpiece;
illuminating said mask using ultraviolet radiation;
detecting a position of the workpiece with the optical apparatus of claim 50; and
transferring a pattern on said mask onto said workpiece with the optical apparatus of claim 50.

53. An optical apparatus provided with an imaging optical system for optically conjugating a first plane and a second plane to each other, comprising:
a substrate position detecting system, optically connected to said second plane, for detecting the position of a workpiece with respect to said second plane; wherein
said imaging optical system comprises a primary mirror including a first reflecting surface with concave form having a first radiation transmitting portion at the center thereof, and a secondary mirror including a second reflecting surface disposed between said primary mirror and said second plane having a second radiation transmitting portion at the center thereof, and a base member provided with said second reflecting surface on a surface thereof; and
said substrate position detecting system comprises a light guiding system, optically connected to said base member, for guiding a detection beam, to detection area which is projected area of said second radiation transmitting portion on said second plane, and a light receiving system, optically connected to said base member, for guiding the reflected beam from said detection area, to a photoelectric conversion unit;
said detection beam toward said detection area passes through said base member, and is reflected by a first side surface of said base member and by a second side surface of said base member; and
said reflected beam from said detection area passes through said base member, and is reflected by said first side surface of said base member and by said second side surface of said base member.

54. An optical apparatus provided with an imaging optical system for optically conjugating a first plane and a second plane to each other, comprising:
a substrate position detecting system, optically connected to said second plane, for detecting the position of a workpiece with respect to said second plane; wherein
said imaging optical system comprises a primary mirror including a first reflecting surface with concave form having a first radiation transmitting portion at the center thereof, and a secondary mirror including a second reflecting surface disposed between said primary mirror and said second plane having a second radiation transmitting portion at the center thereof, and a base member provided with said second reflecting surface on a surface thereof; and
said substrate position detecting system comprises a light guiding system, optically connected to said base member, for guiding a detection beam, to detection area which is projected area of said second radiation transmitting portion on said second plane, and a light receiving system, optically connected to said base member, for guiding a reflected beam from said detection area, to a photoelectric conversion unit,
said detection beam toward said detection area enters at a first side surface of said base member, passes through said base member, and leaves a second side surface of said base member for said detection area, and
said reflected beam from said detection area enters at a third side surface of said base member, passes through said base member, and leaves a fourth side surface of said base member for said photoelectric conversion unit.

55. An optical apparatus provided with an imaging optical system for optically conjugating a first plane and a second plane to each other, comprising:
a substrate position detecting system, optically connected to said second plane, for detecting the position of a workpiece with respect to said second plane; wherein
said imaging optical system comprises a primary mirror including a first reflecting surface with concave form having a first radiation transmitting portion at the center thereof and a secondary mirror including a second reflecting surface disposed between said primary mirror and said second plane having a second radiation transmitting portion at the center thereof, and a base member provided with said second reflecting surface on a surface thereof; and said substrate position detecting system comprises a light guiding system, optically connected to said base member, for guiding a detection beam, to detection area which is projected area of said second radiation transmitting portion on said second plane, and a light receiving system, optically connected to said base member, for guiding a reflected beam from said detection area, to a photoelectric conversion unit;

said base member having a first side surface and a second side surface which are adjacent to said detection area;

said detection beam passes through said first side surface;

said reflected beam from said detection area passes through said second side surface; and said first and second side surfaces have planar surfaces, respectively.

* * * * *